(12) United States Patent
Shimizu et al.

(10) Patent No.: US 8,427,354 B2
(45) Date of Patent: Apr. 23, 2013

(54) ANALOG TO DIGITAL CONVERTER AND SIGNAL PROCESSING SYSTEM

(75) Inventors: Yasuhide Shimizu, Nagasaki (JP); Shinichiro Eto, Nagasaki (JP); Kohei Kudo, Nagasaki (JP)

(73) Assignee: Sony Corporation, Tokyo (JP)

( * ) Notice: Subject to any disclaimer, the term of this patent is extended or adjusted under 35 U.S.C. 154(b) by 40 days.
M

(21) Appl. No.: 13/200,643

(22) Filed: Sep. 28, 2011

(65) Prior Publication Data
US 2012/0092203 A1 Apr. 19, 2012

(30) Foreign Application Priority Data

Oct. 15, 2010 (JP) ................................. 2010-232877

(51) Int. Cl.
*H03M 1/38* (2006.01)
(52) U.S. Cl.
USPC .......................................... 341/161; 341/155
(58) Field of Classification Search .................. 341/161, 341/155, 156, 172, 122, 111, 169, 170
See application file for complete search history.

(56) References Cited

U.S. PATENT DOCUMENTS 8,339,302 B2 * 12/2012 Kabir ............................ 341/161
2007/0132629 A1 6/2007 Van Der Ploeg

FOREIGN PATENT DOCUMENTS

JP 2007-509564 4/2007

* cited by examiner

*Primary Examiner* — Joseph Lauture
(74) *Attorney, Agent, or Firm* — Rader, Fishman & Grauer PLLC

(57) ABSTRACT

Disclosed herein is an analog to digital converter including an analog to digital conversion stage of at least one stage adapted to produce digital data of a value corresponding to a relationship to two analog signals inputted thereto and output two analog residual signals. The analog to digital conversion stage includes a signal production section, a comparison section, a first outputting section, a second outputting section, and a changeover section. The comparison section outputs first digital data when a first comparison result that the voltage value of the first analog signal is lower than the voltage value of the second analog signal is obtained whereas the comparison section outputs second digital data when a second comparison result that the voltage value of the first analog signal is higher than the voltage value of the second analog signal is obtained.

15 Claims, 34 Drawing Sheets

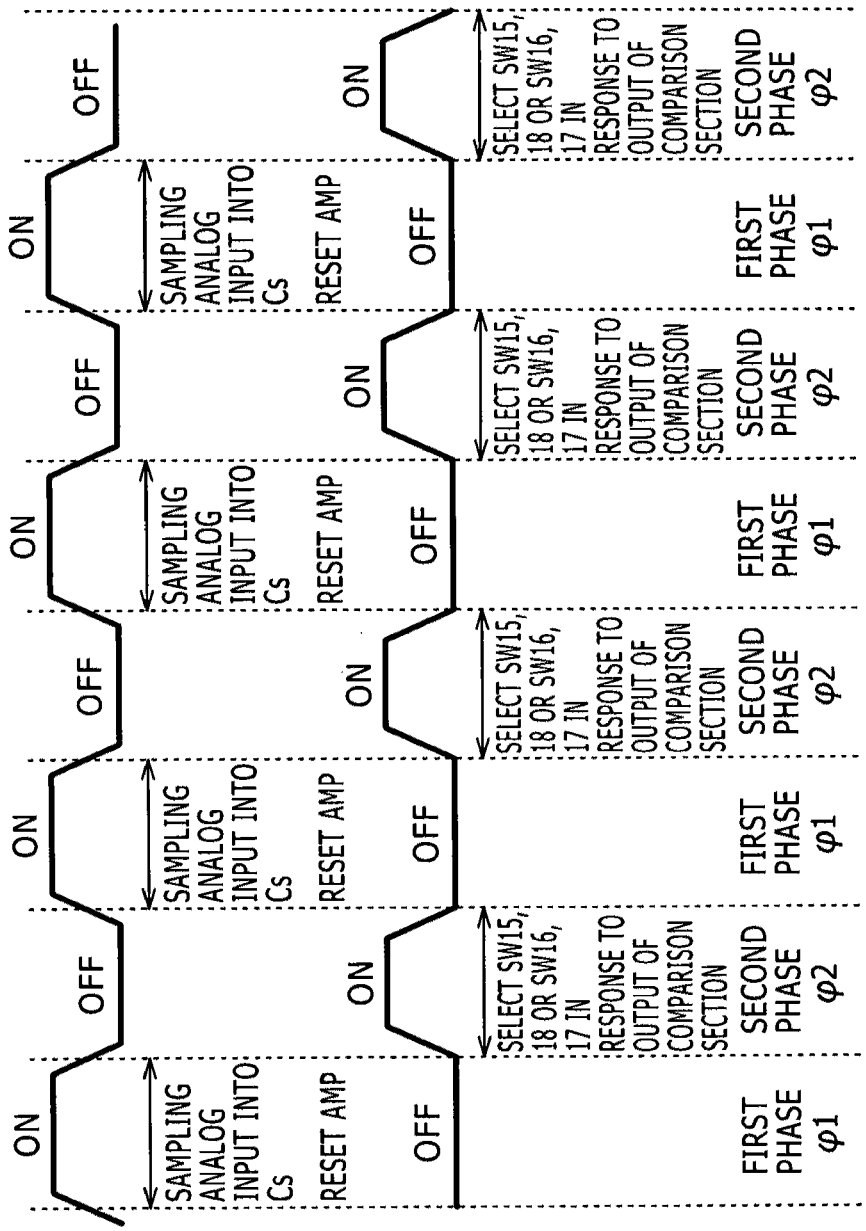

ANALOG TO DIGITAL CONVERTER AND SIGNAL PROCESSING SYSTEM

BACKGROUND

The present disclosure relates to an analog to digital (AD) converter and a signal processing system for converting an analog signal into a digital signal.

An AD converter of the pipeline type is used popularly as an AD converter having a sampling frequency around 100 MS/s and having a resolution of 8 to 14 bits.

This is because a pipeline type AD converter exhibits the following merits in comparison with a parallel type AD converter wherein processing of N bits is carried out at a time by two to n-th power comparators in one clock cycle.

In particular, an AD converter of the pipeline type has such merits that the number of comparators is small, that a comparator of high accuracy is not required and that processing of N bits may be carried out divisionally in several clock cycles. Therefore, a pipeline type AD converter is used widely in comparison with a parallel type AD converter.

Here, operation of a pipeline type AD converter is described taking a case in which a 10-bit AD converter is implemented using an MDAC which carries out 1-bit processing per one stage as an example. An input signal is represented by Vin, and a reference voltage is represented by Vr. It is assumed that the input signal and the reference voltage satisfy 0<Vin<Vr.

First, in a first clock cycle, the MDAC of the first stage samples the input signal Vin, and which one of Vin<Vr/2 and Vin>Vr/2 is satisfied is decided by a comparator.

In the case of Vin>Vr/2, subtraction is carried out by the MDAC of the first stage to produce a signal of Vin−Vr/2, and this signal is doubled by an amplifier to produce and output an analog residual signal 2Vin−Vr. Concurrently, a digital signal 1 (MSB) is outputted.

In a next clock cycle, the MDAC of the second stage samples the analog residual signal output 2Vin−Vr of the MDAC of the first stage, and the sampled value is compared with Vr/2 by another comparator. At this time, the MDAC of the first stage samples a next analog input signal and repeats the processing carried out within the first clock cycle.

If 2Vin−Vr>Vr/2 is obtained by the MDAC of the second stage, then a subtraction process of (2Vin−Vr)−Vr/2 is carried out, and then a resulting value is doubled by an amplifier to produce and output an analog residual signal 4Vin−3Vr. Concurrently, a digital signal 1 is outputted.

Similar operation is repeated by the MDACs connected in series to produce and output a digital signal of 10 bits in 10 clock cycles.

SUMMARY

However, according to the AD converter described above, it is demanded to carry out arithmetic operation of an analog input signal accurately, and to this end, a closed loop operational amplifier of high accuracy, that is, of a high gain, is used as described, for example, in JP-T-2007-509564.

Together with refinement of a semiconductor process, it has become difficult to implement an operational amplifier of high accuracy, which has been able to be implemented by a thick film process, by a submicron process because of deterioration of a device characteristic of a transistor such as increase of leak current or degradation of output resistance.

Further, as a problem unique to a closed loop amplifier, there is a problem that high speed operation, that is, high speed sampling operation, is difficult.

Therefore, it is desirable to provide an AD converter and a signal processing system which do not require an operational amplifier of high accuracy and can carry out low power operation and high speed operation and besides can be miniaturized readily.

According to an embodiment of the present disclosure, there is provided an analog to digital converter including an AD conversion stage of at least one stage adapted to produce digital data of a value corresponding to a relationship to two analog signals inputted thereto and output two analog residual signals. The AD conversion stage includes a signal production section adapted to receive, as input signals thereto, a first analog signal of a voltage value corresponding to a difference between a voltage value between a first reference voltage and a second reference voltage and the second reference voltage, and a second analog signal of a voltage value corresponding to a difference between a voltage value of the first analog signal and a difference voltage between the first reference voltage and the second reference voltage. Then the signal production section produces at least one third analog signal of an intermediate voltage value produced from the voltage value of the first analog signal and a voltage value of the second analog signal, and output the first analog signal, second analog signal and third analog signal. The AD conversion stage further includes a comparison section adapted to receive, as input signals thereto, the first analog signal and the second analog signal, compare the voltage value of the first analog signal and the voltage value of the second analog signal with each other, and output digital data of a value corresponding to a result of the comparison. The AD conversion stage further includes a first outputting section adapted to amplify a first residual signal with a predetermined amplification factor and output the amplified first residual signal, and a second outputting section adapted to amplify a second residual signal with the predetermined amplification factor and output the amplified second residual signal. The AD conversion stage further includes a changeover section adapted to change over inputting of the first analog signal, second analog signal and third analog signal outputted from the signal production section to the first outputting section and the second outputting section in response to the result of the comparison by the comparison section. The comparison section outputs first digital data when a first comparison result that the voltage value of the first analog signal is lower than the voltage value of the second analog signal is obtained whereas the comparison section outputs second digital data when a second comparison result that the voltage value of the first analog signal is higher than the voltage value of the second analog signal is obtained. The changeover section carries out the changeover such that, when the first comparison result is obtained by the comparison section, the first analog signal outputted from the signal production section is inputted as the first residual signal to the first outputting section and the third analog signal outputted from the signal production section is inputted as the second residual signal to the second outputting section, but when the second comparison result is obtained by the comparison section, the third analog signal outputted from the signal production section is inputted as the first residual signal to the first outputting section and the second analog signal outputted from the signal production section is inputted as the second residual signal to the second outputting section.

According to another embodiment of the present disclosure, there is provided a signal processing system including an AD converter adapted to convert an analog signal from an analog signal processing system. The analog to digital converter includes an AD conversion stage of at least one stage adapted to produce digital data of a value corresponding to a relationship to two analog signals inputted thereto and output two analog residual signals. The AD conversion stage includes a signal production section adapted to receive, as input signals thereto, a first analog signal of a voltage value corresponding to a difference between a voltage value between a first reference voltage and a second reference voltage and the second reference voltage, and a second analog signal of a voltage value corresponding to a difference between a voltage value of the first analog signal and a difference voltage between the first reference voltage and the second reference voltage. Then the signal production section produces at least one third analog signal of an intermediate voltage value produced from the voltage value of the first analog signal and a voltage value of the second analog signal, and output the first analog signal, second analog signal and third analog signal. The AD conversion stage further includes a comparison section adapted to receive, as input signals thereto, the first analog signal and the second analog signal, compare the voltage value of the first analog signal and the voltage value of the second analog signal with each other, and output digital data of a value corresponding to a result of the comparison. The AD conversion stage further includes a first outputting section adapted to amplify a first residual signal with a predetermined amplification factor and output the amplified first residual signal, and a second outputting section adapted to amplify a second residual signal with the predetermined amplification factor and output the amplified second residual signal. The AD conversion stage further includes a changeover section adapted to change over inputting of the first analog signal, second analog signal and third analog signal outputted from the signal production section to the first outputting section and the second outputting section in response to the result of the comparison by the comparison section. The comparison section outputs first digital data when a first comparison result that the voltage value of the first analog signal is lower than the voltage value of the second analog signal is obtained whereas the comparison section outputs second digital data when a second comparison result that the voltage value of the first analog signal is higher than the voltage value of the second analog signal is obtained. The changeover section carries out the changeover such that, when the first comparison result is obtained by the comparison section, the first analog signal outputted from the signal production section is inputted as the first residual signal to the first outputting section and the third analog signal outputted from the signal production section is inputted as the second residual signal to the second outputting section, but when the second comparison result is obtained by the comparison section, the third analog signal outputted from the signal production section is inputted as the first residual signal to the first outputting section and the second analog signal outputted from the signal production section is inputted as the second residual signal to the second outputting section.

With the AD converter and the signal processing system, low power operation and high speed operation can be achieved and besides miniaturization can be achieved readily without the necessity for an operational amplifier of high accuracy.

The above and other features and advantages of the present disclosure will become apparent from the following description and the appended claims, taken in conjunction with the accompanying drawings in which like parts or elements are denoted by like reference characters.

BRIEF DESCRIPTION OF THE DRAWINGS

FIGS. 6A and 6B are waveform diagrams illustrating a basic concept of operation of the 1-bit AD converter of FIG. 1 and particularly illustrating general operation in different phases;

DETAILED DESCRIPTION OF THE PREFERRED EMBODIMENTS

In the following, preferred embodiments of the present disclosure are described with reference to the accompanying drawings.

It is to be noted that the description is given in the following order:

1. First Embodiment (first configuration example of AD converter)
2. Second Embodiment (second configuration example of AD converter)
3. Third Embodiment (third configuration example of AD converter)
4. Fourth Embodiment (fourth configuration example of AD converter)
5. Fifth Embodiment (fifth configuration example of AD converter)
6. Sixth Embodiment (sixth configuration example of AD converter)
7. Seventh Embodiment (seventh configuration example of AD converter)
8. Eighth Embodiment (eighth configuration example of AD converter)
9. Ninth Embodiment (ninth configuration example of AD converter)
10. Tenth Embodiment (tenth configuration example of AD converter)
11. Eleventh Embodiment (eleventh configuration example of AD converter)
12. Twelfth Embodiment (twelfth configuration example of AD converter)
13. Thirteenth Embodiment (thirteenth configuration example of AD converter)
14. Fourteenth Embodiment (fourteenth configuration example of AD converter)
15. Fifteenth Embodiment (fifteenth configuration example of AD converter)
16. Sixteenth Embodiment (sixteenth configuration example of AD converter)
17. Seventeenth Embodiment (seventeenth configuration example of AD converter)
18. Eighteenth Embodiment (eighteenth configuration example of AD converter)
19. Nineteenth Embodiment (nineteenth configuration example of AD converter)
20. Twentieth Embodiment (twentieth configuration example of AD converter)
21. Twenty-First Embodiment (configuration example of signal processing system)

<1. First Embodiment>

Figure 1:
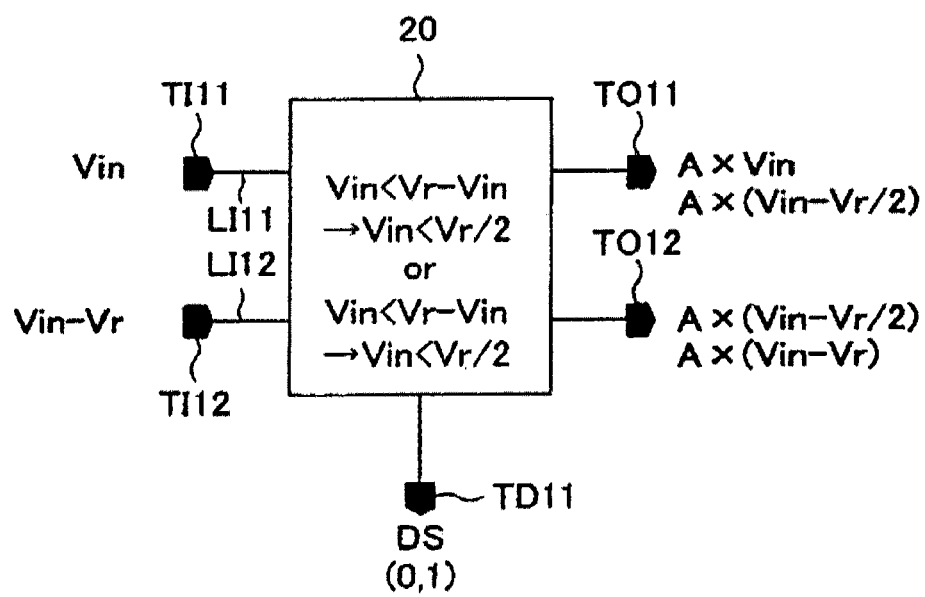
FIG. 1 is a block diagram showing an example of a configuration of a 1-bit AD converter according to a first embodiment of the present disclosure.

FIG. 1 shows an example of a configuration of a 1-bit AD converter 10 according to a first embodiment of the present disclosure.

Referring to FIG. 1, a 1-bit AD converter 10 shown includes an AD conversion stage 20, a first analog signal input terminal TI11, a second analog signal input terminal TI12, and a digital data output terminal TD11.

The 1-bit AD converter 10 further includes a first analog signal output terminal TO11, and a second analog signal output terminal TO12.

The input range in voltage of the 1-bit AD converter 10 of the present embodiment is 0 to Vr. In the present embodiment, a first reference voltage Vrt corresponds to the voltage Vr, and a second reference voltage Vrb corresponds to the voltage of 0 V.

To the 1-bit AD converter 10, a first analog signal and a second analog signal are inputted.

The first analog signal is inputted as a signal of a voltage value Vin−Vrb corresponding to the difference between a voltage value Vin which is a difference value between two voltages, that is, between the first reference voltage Vrt and the second reference voltage Vrb, and the second reference voltage Vrb. In the present embodiment, since Vrb=0 as described above, the first analog signal is Vin.

The second analog signal is inputted as a signal of a voltage value Vin−Vrb−(Vrt−Vrb)=Vin−Vrt corresponding to the difference between the voltage value Vin−Vrb of the first analog signal and the voltage difference Vrt−Vrb between the first reference voltage Vrt and the second reference voltage Vrb.

In this manner, in the present embodiment, the input analog signal Vin assumes a voltage value between 0 (Vrb) and Vr (Vrt), that is, 0<Vin<Vr and is inputted as the first analog signal or voltage Vin to the first analog signal input terminal TI11.

The first analog signal input terminal TI11 inputs the first analog signal Vin to the AD conversion stage 20 through a signal input line LI11.

The second analog signal input terminal TI12 inputs a second analog signal of the voltage value Vin−Vr corresponding to the difference between the voltage value Vin of the first analog signal Vin and the voltage Vr between the reference voltages to the AD conversion stage 20 through a signal input line LI12.

The AD conversion stage 20 receives the first analog signal Vin of the voltage value Vin as an input signal thereto from the first analog signal input terminal TI11.

Concurrently, the AD conversion stage 20 receives the second analog signal Vin−Vr of the difference value Vin−Vr of the voltage Vr between the reference voltages from the input voltage Vin as an input signal thereto from the second analog signal input terminal TI12.

The AD conversion stage 20 includes a signal production section for producing a third analog signal Vin−Vr/2 which is a residual signal from the two analog signals, that is, from the first and second analog signals. In particular, the AD conversion stage 20 produces a third analog signal Vin−Vr/2 by adding the voltage value Vin of the first analog signal and the voltage value Vin−Vr of the second analog signal and then dividing the sum value by 2.

The AD conversion stage 20 has a built-in comparison section which carries out comparison in magnitude between the voltage Vin and the voltage Vin−Vr of the two first and second analog signals.

The AD conversion stage 20 outputs a first residual signal A×Vin or A×(Vin−Vr/2) amplified to A times from the first analog signal output terminal TO11 in response to a result of the comparison by the comparison section.

Similarly, the AD conversion stage 20 outputs a second residual signal A×(Vin−Vr/2) or A×(Vin−Vr) amplified to A times from the second analog signal output terminal TO12 in response to the result of the comparison by the comparison section. It is to be noted that A is a constant representative of an amplification factor.

Concurrently, the AD conversion stage 20 outputs digital data DS having a digital value (data) of 0 or 1 from the digital data output terminal TD11 in response the result of the comparison by the comparison section.

In the present embodiment, the digital value or data 0 corresponds to the first digital data, and the digital value or data 1 corresponds to the second digital data.

Figure 2A:
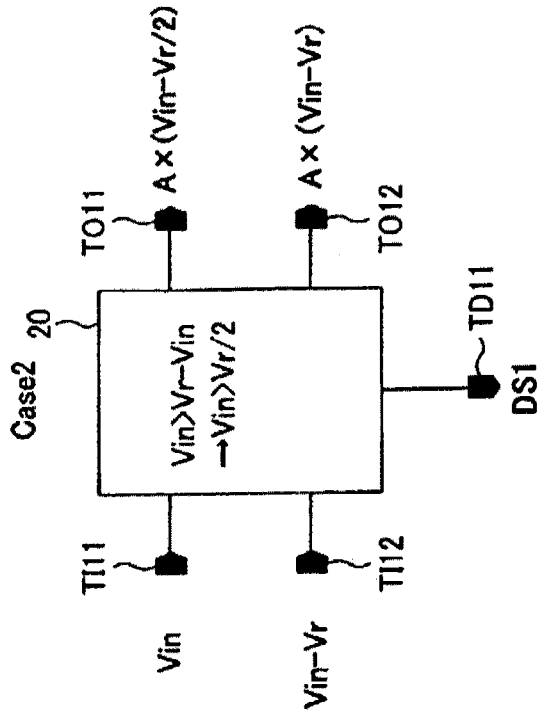
FIGS. 2A and 2B are block diagrams illustrating a residual signal and a digital signal outputted in response to a result of comparison by a comparison section of an AD conversion stage shown in FIG. 1 in different cases.
Figure 2B:
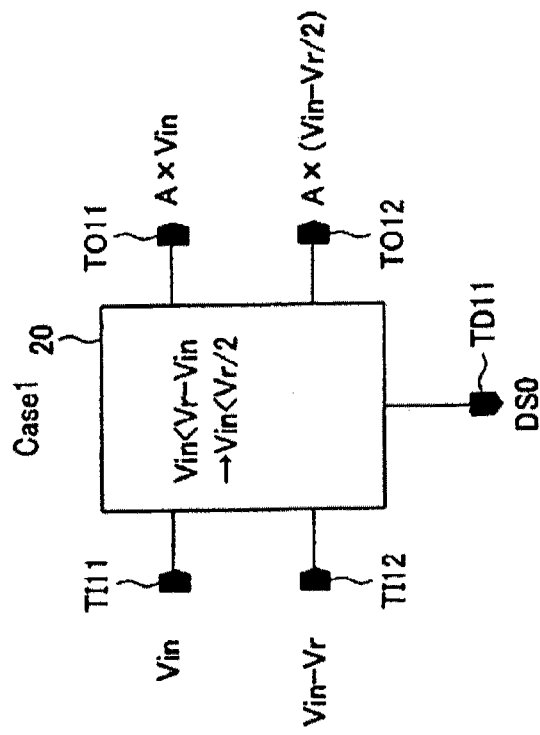

FIGS. 2A and 2B illustrate a residual signal and a digital signal outputted in response to a result of comparison by the comparison section of the AD conversion stage shown in FIG. 1 in different cases.

Referring to FIGS. 2A and 2B, the comparison section of the AD conversion stage 20 carries out a decision of whether the signal voltage 2Vin−Vr of the sum of the first analog signal Vin and the second analog signal voltage Vin−Vr is higher or lower than 0.

If a first comparison result that the signal voltage 2Vin−Vr is lower than 0, that is, 2Vin−Vr<0, or in other words, a first comparison result of Vin<Vr/2, is obtained, then the AD conversion stage 20 carries out the following process.

This is equivalent to a case in which, when two analog input voltages |Vin| and |Vin−Vr| are compared with each other, the first analog signal voltage |Vin| is lower than the second analog signal voltage |Vin−Vr|, that is, |Vin|<|Vin−Vr|.

When the first comparison result Vin<Vr/2 is obtained, the AD conversion stage 20 outputs A×Vin as a first residual signal from the first analog signal output terminal TO11 as seen in FIG. 2A.

The AD conversion stage 20 outputs A×(Vin−Vr/2) as a second residual signal from the second analog signal output terminal TO12.

Concurrently, the AD conversion stage 20 outputs digital data DS of the digital value (data) of 0 from the digital data output terminal TD11.

On the other hand, if a second comparison result that the signal voltage 2Vin−Vr is higher than 0, that is, 2Vin−Vr>0, or in other words, a second comparison result of Vin>Vr/2, is obtained, then the AD conversion stage 20 carries out the following process.

It is to be noted that this is equivalent to a case in which, when two analog input voltages |Vin| and |Vin−Vr| are compared with each other, the first analog signal voltage |Vin| is higher than the second analog signal voltage |Vin−Vr|, that is, |Vin|>|Vin−Vr|.

When the second comparison result Vin>Vr/2 is obtained, the AD conversion stage 20 outputs A×(Vin−Vr/2) as a first residual signal from the first analog signal output terminal TO11 as seen in FIG. 2B.

The AD conversion stage 20 outputs A×(Vin−Vr/2) as the second residual signal from the second analog signal output terminal TO12.

Concurrently, the AD conversion stage 20 outputs digital data DS of a digital value (data) of 1 from the digital data output terminal TD11.

In this manner, the AD conversion stage 20 of the 1-bit AD converter 10 according to the first embodiment outputs the first digital data 0 when the first comparison result Vin<Vr/2 is obtained, but outputs the second digital data 1 when the second comparison result Vin>Vr/2 is obtained.

The AD conversion stage 20 amplifies the analog residual signals Vin and Vin−Vr/2 or Vin−Vr/2 and Vin−Vr to A times in response to a result of the comparison and outputs the amplified analog residual signals.

[Particular Configuration Example of the 1-Bit AD Converter]

Figure 3:
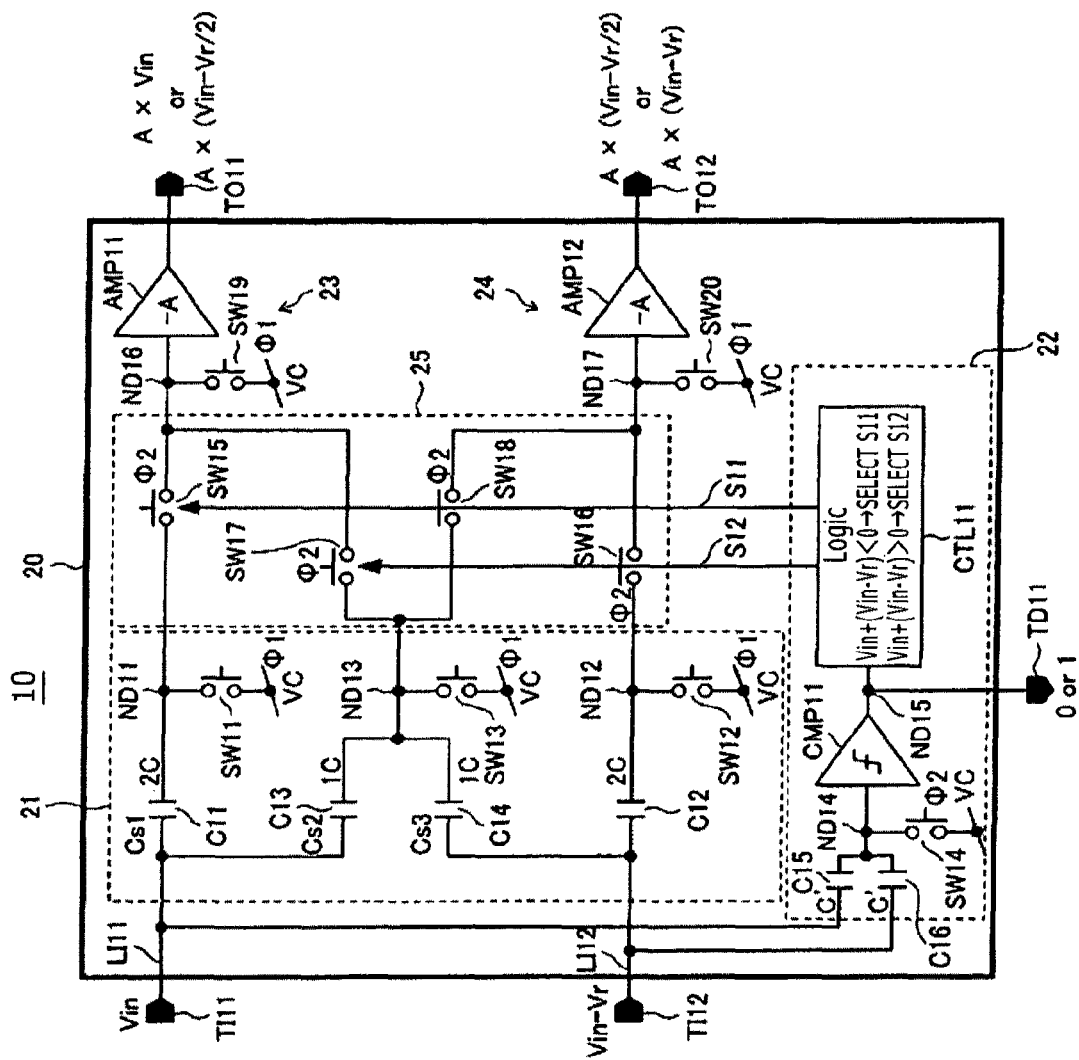
FIG. 3 is a circuit diagram showing an example of a particular configuration of the 1-bit AD conversion of FIG. 1.

FIG. 3 shows a particular configuration example of the 1-bit AD converter according to the first embodiment.

Referring to FIG. 3, the AD conversion stage 20 of the 1-bit AD converter 10 shown includes a signal production section 21, a comparison section 22, a first outputting section 23, a second outputting section 24 and a changeover section 25.

The signal processing section 21 receives a first analog signal Vin and a second analog signal Vin−Vr as inputs thereto through signal input lines LI11 and LI12, respectively.

The signal production section 21 adds the signal value Vin of the first analog signal and the voltage value Vin−Vr of the second analog signal and divides the sum by 2 to produce a third analog signal Vin−Vr/2.

The signal production section 21 samples the first analog signal Vin, second analog signal Vin−Vr and third analog signal Vin−Vr/2 and outputs the samples to the changeover section 25.

The signal production section 21 shown in FIG. 3 produces a third analog signal Vin−Vr/2 by capacitive interpolation.

The signal production section 21 shown in FIG. 3 includes a first capacitor C11, a second capacitor C12, a third capacitor C13, and a fourth capacitor C14.

The signal production section 21 further includes a first switch SW11, a second switch SW12, a third switch SW13, a first output node ND11, a second output node ND12, and a third output node ND13.

It is to be noted that, in the present embodiment, the capacitance value of the first capacitor C11 and the second capacitor C12 is set to 2C, and the capacitance value of the third capacitor C13 and the fourth capacitor C14 is set to 1C.

In other words, the capacitance value of the first capacitor C11 and the second capacitor C12 and the capacitance value of the third capacitor C13 and the fourth capacitor C14 are set such that they exhibit a ratio of 2:1.

The first capacitor C11 is connected at one terminal thereof to the input line LI11 of the first analog signal Vin and at the other terminal thereof to the first output node ND11 for outputting the first analog signal Vin.

The second capacitor C12 is connected at one terminal thereof to the signal input line LI12 of the second analog signal Vin−Vr and at the other terminal thereof to the second output node ND12 for outputting the second analog signal Vin−Vr.

The third capacitor C13 is connected at one terminal thereof to the input line LI11 of the first analog signal Vin and at the other terminal thereof to the third output node ND13 for outputting the third analog signal Vin−Vr/2.

The fourth capacitor C14 is connected at one terminal thereof to the input line LI12 of the second analog signal Vin−Vr and at the other terminal thereof to the third output node ND13 for outputting the third analog signal Vin−Vr/2.

The first switch SW11 is connected between the first output node ND11 and a fixed potential VC. Here, the fixed potential VC is, for example, a ground potential GND.

The second switch SW12 is connected between the second output node ND12 and the fixed potential VC.

The third switch SW13 is connected between the third output node ND13 and the fixed potential VC.

The first switch SW11, second switch SW12 and third switch SW13 are kept in a conducting state or short-circuiting state within a period within which a first phase signal Φ1 exhibits the high level, but is kept in a non-conducting state or open state within a period within which the first phase signal Φ1 exhibits the low level.

The first capacitor C11 samples the first analog signal Vin as an input signal when the first switch SW11 is in a conducting state, but generates, when the first switch SW11 is in a non-conducting state, the sampled voltage Vin on the first output node ND11 side and outputs a voltage signal of the voltage.

The second capacitor C12 samples the second analog signal Vin−Vr as an input signal when the second switch SW12 is in a conducting state, but generates, when the second switch SW12 is in a non-conducting state, the sampled voltage on the second output node ND12 side and outputs a voltage signal of the voltage.

The third capacitor C13 samples the first analog signal Vin as an input signal when the third switch SW13 is in a conducting state, but generates, when the third switch SW13 is in a non-conducting state, the sampled voltage Vin on the third output node ND13 side.

The fourth capacitor C14 samples the second analog signal Vin−Vr as an input signal when the third switch SW13 is in a conducting state, but generates, when the third switch SW13 is in a non-conducting state, the sampled voltage on the third output node ND13 side.

In this manner, the third capacitor C13 and the fourth capacitor C14 sample the input signals when the third switch SW13 is in a conducting state, and generate the sample voltages on the third output node ND13 side when the third switch SW13 is in a non-conducting state. Then, the voltages are synthesized and outputted from the third output node ND13.

The comparison section 22 receives the first analog signal Vin and the second analog signal Vin−Vr as inputs thereto through the signal input lines LI11 and LI12, respectively.

The comparison section 22 adds the voltage value Vin of the first analog signal and the voltage value Vin−Vr of the second analog signal and compares the sum signal 2Vin−Vr with 0 to determine whether the sum signal is higher or lower than 0.

Substantially, the comparison section 22 compares the voltage value Vin−Vr/2 obtained by subtracting a middle voltage value Vr/2 of the second analog signal from the voltage value Vin of the first analog signal with 0 V which is a reference voltage value.

The comparison section 22 outputs digital data DS of a value corresponding to a result of the comparison from the digital data output terminal TD11.

The comparison section 22 carries out supplying path and signal changeover control of the first analog signal Vin, second analog signal Vin−Vr and third analog signal Vin−Vr/2 outputted from the signal production section 21 of the changeover section 25 to the outputting sections in response a result of the comparison.

More particularly, the comparison section 22 carries out supplying path and signal changeover control of the first analog signal Vin, second analog signal Vin−Vr and third analog signal Vin−Vr/2 to the first outputting section 23 and the second outputting section 24 in response a result of the comparison.

If the first comparison result that the sum value 2Vin−Vr of the voltage value Vin of the first analog signal and the voltage value Vin−Vr of the second analog signal is lower than 0 is obtained, then the comparison section 22 outputs digital data DS of the value (data) 0 from the digital data output terminal TD11.

On the other hand, if the second comparison result that the voltage value 2Vin−Vr is higher than 0 is obtained, then the comparison section 22 outputs digital data DS of the value (data) 1 from the digital data output terminal TD11.

When the first comparison result is obtained, the comparison section 22 carries out changeover control of the changeover section 25 in the following manner.

In this instance, the comparison section 22 controls the changeover section 25 such that the first analog signal Vin outputted from the signal production section 21 is inputted as the first residual signal to the first outputting section 23 and the third analog signal Vin−Vr/2 is inputted as the second residual signal to the second outputting section 24.

When the second comparison result is obtained, the comparison section 22 carries out changeover control of the changeover section 25 in the following manner.

In this instance, the comparison section 22 controls the changeover section 25 such that the third analog signal Vin−Vr/2 outputted from the signal production section 21 is inputted as the first residual signal to the first outputting section 23 and the second analog signal Vin−Vr is inputted as the second residual signal to the second outputting section 24.

The comparison section 22 shown in FIG. 3 includes a comparator CMP11, a control section CTL11, a fifth capacitor C15, a sixth capacitor C16, a fourth switch SW14, and an input node ND14 and an output node ND15 of the comparator CMP11.

It is to be noted that, in the present embodiment, the capacitance value of the fifth capacitor C15 and the sixth capacitor C16 is set to 1C'.

The fifth capacitor C15 is connected at one terminal thereof to the input line LI11 of the first analog signal Vin and at the other terminal thereof to the input node ND14 of the comparator CMP11.

The sixth capacitor C16 is connected at one terminal thereof to the input line LI12 of the second analog signal Vin−Vr and at the other terminal thereof to the input node ND14 of the comparator CMP11.

The fourth switch SW14 is connected between the input node ND14 of the comparator CMP11 and the fixed potential VC.

The fourth switch SW14 is kept in a conducting state or short-circuiting state within a period within which a second phase signal Φ2 having an opposite phase to that of the first phase signal Φ1 exhibits the high level, but is kept in a non-conducting state or open state within a period within which the second phase signal Φ2 exhibits the low level.

Here, the opposite phase signifies such a relationship that the phase is displaced by 180° such that, when the first phase signal Φ1 exhibits the high level, the second phase signal Φ2 exhibits the low level, and when the first phase signal Φ1 exhibits the low level, the second phase signal Φ2 exhibits the high level.

The fifth capacitor C15 samples the first analog signal Vin which is an input signal when the fourth switch SW14 is in a conducting state, and generates the sampled voltage Vin on the input node ND14 side of the comparator CMP11 at a predetermined timing.

The sixth capacitor C16 samples the second analog signal Vin−Vr which is an input signal when the fourth switch SW14 is in a conducting state, and generates the sampled voltage on the input node ND14 side of the comparator CMP11 at a predetermined timing.

In this manner, the fifth capacitor C15 and the sixth capacitor C16 sample input signals thereto when the fourth switch SW14 is in a conducting state, and generate the sampled voltages on the input node ND14 side of the comparator CMP11 at a predetermined timing. Then, the voltages are synthesized and supplied to the comparator CMP11.

The comparator CMP11 compares the synthesized signal voltage Vin+Vin−Vr inputted thereto with 0.

If the first comparison result of Vin+Vin−Vr<0 is obtained, then the comparator CMP11 outputs the first digital data 0 to the digital data output terminal TD11 and the control section CTL11 through the output node ND15.

On the other hand, if the second comparison result of Vin+Vin−Vr>0 is obtained, then the comparator CMP11 outputs the second digital data 1 to the digital data output terminal TD11 and the control section CTL11 through the output node ND15.

In the present first embodiment, the comparator CMP11 carries out a comparison operation at a timing at which the first phase signal Φ1 is changed over from the high level to the low level.

If the control section CTL11 receives the first digital data 0 from the comparator CMP11, then it decides that the first comparison result Vin+Vin−Vr<0 is obtained as a result of the comparison and controls the changeover section 25 in the following manner with a first control signal S11 and a second control signal S12.

The control section CTL11 controls the changeover section 25 such that the first analog signal Vin outputted from the signal production section 21 is inputted to the first outputting section 23 and the third analog signal Vin−Vr/2 is inputted to the second outputting section 24.

In the present first embodiment, the control section CTL11 determines which one of the first control signal S11 and the second control signal S12 should be outputted with the active high level when the second phase signal Φ2 changes from the low level to the high level. The control section CTL11 outputs the first control signal S11 and the second control signal S12 to the changeover section 25 such that they complementarily assume the high level and the low level within a period within which the second phase signal Φ2 exhibits the high level.

If the second digital data 1 is received from the comparator CMP11, then the control section CTL11 decides that the second comparison result Vin+Vin−Vr>0 is obtained as a result of the comparison and controls the changeover section 25 in the following manner with the first control signal S11 and the second control signal S12.

The control section CTL11 controls the changeover section 25 such that the third analog signal Vin−Vr/2 outputted from the signal production section 21 is inputted to the first outputting section 23 and the second analog signal Vin−Vr is inputted to the second outputting section 24.

The control section CTL11 determines which one of the first control signal S11 and the second control signal S12 should be outputted with the active high level when the second phase signal Φ2 changes from the low level to the high level.

The first outputting section 23 amplifies the first residual signal Vin or Vin−Vr/2 supplied thereto through the changeover section 25 with a predetermined amplification factor and outputs the amplified residual signal from the first analog signal output terminal TO11.

The first outputting section 23 shown in FIG. 3 includes a first amplifier AMP11, a first input node ND16 and a ninth switch SW19.

The first amplifier AMP11 amplifies the first residual signal Vin or Vin−Vr/2 supplied to the first input node ND16 through the changeover section 25 with a predetermined amplification factor A and outputs the amplified first residual signal from the first analog signal output terminal TO11.

The ninth switch SW19 is connected between the first input node ND16 and the fixed potential VC.

The ninth switch SW19 is kept in a conducting state or short-circuiting state within a period within which the first phase signal Φ1 has the high level but is kept in a non-conducting state or open state within a period within which the first phase signal Φ1 has the low level.

When the ninth switch SW19 is in a conducting state, the first input node ND16 is in a disconnected state from the first output node ND11 and the third output node ND13 of the signal production section 21, and the first amplifier AMP11 is placed in a reset state in which no input signal is inputted thereto.

The second outputting section 24 amplifies the second residual signal Vin−Vr/2 or Vin−Vr supplied thereto through the changeover section 25 with a predetermined amplification factor and outputs the amplified second residual signal from the second analog signal output terminal TO12.

The second outputting section 24 shown in FIG. 3 includes a second amplifier AMP12, a second input node ND17 and a tenth switch SW20.

The second amplifier AMP12 amplifies the second residual signal Vin−Vr/2 or Vin−Vr supplied to the second input node ND17 through the changeover section 25 with the amplification factor A and outputs the amplified second residual signal from the second analog signal output terminal TO12.

The tenth switch SW20 is connected between the second input node ND17 and the fixed potential VC.

The tenth switch SW20 is kept in a conducting state or short-circuiting state within a period within which the first phase signal Φ1 exhibits the high level, but is kept in a non-conducting state or open state within a period within which the first phase signal Φ1 exhibits the low level.

When the tenth switch SW20 is in a conducting state, the second input node ND17 is in a disconnected state from the second output node ND12 and the third output node ND13 of the signal production section 21, and the second amplifier AMP12 is in a reset state in which no input signal is inputted to the second amplifier AMP12.

Figure 4:
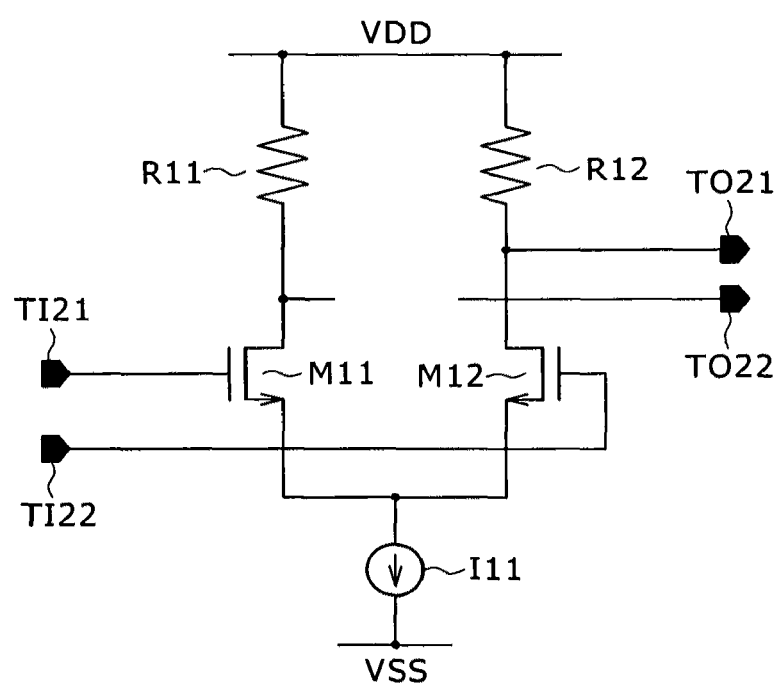
FIG. 4 is a circuit diagram showing an example of a configuration of an amplifier of first and second outputting sections applied to the 1-bit AD converter of FIG. 1.

FIG. 4 shows an example of a configuration of an amplifier of the first and second outputting sections applied to the 1-bit AD converter 10 described hereinabove.

Referring to FIG. 4, the first amplifier AMP11 or 12 has a circuit configuration ready for differential operation.

The first amplifier AMP11 or 12 of FIG. 4 includes n-channel field effect transistors (NMOS transistors) M11 and M12 which form a differential pair, a current source I11, load resistors R11 and R12, input terminals TI21 and TI22 and output terminals TO21 and TO22.

In this manner, the amplifier AMP can be configured as a simple differential amplifier from such a reason that the gain need not be controlled strictly.

The changeover section 25 changes over inputting of the first analog signal Vin, second analog signal Vin−Vr and third analog signal Vin−Vr/2 to the first outputting section 23 and the second outputting section 24 by the signal production section 21 in response to a result of comparison by the comparison section 22.

The changeover section 25 receives the control signals S11 and S12 of the comparison section 22 and carries out such changeover as described below.

If the first comparison result is obtained by the comparison section 22, then the changeover section 25 inputs the first analog signal Vin by the signal production section 21 as the first residual signal to the first outputting section 23. Further, the changeover section 25 inputs the third analog signal Vin−Vr/2 as the second residual signal to the second outputting section 24.

On the other hand, if the second comparison result is obtained by the comparison section 22, then the changeover section 25 inputs the third analog signal Vin−Vr/2 by the signal production section 21 as the first residual signal to the first outputting section 23. Further, the changeover section 25 inputs the second analog signal Vin−Vr as the second residual signal to the second outputting section 24.

The changeover section 25 shown in FIG. 3 includes a fifth switch SW15, a sixth switch SW16, a seventh switch SW17, and an eighth switch SW18.

The fifth switch SW15 is connected between the first output node ND11 of the signal production section 21 and the first input node ND16 for inputting the first residual signal to the first outputting section 23.

The sixth switch SW16 is connected between the second output node ND12 of the signal production section 21 and the second input node ND17 for inputting the second residual signal to the second outputting section 24.

The seventh switch SW17 is connected between the third output node ND13 of the signal production section 21 and the first input node ND16 for inputting the first residual signal to the first outputting section 23.

The eighth switch SW18 is connected between the third output node ND13 of the signal production section 21 and the second input node ND17 for inputting the second residual signal to the second outputting section 24.

The fifth switch SW15 and the eighth switch SW18 are changed over between a conducting state and a non-conducting state in response to the first control signal S11 outputted from the comparison section 22.

The sixth switch SW16 and the seventh switch SW17 are changed over between a conducting state and a non-conducting state in response to the second control signal S12 outputted from the comparison section 22.

If the first comparison result is obtained by the comparison section 22, then the fifth switch SW15 and the eighth switch SW18 are kept in a conducting state by the first control signal S11, and the sixth switch SW16 and the seventh switch SW17 are kept in a non-conducting state by the second control signal S12.

On the contrary, if the second comparison result is obtained by the comparison section 22, then the fifth switch SW15 and the eighth switch SW18 are kept in a non-conducting state by the first control signal S11, and the sixth switch SW16 and the seventh switch SW17 are kept in a conducting state by the second control signal S12.

It is to be noted that the control signals S11 and S12 by the comparison section 22 are supplied as signals in phase with the second phase signal $\Phi 2$.

Accordingly, two switches of the changeover section 25 are kept in a conducting state within a period within which the fourth switch SW14 in the comparison section 22 is placed in a conducting state to sample the first analog signal Vin and the second analog signal Vin−Vr, and the sampled signals are compared with each other.

In this instance, the signal production section 21 is kept in an outputting state of the sampled voltages in which the first switch SW11, second switch SW12 and third switch SW13 are kept in a non-conducting state.

Then, the ninth switch SW19 of the first outputting section 23 and the tenth switch SW20 of the second outputting section 24 are kept in a non-conducting state by the first phase signal $\Phi 1$, and consequently, signal inputting to the first amplifier AMP11 and the second amplifier AMP12 is enabled.

Figure 5A:
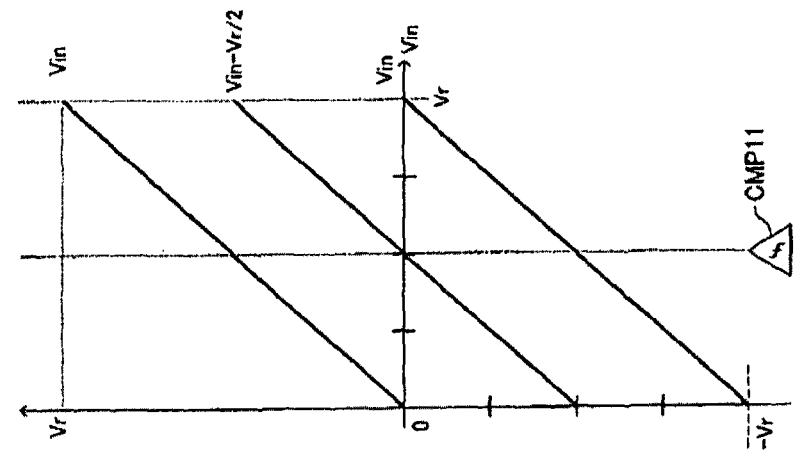
FIGS. 5A and 5B are diagrams illustrating a basic concept of operation of the 1-bit AD converter of FIG. 1.
Figure 5B:
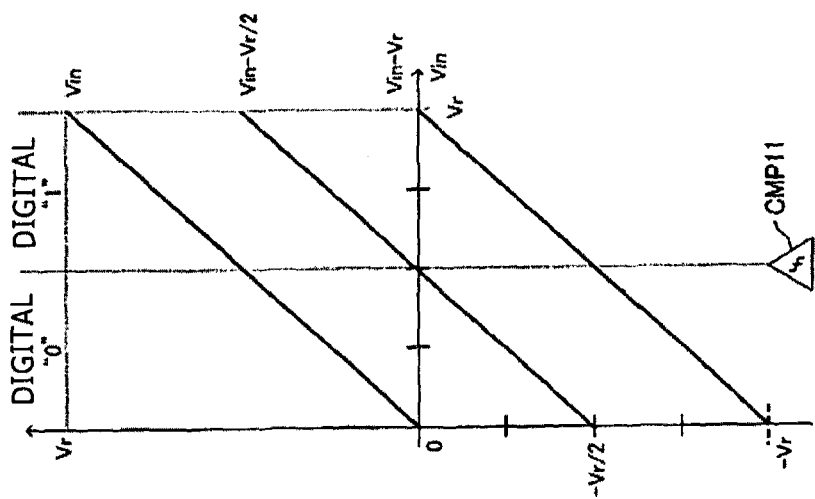

FIGS. 5A and 5B illustrate a basic concept of operation of the 1-bit AD converter 10 described hereinabove.

In the 1-bit AD converter 10, the comparison section 22 compares the magnitudes |Vin| and |Vin−V| of the first analog signal Vin and the second analog signal Vin−Vr, which are two input analog signals, with each other and outputs digital data 0 or 1 in response to a result of the comparison as seen in FIG. 5A.

As a method therefor, in the present embodiment, the first analog signal Vin and the second analog signal Vin−Vr are added to obtain a signal Vin+(Vin−Vr)=2Vin−Vr.

Then, the comparator CMP11 compares the signal 2Vin−Vr with 0 to decide whether the signal 2Vin−Vr is higher or greater than 0 or lower or smaller than 0 and outputs one of the digital data 0 and 1.

Further, in the present 1-bit AD converter 10, the comparison result of the comparison section 22 is applied also to the two analog signal outputs.

In particular, in the case where the first comparison result of outputting the first digital data 0 is obtained by the 1-bit AD converter 10, the first analog signal Vin and the third analog signal Vin−Vr/2 are selected and outputted as analog signal outputs in accordance with the region as seen in FIG. 5B.

On the other hand, in the case where the second comparison result of outputting the second digital data 1 is obtained by the 1-bit AD converter 10, the third analog signal Vin−Vr/2 and the second analog signal Vin−Vr are selected and outputted as analog signal outputs in accordance with the region as seen in FIG. 5B.

Now, operation of the 1-bit AD converter 10 according to the first embodiment is described with reference to FIGS. 6A to 9.

Basically, a first phase operation in which the first phase signal $\Phi 1$ is active and the second phase signal $\Phi 2$ is inactive and a second phase operation in which the second phase signal $\Phi 2$ is active and the first phase signal $\Phi 1$ is inactive are carried out.

It is to be noted here that the first phase signal $\Phi 1$ or the second phase signal $\Phi 2$ is active when it is set, for example, to the high level, but is inactive when it is set, for example, to the low level.

FIGS. 6A and 6B illustrate operation of the 1-bit AD converter according to the first embodiment in the various phases.

In particular, FIG. 6A illustrates states of the first to third switches SW11 to SW13 of the signal production section 21 and the ninth and tenth switches SW19 and SW20 of the first and second outputting sections 23 and 24, respectively, which are phase-driven in the same phase into a conducting state and a non-conducting state.

Meanwhile, FIG. 6B illustrates states of the fifth to eighth switches SW15 to SW18 of the changeover section 25 which are phase-driven in the opposite phase to that of the first to third switches SW11 to SW13 of the signal production section 21 and the ninth and tenth switches SW19 and SW20 of the first and second outputting sections.

It is to be noted that, in FIGS. 6A and 6B, the conducting state is indicated as "ON" and the non-conducting state is indicated as "OFF."

Further, in FIG. 6A, reference character Cs represents a sampling capacitor and represents the first to fourth capacitors C11 to C14 of the signal production section 21.

Figure 7:
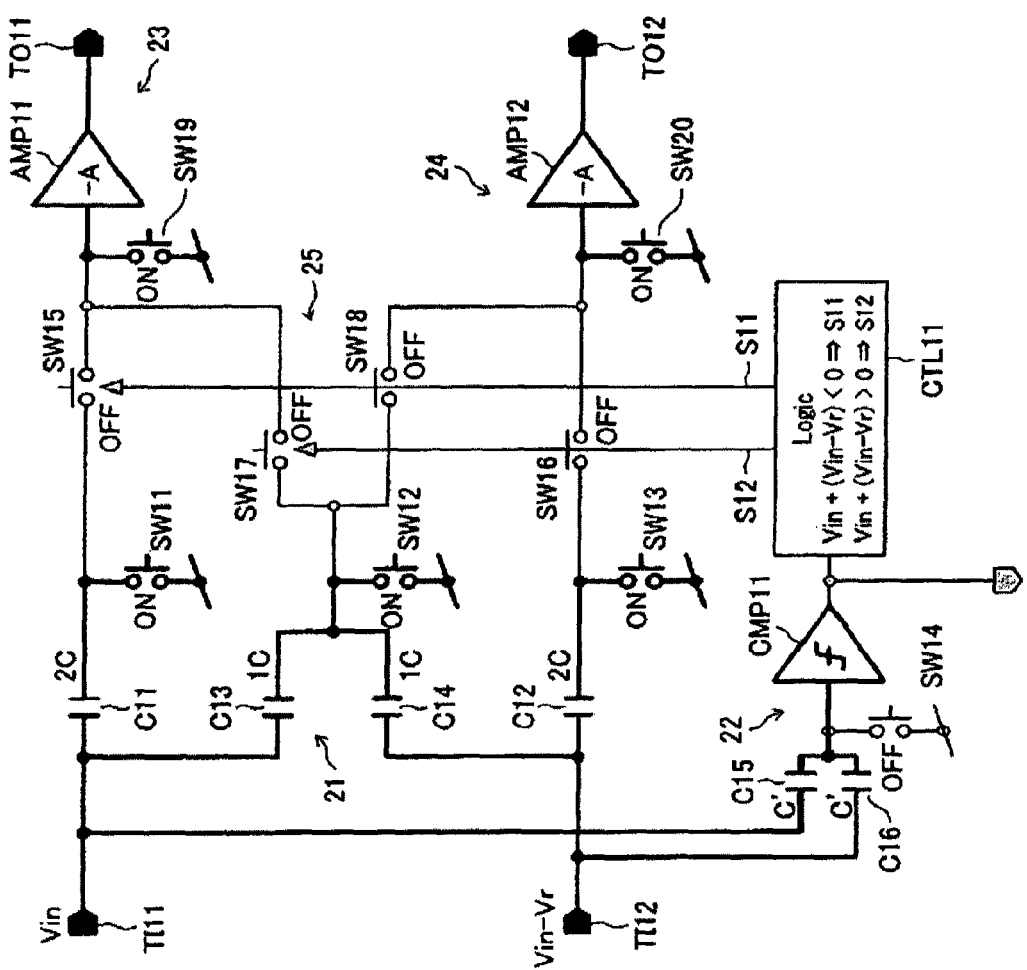
FIG. 7 is a circuit diagram illustrating operation in a first phase of the 1-bit AD converter of FIG. 1.

FIG. 7 illustrates operation of the 1-bit AD converter according to the first embodiment in the first phase.

Figure 8:
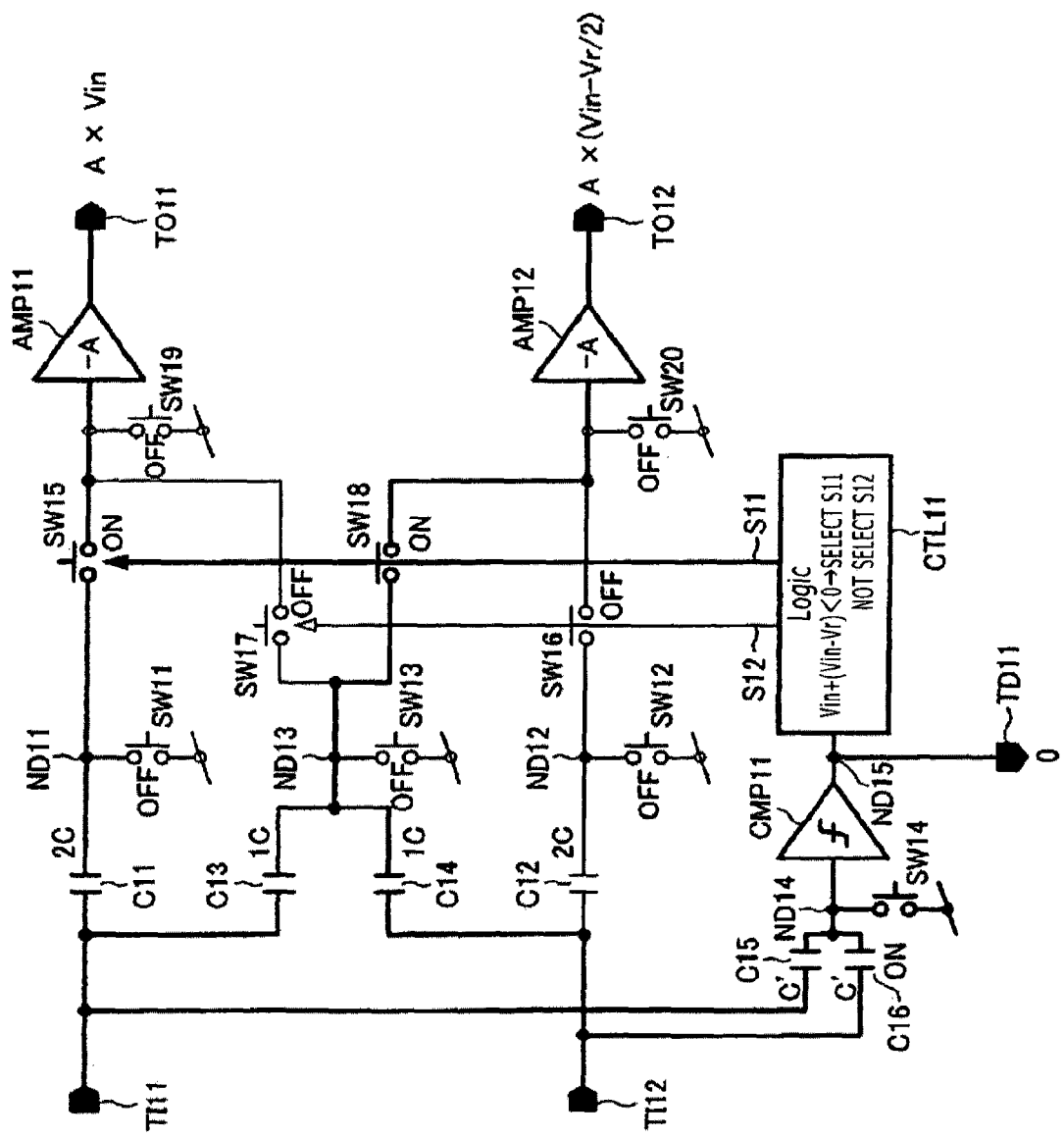
FIG. 8 is a circuit diagram illustrating operation in a second phase of the 1-bit AD converter of FIG. 1 when a first comparison result is obtained.

FIG. 8 illustrates operation of the 1-bit AD converter according to the first embodiment in the second phase and particularly illustrates operation in the case where the first comparison result is obtained.

Figure 9:
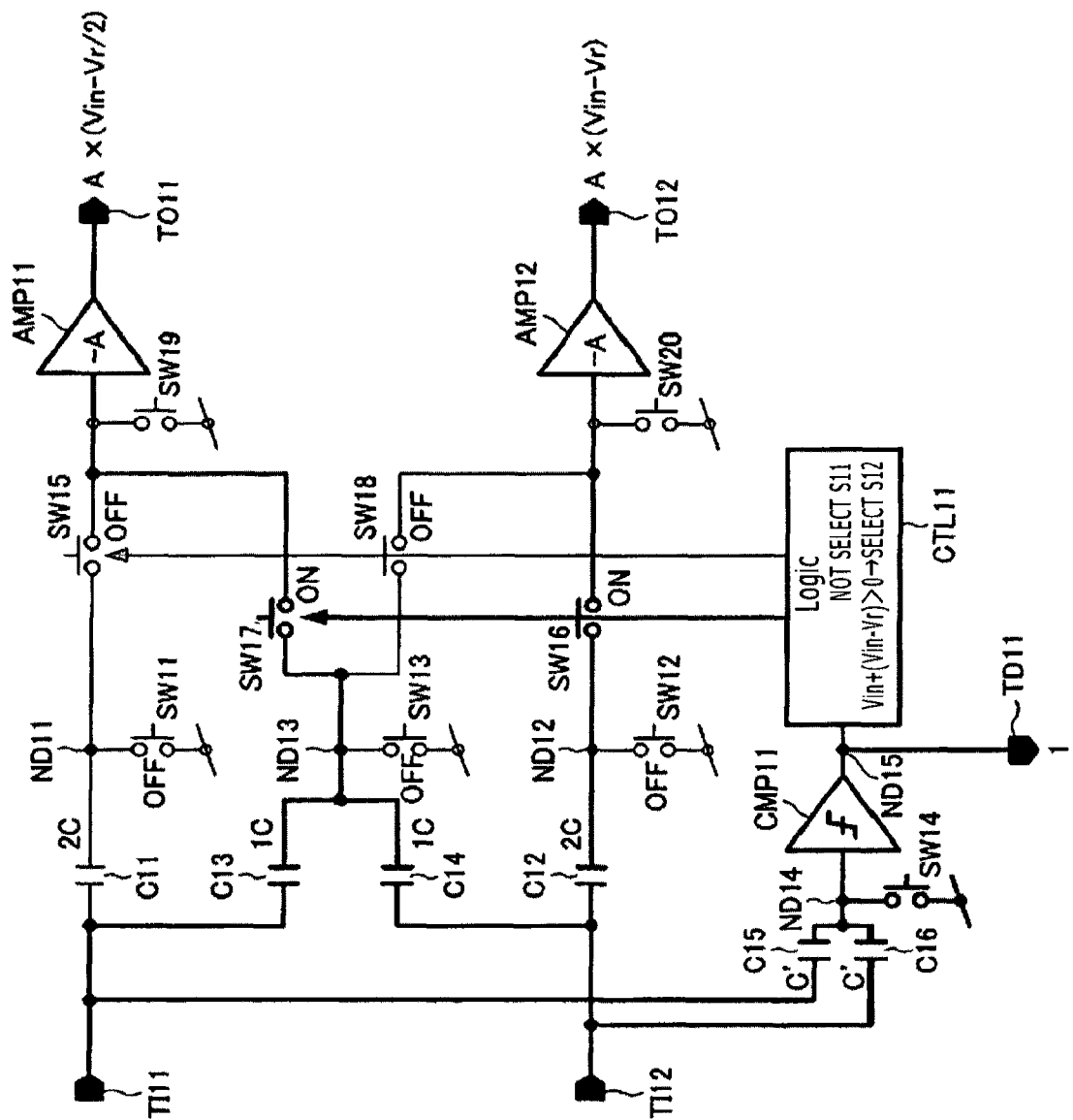
FIG. 9 is a similar view but illustrating operation in a second phase of the 1-bit AD converter of FIG. 1 when a second comparison result is obtained.

FIG. 9 illustrates operation of the 1-bit AD converter according to the first embodiment in the second phase and particularly illustrates operation in the case where the second comparison result is obtained.

[Operation in the First Phase]

In the first phase, the first phase signal $\Phi 1$ has the active high level and is supplied to the signal production section 21, first outputting section 23 and second outputting section 24.

At this time, the second phase signal $\Phi 2$ has the inactive low level and is supplied to the comparison section 22.

Consequently, the first switch SW11, second switch SW12 and third switch SW13 of the signal production section 21, the ninth switch SW19 of the first outputting section 23 and the tenth switch SW20 of the second outputting section 24 are placed into a conducting or ON state.

Meanwhile, the fourth switch SW14 of the comparison section 22 is placed into a non-conducting or OFF state.

In the signal production section 21, when the first to third switches SW11 to SW13 are placed into a conducting state, the first analog signal Vin and the second analog signal Vin–Vr inputted to the sampling capacitors Cs are sampled.

In particular, the first analog signal Vin is sampled by the first and third capacitors C11 and C13 which are the sampling capacitors Cs, and the second analog signal Vin–Vr is sampled by the second and fourth capacitors C12 and C14 which are the sampling capacitors Cs.

Further, when the ninth and tenth switches SW19 and SW20 of the first and second outputting sections 23 and 24 are placed into a conducting state, the first amplifier AMP11 and the second amplifier AMP12 are reset.

[Operation in the Second Phase]

In the second phase, the second phase signal $\Phi 2$ has the active high level and is supplied to the comparison section 22.

At this time, the first phase signal $\Phi 1$ has the inactive low level and is supplied to the signal production section 21, first outputting section 23 and second outputting section 24.

Consequently, the fourth switch SW14 of the comparison section 22 is placed into a conducting or ON state.

On the other hand, the first switch SW11, second switch SW12 and third switch SW13 of the signal production section 21, the ninth switch SW19 of the first outputting section 23 and the tenth switch SW20 of the second outputting section 24 are placed into a non-conducting or OFF state.

In the comparison section 22, when the fourth switch SW14 is placed into a conducting state, the first analog signal Vin and the second analog signal Vin–Vr are sampled by the fifth capacitor C15 and the sixth capacitor C16, respectively. Then, the sampled voltages are generated on the input node ND14 side of the comparator CMP11 at predetermined timings.

Meanwhile, in the signal production section 21, since the first switch SW11, second switch SW12 and third switch SW13 are placed in a non-conducting state, the sampled voltages V are generated on the first to third output nodes ND11 to ND13 side. Thus, the signal production section 21 is in a state in which it can output voltage signals.

Then, the comparison section 22 synthesizes the voltages and supplies a resulting voltage to the comparator CMP11.

In this instance, the comparator CMP11 carries out a comparison operation at a timing at which the first phase signal $\Phi 1$ changes over from the high level to the low level.

In this comparison operation, the comparator CMP11 compares the synthesized signal voltage Vin+Vin–Vr inputted thereto with 0 V.

If the first comparison result Vin+Vin–Vr<0 is obtained, then the comparator CMP11 outputs the first digital data 0 to the digital data output terminal TD11 and the control section CTL11 through the output node ND15.

On the other hand, if the second comparison result Vin+Vin–Vr>0 is obtained, then the comparator CMP11 outputs the digital data 1 to the digital data output terminal TD11 and the control section CTL11 through the output node ND15.

Then, the control section CTL11 determines which one of the first control signal S11 and the second control signal S12 should be outputted with the active high level when the second phase signal $\Phi 2$ changes from the low level to the high level in response to an input signal.

If the first digital data 0 is received from the comparator CMP11, then the control section CTL11 determines that the first comparison result of Vin+Vin–Vr<0 is obtained as a result of the comparison, and controls the changeover section 25 in the following manner with the first control signal S11 and the second control signal S12.

The control section CTL11 sets the first control signal S11 to the active high level and sets the second control signal S12 to the inactive low level.

Consequently, in the changeover section 25, the fifth switch SW15 and the eighth switch SW18 are kept in a conducting or ON state while the sixth switch SW16 and the seventh switch SW17 are kept in a non-conducting or OFF state as seen in FIG. 8.

Consequently, the first analog signal Vin outputted from the signal production section 21 is inputted to the first amplifier AMP11 of the first outputting section 23 while the third analog signal Vin–Vr/2 is inputted to the second amplifier AMP12 of the second outputting section 24.

The first amplifier AMP11 amplifies the first residual signal Vin supplied thereto through the changeover section 25 with a predetermined amplification factor A and outputs a signal A×Vin from the first analog signal output terminal TO11.

The second amplifier AMP12 amplifies the second residual signal Vin–Vr/2 supplied thereto through the changeover section 25 with the predetermined amplification factor A and outputs a signal A×(Vin–Vr/2) from the second analog signal output terminal TO12.

On the other hand, if the second digital data 1 is received from the comparator CMP11, then the control section CTL11 determines that the second comparison result of Vin+Vin–Vr>0 is obtained as a result of the comparison and controls the changeover section 25 in the following manner with the first control signal S11 and the second control signal S12.

The control section CTL11 sets the second control signal S12 to the active high level and sets the first control signal S11 to the inactive low level.

Consequently, in the changeover section 25, the sixth switch SW16 and the seventh switch SW17 are kept in a conducting or ON state and the fifth switch SW15 and the eighth switch SW18 are kept in a non-conducting or OFF state as seen in FIG. 9.

Consequently, the third analog signal Vin−Vr/2 outputted from the signal production section 21 is inputted to the first amplifier AMP11 of the first outputting section 23 while the second analog signal Vin−Vr is inputted to the second amplifier AMP12 of the second outputting section 24.

The first amplifier AMP11 amplifies the first residual signal Vin−Vr/2 supplied thereto through the changeover section 25 with the predetermined amplification factor A and outputs a resulting signal A×(Vin−Vr/2) from the first analog signal output terminal TO11.

The second amplifier AMP12 amplifies the second residual signal Vin−Vr supplied thereto through the changeover section 25 with the predetermined amplification factor A and outputs a resulting signal A×(Vin−Vr) from the second analog signal output terminal TO12.

As described above, the 1-bit AD converter 10 of the present first embodiment carries out comparison based on a comparison object value or threshold value produced from the two analog input voltages Vin and Vin−Vr. Also an analog residual signal is produced from the two analog input voltages themselves.

Consequently, the 1-bit AD converter 10 does not include any portion which requires an accurate absolute value.

By the configuration, there is no necessity to precisely control the amplification factor or gain of the amplifiers AMP11 and AMP12. Further, since also capacitive arithmetic operation is carried out by an open loop without using a closed loop, the amplifier can be configured as a simple differential amplifier.

<2. Second Embodiment>

Figure 10:
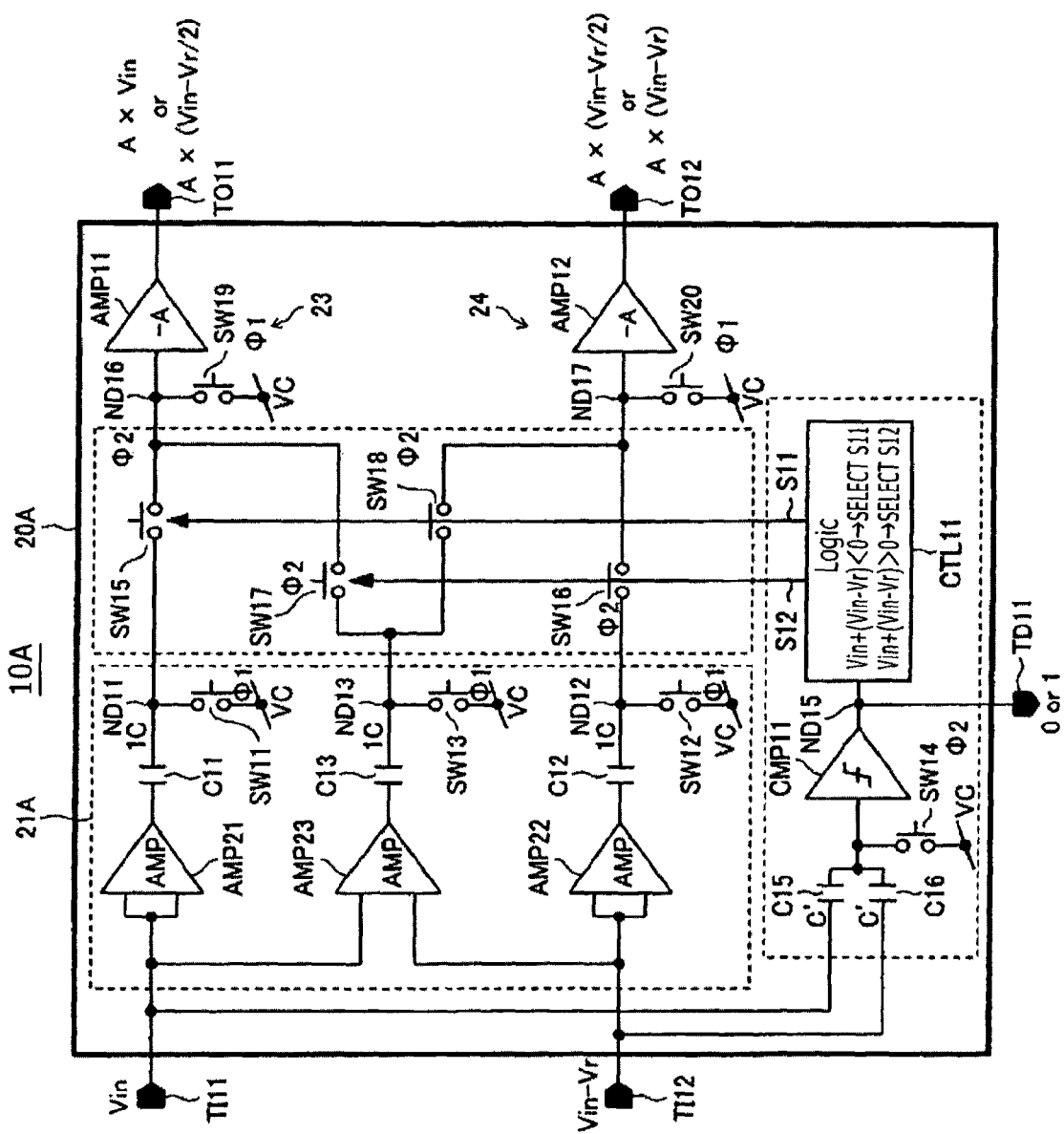
FIG. 10 is a circuit diagram showing an example of a configuration of a 1-bit AD converter according to a second embodiment of the present disclosure.

FIG. 10 shows an example of a configuration of a 1-bit AD converter 10A according to a second embodiment of the present disclosure.

Referring to FIG. 10, the 1-bit AD converter 10A according to the second embodiment is similar in configuration to the 1-bit AD converter 10 according to the first embodiment described hereinabove except that the third analog signal Vin−Vr/2 is produced by a signal production section 21A applying interpolation by an amplifier.

The signal production section 21A which applies the amplifier interpolation includes amplifiers AMP21, AMP22 and AMP23 of the differential type.

Further, in the signal production section 21A, the capacitance value of the first capacitor C11, second capacitor C12 and third capacitor C13 except the fourth capacitor shown in FIG. 3 is set to a capacitance value 1C.

The amplifier AMP21 receives, at two input terminals thereof, a first analog signal Vin as an input signal and amplifies the first analog signal Vin with a predetermined amplification factor. The amplifier AMP21 is connected at an output terminal thereof to one terminal of the first capacitor C11. The first capacitor C11 is connected at the other terminal thereof to the first output node ND11.

The amplifier AMP22 receives, at two input terminals thereof, a second analog signal Vin−Vr as an input signal and amplifies the second analog signal Vin−Vr with a predetermined amplification factor. The amplifier AMP22 is connected at an output terminal thereof to one terminal of the second capacitor C12. The second capacitor C12 is connected at the other terminal thereof to the second output node ND12.

The amplifier AMP23 receives, at one terminal thereof, the first analog signal Vin as an input signal and, at the other terminal thereof, the second analog signal Vin−Vr as another input signal, and amplifies a middle voltage between the first analog signal Vin and the second analog signal Vin−Vr. The amplifier AMP23 is connected at an output terminal thereof to one terminal of the third capacitor C13. The third capacitor C13 is connected at the other terminal thereof to the third output node ND13.

The 1-bit AD converter 10A according to the second embodiment described above can achieve similar working effects to those achieved by the 1-bit AD converter 10 according to the first embodiment.

<3. Third Embodiment>

Figure 11:
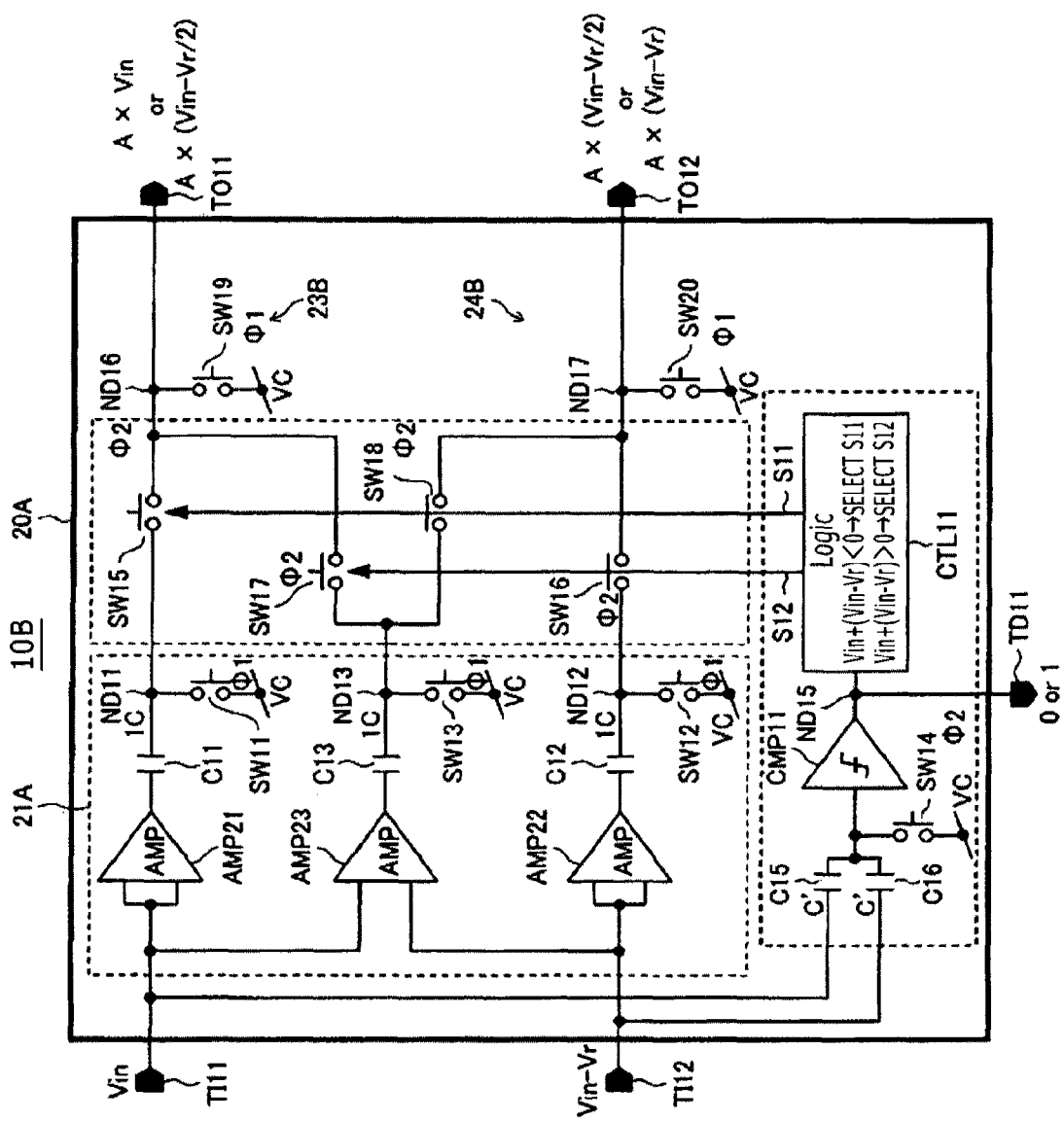
FIG. 11 is a similar view but showing an example of a configuration of a 1-bit AD converter according to a third embodiment of the present disclosure.

FIG. 11 shows an example of a configuration of a 1-bit AD converter 10B according to a third embodiment of the present disclosure.

Referring to FIG. 11, the 1-bit AD converter 10B according to the third embodiment is similar in configuration to the 1-bit AD converter 10A according to the second embodiment described hereinabove except that the first amplifier AMP11 of the first outputting section 23B and the second amplifier AMP12 of the second outputting section 24B are not provided.

In this configuration, the function of the first amplifier of the first outputting section 23B is achieved by the amplifier AMP21 or AMP23 disposed in the signal production section 21A. Similarly, the function of the second amplifier of the second outputting section 24B is achieved by the amplifier AMP23 or AMP22 of the signal production section 21A.

It is to be noted that also it is possible to adopt a modified configuration in which the ninth switch SW19 of the first outputting section 23B and the tenth switch SW20 of the second outputting section 24B are not provided.

The 1-bit AD converter 10B according to the third embodiment described above can achieve similar working effects to those achieved by the 1-bit AD converter 10 according to the first embodiment and the 1-bit AD converter 10A according to the second embodiment.

<4. Fourth Embodiment>

Figure 12:
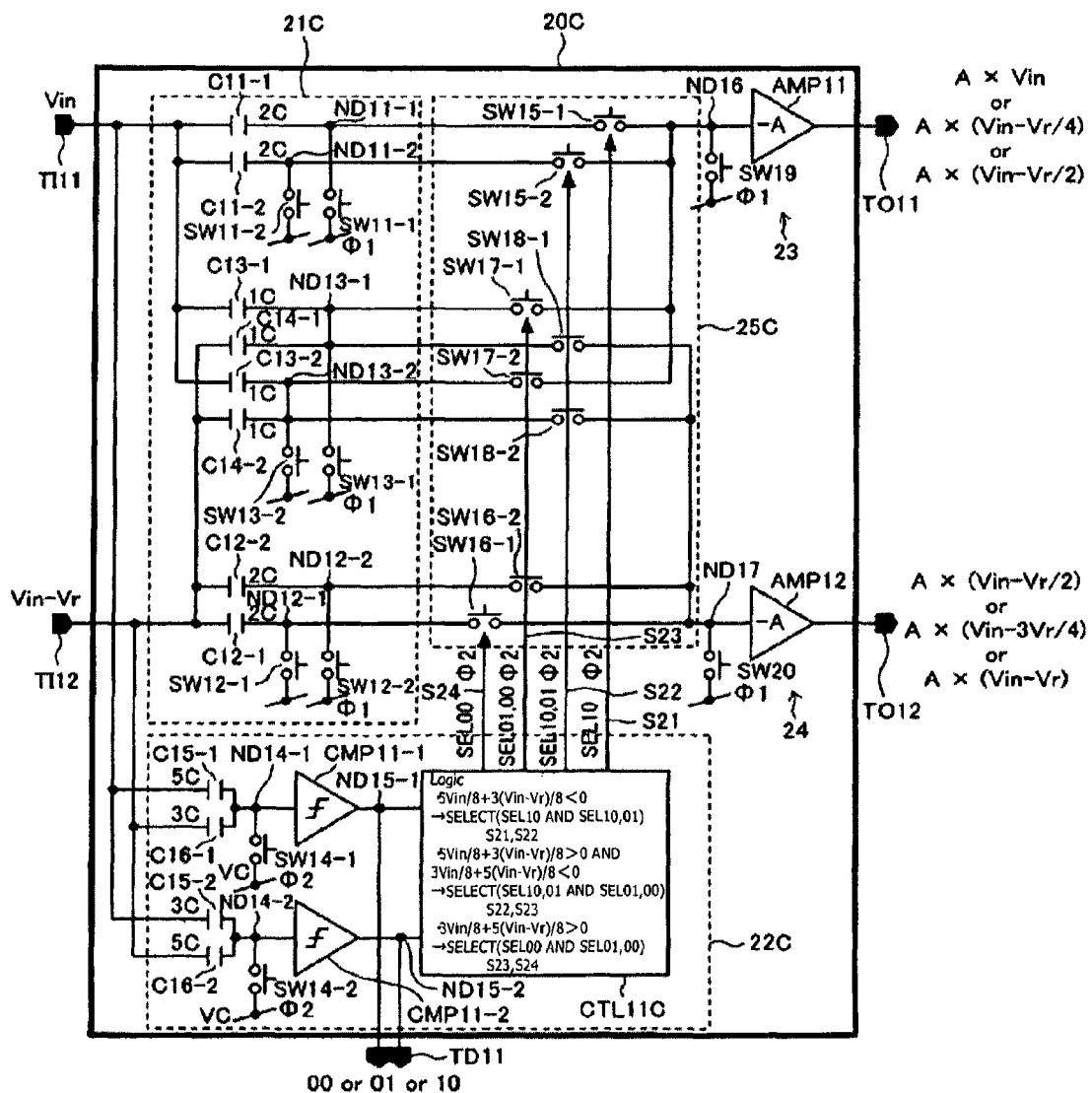
FIG. 12 is a similar view but showing an example of a configuration of a 1.5-bit AD converter according to a fourth embodiment of the present disclosure.

FIG. 12 shows an example of a configuration of a 1.5-bit AD converter 10C according to a fourth embodiment of the present disclosure.

Referring to FIG. 12, the 1.5-bit AD converter 10C according to the fourth embodiment is similar in configuration to the 1-bit AD converter 10 according to the first embodiment described hereinabove except that two analog output signals are provided and outputted with a redundant voltage αin in order to relax the accuracy of built-in comparators.

In order to implement the configuration just described, the 1.5-bit AD converter 10C of FIG. 12 is configured in the following manner.

The 1.5-bit AD converter 10C is basically configured such that two such signal processing lines as that in FIG. 3 are provided in two parallel systems with regard to a signal production section 21C, a comparison section 22C and a changeover section 25C thereby to allow weighting.

Referring to FIG. 12, in the signal production section 21C, components similar to a first capacitor C11-1, a first switch SW11-1 and a first output node ND11-1 are disposed in parallel to an input line of a first analog signal Vin. In particular, a first capacitor C11-2, a first switch SW11-2 and a first output node ND11-2 are disposed for the input line of the first analog signal Vin.

Further, components similar to a second capacitor C12-1, a second switch SW12-1 and a second output node ND12-1 are disposed in parallel to an input line of a second analog signal Vin−Vr. In particular, a second capacitor C12-2, a second switch SW12-2 and a second output node ND12-2 are disposed for the input line of the second analog signal Vin−Vr.

Further, components similar to a third capacitor C13-1, a third switch SW13-1 and a third output node ND13-1 are disposed in parallel to the input line of the first analog signal Vin. In particular, a third capacitor C13-2, a third switch SW13-2 and a third output node ND13-2 are disposed for the input line of the first analog signal Vin.

Further, components similar to a fourth capacitor C14-1, the third switch SW13-1 and the third output node ND13-1 are disposed in parallel to the input line of the second analog signal Vin−Vr. In particular, a fourth capacitor C14-2, the third switch SW13-2 and the third output node ND13-2 are disposed for the input line of the second analog signal Vin−Vr.

In the comparison section 22C, two systems for capacitance arithmetic operation and comparison processing of a fifth capacitor C15, a sixth capacitor C16, a fourth switch SW14, an input node ND14 and a comparator CMP11 are formed.

In particular, a fifth capacitor C15-1 having capacitance set to 5C and a sixth capacitor C16-1 having capacitance set to 3C are connected at terminals thereof to each other and connected to an input terminal of a comparator CMP11-1 through an input node ND14-1. A fourth switch SW14-1 is connected between the input node ND14-1 and a fixed potential VC.

Similarly, a fifth capacitor C15-2 having capacitance set to 3C and a sixth capacitor C16-2 having capacitance set to 5C are connected at terminals thereof to each other and connected to an input terminal of a comparator CMP11-2 through an input node ND14-2. A fourth switch SW14-2 is connected between the input node ND14-2 and the fixed potential VC.

The fifth capacitor C15-1 and the sixth capacitor C16-1 sample input signals when the fourth switch SW14-1 is in a conducting state, and generate the sampled voltages on the input node ND14-1 side of the comparator CMP11-1 at a predetermined timing. Then, the voltages are synthesized, and a resulting voltage $5Vin/8+3(Vin-Vr)/8=Vin-3Vr/8$ is supplied to the comparator CMP11-1.

Similarly, the fifth capacitor C15-2 and the sixth capacitor C16-2 sample input signals when the fourth switch SW14-2 is in a conducting state, and generate the sampled voltages on the input node ND14-2 side of the comparator CMP11-2 at a predetermined timing. Then, the voltages are synthesized, and a resulting voltage $3Vin/8+5(Vin-Vr)/8=Vin-5Vr/8$ is supplied to the comparator CMP11-2.

The comparator CMP11-1 compares the synthesized signal voltage $5Vin/8+3(Vin-Vr)/8=Vin-3Vr/8$ inputted thereto with 0 V.

If a first comparison result of $5Vin/8+3(Vin-Vr)/8=Vin-3Vr/8<0$ is obtained, then the comparator CMP11-1 outputs digital data 0 to a digital data output terminal TD11 and a control section CTL11C through an output node ND15-1.

If a second comparison result of $5Vin/8+3(Vin-Vr)/8=Vin-3Vr/8>0$ is obtained, then the comparator CMP11-1 outputs digital data 1 to the digital data output terminal TD11 and the control section CTL11C through the output node ND15-1.

The comparator CMP11-2 compares the synthesized signal voltage $3Vin/8+5(Vin-Vr)/8=Vin-5Vr/8$ inputted thereto with 0 V.

If a first comparison result of $3Vin/8+5(Vin-Vr)/8=Vin-5Vr/8<0$ is obtained, then the comparator CMP11-2 outputs digital data 0 to the digital data output terminal TD11 and the control section CTL11C through an output node ND15-2.

If a second comparison result of $3Vin/8+5(Vin-Vr)/8=Vin-5Vr/8>0$ is obtained, then the comparator CMP11-2 outputs digital data 1 to the digital data output terminal TD11 and the control section CTL11C through the output node ND15-2.

If the control section CTL11C receives the digital data 0 from the comparator CMP11-1 or CMP11-2, then it determines that the first comparison result of $5Vin/8+3(Vin-Vr)/8=Vin-3Vr/8<0$ is obtained as a result of the comparison. Then, the control section CTL11C controls the changeover section 25C in the following manner with a first control signal S21 and a second control signal S22.

The control section CTL11C controls the changeover section 25C such that the first analog signal Vin outputted from the signal production section 21C is inputted to a first outputting section 23 and a third analog signal Vin−Vr/2 is inputted to a second outputting section 24.

If the control section CTL11C receives the digital data 1 from the comparator CMP11-1 and receives the digital data 0 from the comparator CMP11-2, then it determines that the second comparison result is obtained at the comparator CMP11-1 and the first comparison result is obtained at the comparator CMP11-2.

In other words, the control section CTL11C determines that $5Vin/8+3(Vin-Vr)/8=Vin-3Vr/8>0$ is obtained at the comparator CMP11-1 and $3Vin/8+5(Vin-Vr)/8=Vin-5Vr/8<0$ is obtained at the comparator CMP11-2.

Then, the control section CTL11C controls the changeover section 25C in the following manner with the second control signal S22 and a third control signal S23.

The control section CTL11C controls the changeover section 25C such that a third analog signal Vin−Vr/4 outputted from the signal production section 21C is inputted to the first outputting section 23 and the other third analog signal Vin−3Vr/4 is inputted to the second outputting section 24.

If the control section CTL11C receives the digital data 1 from the comparators CMP11-1 and CMP11-2, then it decides that the second comparison result $3Vin/8+5(Vin-Vr)/8=Vin-5Vr/8>0$ is obtained as a result of the comparison of the comparator CMP11-2. Then, the control section CTL11C controls the changeover section 25C in the following manner with the third control signal S23 and a fourth control signal S24.

The control section CTL11C controls the changeover section 25C such that the third analog signal Vin−Vr/2 outputted from the signal production section 21C is inputted to the first outputting section 23 and the second analog signal Vin−Vr is inputted to the second outputting section 24.

When the second phase signal Φ2 changes from the low level to the high level, the control section CTL11C determines which two of the first to fourth control signals S21 to S24 should be outputted with the active high level.

In the changeover section 25C, two systems of switches are disposed in accordance with the two-system arrangement of the signal production section 21C.

In particular, between an input node ND16 of the first outputting section 23 and the first output node ND11-2 of the signal production section 21C, a fifth switch SW15-2 is disposed in parallel to a fifth switch SW15-1.

Between an input node ND17 of the second outputting section 24 and the second output node ND12-2 of the signal production section 21C, a sixth switch SW16-2 is disposed in parallel to a sixth switch SW16-1.

Between the input node ND16 of the first outputting section 23 and the third output node ND13-2 of the signal production section 21C, a seventh switch SW17-2 is disposed in parallel to a seventh switch SW17-1.

Between the input node ND17 of the second outputting section 24 and the third output node ND13-2 of the signal production section 21C, an eighth switch SW18-2 is disposed in parallel to an eighth switch SW18-1.

In the changeover section 25C, the fifth switch SW15-1 is changed over between a conducting state and a non-conducting state in response to the first control signal S21 outputted from the comparison section 22C. The fifth switch SW15-1 is kept in a conducting state when the first control signal S21 has the active high level, but is kept in a non-conducting state when the first control signal S21 has the inactive low level.

The fifth switch SW15-2 and the eighth switches SW18-1 and SW18-2 are changed over between a conducting state and a non-conducting state in response to the second control signal S22 outputted from the comparison section 22C. The fifth switch SW15-2 and the eighth switches SW18-1 and SW18-2 are kept in a conducting state when the second control signal S22 exhibits the active high level, but are kept in a non-conducting state when the third control signal S23 exhibits the inactive low level.

The sixth switch SW16-2 and the seventh switches SW17-1 and SW17-2 are changed over between a conducting state and a non-conducting state in response to the third control signal S23 outputted from the comparison section 22C. The sixth switch SW16-2 and the seventh switches SW17-1 and SW17-2 are kept in a conducting state when the third control signal S23 exhibits the active high level, but are kept in a non-conducting state when the second control signal S22 exhibits the inactive low level.

The sixth switch SW16-1 is changed over between a conducting state and a non-conducting state in response to a fourth control signal S24 outputted from the comparison section 22C. The sixth switch SW16-1 is kept in a conducting state when the fourth control signal S24 exhibits the active high level, but is kept in a non-conducting state when the fourth control signal S24 exhibits the inactive low level.

Figure 13A:
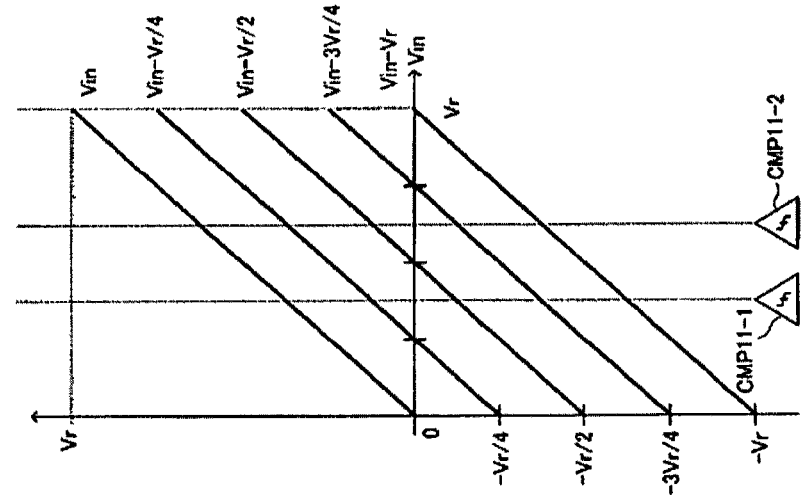
FIGS. 13A and 13B are diagrams illustrating a basic concept of operation of the 1.5-bit AD converter of FIG. 12.
Figure 13B:
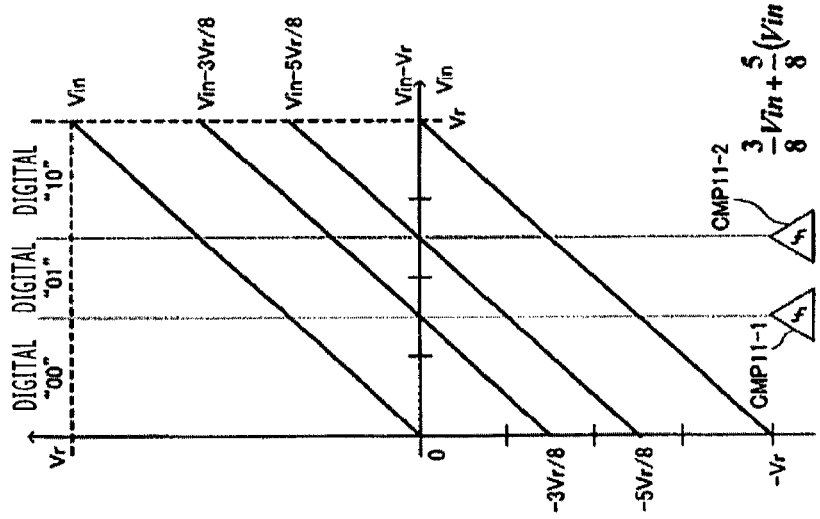

FIGS. 13A and 13B illustrate a basic concept of operation of the 1.5-bit AD converter 10C described hereinabove.

In the 1-bit AD converter 10C, the comparison section 22C weights the first analog signal Vin and the second analog signal Vin−Vr, which are two input analog signals, compares the weighted signals with each other and outputs digital data 0 or 1 in response to a result of the comparison as seen in FIG. 13A.

As a method therefor, in the present embodiment, the first analog signal Vin and the second analog signal Vin−Vr are weighted to 3/8 and 5/8, respectively.

In particular, the first analog signal Vin is weighted like 3Vin/8 and 5Vin/8, and the second analog signal Vin−Vr is weighted like 5(Vin−Vr)/8 and 3(Vin−Vr)/8.

Then, the weighted first analog signal 3Vin/8 and the weighted second analog signal 5(Vin−Vr)/8 are added to obtain a signal 3Vin/8+5(Vin−Vr)/8=Vin−5Vr/8.

Similarly, the weighted first analog signal 5Vin/8 and the weighted second analog signal 3(Vin−Vr)/8 are added to obtain a signal 5Vin/8+3(Vin−Vr)/8=Vin−3Vr/8.

Then, the signals Vin−5Vr/8 and the Vin−3Vr/8 are compared with 0 by the comparators CMP11-1 and CMP11-2, respectively, to determine whether the signals are greater or higher than zero or smaller or lower than zero. The comparators CMP11-1 and CMP11-2 thus output one of digital data 00, 01 and 10.

In the 1.5-bit AD converter 10C, the comparison result of the comparison section 22C is applied also to two analog signal outputs.

In particular, if the first comparison result of outputting the digital data $\Phi 0$ is obtained by the 1.5-bit AD converter 10C, then the first analog signal Vin and the third analog signal Vin−Vr/2 are selected and outputted as the analog signal outputs in accordance with a region as seen in FIG. 13B.

If the third comparison result of outputting the digital data $\Phi 1$ is obtained by the 1.5-bit AD converter 10C, then the third analog signal Vin−Vr/4 and the other third analog signal Vin−3Vr/4 are selected and outputted as the signal outputs in accordance with a region as seen in FIG. 13B.

If the second comparison result of outputting the digital data 10 is obtained by the 1.5-bit AD converter 10C, then the third analog signal Vin−Vr/2 and the second analog signal Vin−Vr are selected and outputted as the signal outputs in accordance with a region as seen in FIG. 13B.

The 1.5-bit AD converter 10C according to the fourth embodiment described above can achieve similar working effects to those achieved by the 1-bit AD converter 10 according to the first embodiment. Further, the accuracy of the comparators can be relaxed further.

5. Fifth Embodiment

Figure 14:
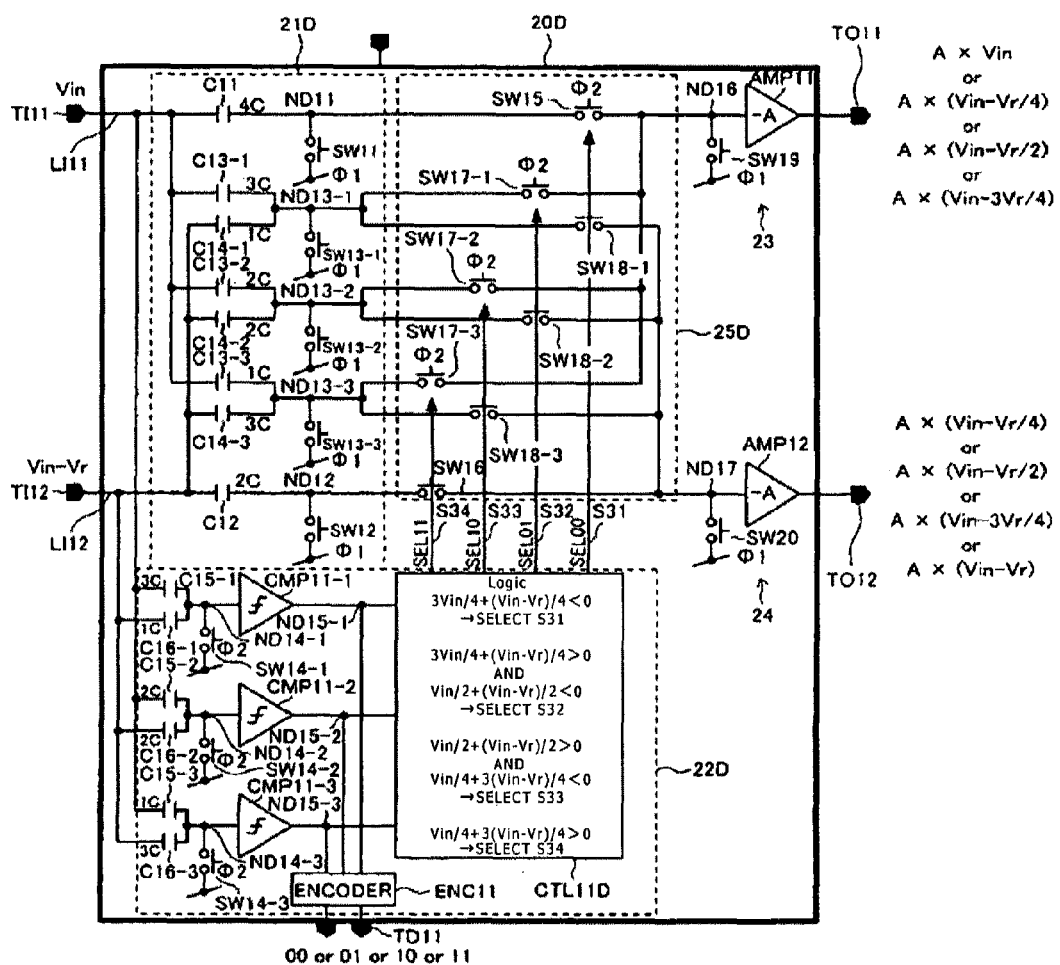
FIG. 14 is a circuit diagram showing an example of a configuration of a 2-bit AD converter according to a fifth embodiment of the present disclosure.

FIG. 14 shows an example of a configuration of a 2-bit AD converter 10D according to a fifth embodiment of the present disclosure.

Referring to FIG. 14, the 2-bit AD converter 10D according to the fifth embodiment is similar in configuration to the 1-bit AD converter 10 according to the first embodiment described hereinabove except that not a 1-bit AD converter but the 2-bit AD converter 10D is configured from a single AD conversion stage.

In order to implement the configuration just described, the AD converter 10D of FIG. 14 is configured in the following manner.

The AD conversion stage 20D of the AD converter 10D is basically configured such that three such signal processing lines as that in FIG. 3 are provided in three parallel systems in a production system of a third analog signal of a signal production section 21D, a comparison section 22D and a changeover section 25D thereby to allow weighting.

In the signal production section 21D, a first capacitor C11 has capacitance set to 4C, and a second capacitor C12 has capacitance set to 2C.

In the signal production section 21D, as a third capacitor C13, a third capacitor C13-1 having capacitance set to 3C, a third capacitor C13-2 having capacitance set to 2C and a third capacitor C13-3 having capacitance set to 1C are provided. The third capacitors C13-1, C13-2 and C13-3 are connected at one terminal thereof commonly to an input line LI11 of a first analog signal Vin.

In the signal production section 21D, as a fourth capacitor C14, a fourth capacitor C14-1 having capacitance set to 1C, a fourth capacitor C14-2 having capacitance set to 2C and a fourth capacitor C14-3 having capacitance set to 3C are provided. The fourth capacitors C14-1, C14-2 and C14-3 are connected at one terminal thereof commonly to an input line LI12 of a second analog signal Vin−Vr.

The third capacitor C13-1 and the fourth capacitor C14-1 are connected at the other terminal thereof commonly to the third output node ND13-1, and the third switch SW13-1 is connected between the third output node ND13-1 and the fixed potential VC.

The third capacitor C13-2 and the fourth capacitor C14-2 are connected at the other terminal thereof commonly to the third output node ND13-2, and the third switch SW13-2 is connected between the third output node ND13-2 and the fixed potential VC.

The third capacitor C13-3 and the fourth capacitor C14-3 are connected at the other terminal thereof commonly to a third output node 13-3, and a third switch SW13-3 is connected between the third output node 13-3 and the fixed potential VC.

In the comparison section 22D, three systems for capacitance arithmetic operation and comparison processing of a fifth capacitor C15, a sixth capacitor C16, a fourth switch SW14, an input node ND14 and a comparator CMP11 are formed.

In particular, a fifth capacitor C15-1 having capacitance set to 3C and a sixth capacitor C16-1 having capacitance set to 1C are connected at terminals thereof to each other and connected to an input terminal of a comparator CMP11-1 through an input node ND14-1. A fourth switch SW14-1 is connected between the input node ND14-1 and the fixed potential VC.

Similarly, a fifth capacitor C15-2 having capacitance set to 2C and a sixth capacitor C16-2 having capacitance set to 2C are connected at terminals thereof to each other and connected to an input terminal of a comparator CMP11-2 through an input node ND14-2. A fourth switch SW14-2 is connected between the input node ND14-2 and the fixed potential VC.

Further, a fifth capacitor C15-3 having capacitance set to 1C and a sixth capacitor C16-3 having capacitance set to 4C are connected at terminals thereof to each other and connected to an input terminal of a comparator CMP11-3 through an input node ND14-3. A switch SW14-3 is connected between the input node ND14-3 and the fixed potential VC.

The fifth capacitor C15-1 and the sixth capacitor C16-1 sample input signals thereto when the fourth switch SW14-1 is in a conducting state, and generate the sampled voltages on the input node ND14-1 side of the comparator CMP11-1 at a predetermined timing. Then, the voltages are synthesized, and a resulting voltage $3Vin/4+(Vin-Vr)/4=Vin-Vr/4$ is supplied to the comparator CMP11-1.

Similarly, the fifth capacitor C15-2 and the sixth capacitor C16-2 sample input signals thereto when the fourth switch SW14-2 is in a conducting state, and generate the sampled voltages on the input node ND14-2 side of the comparator CMP11-2 at a predetermined timing. Then, the voltages are synthesized, and a resulting voltage $Vin/2+(Vin-Vr)/2=Vin-Vr/2$ is supplied to the comparator CMP11-2.

Further, the fifth capacitor C15-3 and the sixth capacitor C16-3 sample input signals thereto when the switch SW14-3 is in a conducting state, and generate the sampled voltages on the input node ND14-3 side of the comparator CMP11-3 at a predetermined timing. Then, the voltages are synthesized, and a resulting voltage $Vin/4+3(Vin-Vr)/4=Vin-3Vr/4$ is supplied to the comparator CMP11-3.

The comparator CMP11-1 compares the synthesized signal voltage $3Vin/4+(Vin-Vr)/4=Vin-Vr/4$ inputted thereto with 0 V.

If a first comparison result $3Vin/4+(Vin-Vr)/4=Vin-Vr/4<0$ is obtained, then the comparator CMP11-1 outputs the digital data 0 to an encoder ENC11 and a control section CTL11D through the output node ND15-1.

On the other hand, if the second comparison result $3Vin/4+(Vin-Vr)/4=Vin-Vr/4>0$ is obtained, then the comparator CMP11-1 outputs the digital data 1 to the encoder ENC11 and the control section CTL11D through the output node ND15-1.

The comparator CMP11-2 compares the synthesized signal voltage $Vin/2+(Vin-Vr)/2=Vin-Vr/2$ inputted thereto with 0 V.

If a first comparison result $Vin/2+(Vin-Vr)/2=Vin-Vr/2<0$ is obtained, then the comparator CMP11-2 outputs the digital data 0 to the encoder ENC11 and the control section CTL11D through the output node ND15-2.

On the other hand, if a second comparison result $Vin/2+(Vin-Vr)/2=Vin-Vr/2>0$ is obtained, then the comparator CMP11-2 outputs the digital data 1 to the encoder ENC11 and the control section CTL11D through the output node ND15-2.

The comparator CMP11-3 compares the synthesized signal voltage $Vin/4+3(Vin-Vr)/4=Vin-3Vr/4$ inputted thereto with 0 V.

If a first comparison result $Vin/4+3(Vin-Vr)/4=Vin-3Vr/4<0$ is obtained, then the comparator CMP11-3 outputs the digital data 0 to the encoder ENC11 and the control section CTL11D through an output node ND15-3.

On the other hand, if a second comparison result $Vin/4+3(Vin-Vr)/4=Vin-3Vr/4>0$ is obtained, then the comparator CMP11-3 outputs the digital data 1 to the encoder ENC11 and the control section CTL11D through the output node ND15-3.

If the control section CTL11D receives the digital data 0 from the comparators CMP11-1, CMP11-2 and CMP11-3, then it decides that the first comparison result $3Vin/4+(Vin-Vr)/4=Vin-Vr/4<0$ is obtained as a result of the comparison. Then, the control section CTL11D controls the changeover section 25D in the following manner with a first control signal S31.

The control section CTL11D controls the changeover section 25D such that the first analog signal Vin outputted from the signal production section 21D is inputted to the first outputting section 23 and the third analog signal Vin−Vr/4 is inputted to the second outputting section 24.

If the control section CTL11D receives the digital data 1 from the comparator CMP11-1 and receives the digital data 0 from the comparators CMP11-2 and CMP11-3, then it determines in the following manner. In particular, the control section CTL11D determines that the second comparison result is obtained by the comparator CMP11-1 and the first comparison result is obtained by the comparator CMP11-2.

More particularly, the control section CTL11D decides that $3Vin/4+(Vin-Vr)/4=Vin-Vr/4>0$ is obtained by the comparator CMP11-1 and $Vin/2+(Vin-Vr)/2=Vin-Vr/2<0$ is obtained by the comparator CMP11-2.

Then, the control section CTL11D controls the changeover section 25D in the following manner with a second control signal S32.

In particular, the control section CTL11D controls the changeover section 25D such that the third analog signal Vin−Vr/4 outputted from the signal production section 21D is inputted to the first outputting section 23 and the other third analog signal Vin−Vr/2 is inputted to the second outputting section 24.

If the control section CTL11D receives the digital data 1 from the comparators CMP11-1 and CMP11-2 and receives the digital data 0 from the comparator CMP11-3, then it determines in the following manner. In particular, the control section CTL11D determines that the second comparison result is obtained by the comparator CMP11-2 and the first comparison result is obtained by the comparator CMP11-3.

More particularly, the control section CTL11D determines that $Vin/2+(Vin-Vr)/2=Vin-Vr/2>0$ is obtained by the comparator CMP11-2 and $Vin/4+3(Vin-Vr)/4=Vin-3Vr/4<0$ is obtained by the comparator CMP11-3.

Then, the control section CTL11D controls the changeover section 25D in the following manner with a third control signal S33.

In particular, the control section CTL11D controls the changeover section 25D such that the third analog signal $Vin-Vr/2$ outputted from the signal production section 21D is inputted to the first outputting section 23 and the other third analog signal $Vin-3Vr/4$ is inputted to the second outputting section 24.

If the control section CTL11D receives the digital data 1 from the comparators CMP11-1, CMP11-2 and CMP11-3, then it determines that the second comparison result $Vin/4+3(Vin-Vr)/4=Vin-3Vr/4$ is obtained as a result of the comparison.

Then, the control section CTL11D controls the changeover section 25D in the following manner with a fourth control signal S34.

In particular, the control section CTL11D controls the changeover section 25D such that the third analog signal $Vin-3Vr/4$ outputted from the signal production section 21D is inputted to the first outputting section 23 and the second analog signal $Vin-Vr$ is inputted to the second outputting section 24.

When the second phase signal $\Phi2$ changes from the low level to the high level, the control section CTL11D determines which one of the first to fourth control signals S31 to S34 should be outputted with the active high level.

In the changeover section 25D, three systems of switches are disposed corresponding to the three-system arrangement of the production system of a third analog signal of the signal production section 21D.

A seventh switch SW17-1 is disposed between the input node ND16 of the first outputting section 23 and the third output node ND13-1 of the signal production section 21D.

An eighth switch SW18-1 is disposed between the input node ND17 of the second outputting section 24 and the third output node ND13-1 of the signal production section 21D.

Another seventh switch SW17-2 is disposed between the input node ND16 of the first outputting section 23 and the third output node ND13-2 of the signal production section 21D.

Another eighth switch SW18-2 is disposed between the input node ND17 of the second outputting section 24 and the third output node ND13-2 of the signal production section 21D.

A further seventh switch SW17-3 is disposed between the input node ND16 of the first outputting section 23 and the third output node 13-3 of the signal production section 21D.

A further eighth switch SW18-3 is disposed between the input node ND17 of the second outputting section 24 and the third output node 13-3 of the signal production section 21D.

In the changeover section 25D, the fifth switch SW15 and the eighth switch SW18-1 are changed over between a conducting state and a non-conducting state in response to the first control signal S31 outputted from the comparison section 22D. The fifth switch SW15 and the eighth switch SW18-1 are kept in a conducting state when the first control signal S31 exhibits the active high level, but is kept in a non-conducting state when the first control signal S31 is in the non-active low level.

The seventh switch SW17-1 and the eighth switch SW18-2 are changed over between a conducting state and a non-conducting state in response to the second control signal S32 outputted from the comparison section 22D. The seventh switch SW17-1 and the eighth switch SW18-2 are kept in a conducting state when the second control signal S32 exhibits the active high level, but is kept in a non-conducting state when the second control signal S32 is in the non-active low level.

The seventh switch SW17-2 and the eighth switch SW18-3 are changed over between a conducting state and a non-conducting state in response to the third control signal S33 outputted from the comparison section 22D. The seventh switch SW17-2 and the eighth switch SW18-3 are kept in a conducting state when the third control signal S33 exhibits the active high level, but is kept in a non-conducting state when the third control signal S33 is in the non-active low level.

The sixth switch SW16 and the seventh switch SW17-3 are changed over between a conducting state and a non-conducting state in response to the fourth control signal S34 outputted from the comparison section 22D. The sixth switch SW16 and the seventh switch SW17-3 are kept in a conducting state when the fourth control signal S34 exhibits the active high level, but is kept in a non-conducting state when the fourth control signal S34 is in the non-active low level.

The 2-bit AD converter 10D according to the fifth embodiment described above can achieve similar working effects to those achieved by the 1-bit AD converter 10 according to the first embodiment.

Also the 2-bit AD converter according to the fifth embodiment can be configured such that two analog output signals are provided with a redundant voltage $\alpha$ similarly as in the 1.5-bit AD converter 10C according to the fourth embodiment described hereinabove.

For example, in the case where an output result of the 2-bit AD converter is $Vr/4<Vin<Vr/2$, the two analog output signals are given by $Vin-Vr/4-\alpha$ and $Vin-Vr/2+\alpha$.

<6. Sixth Embodiment>

Figure 15:
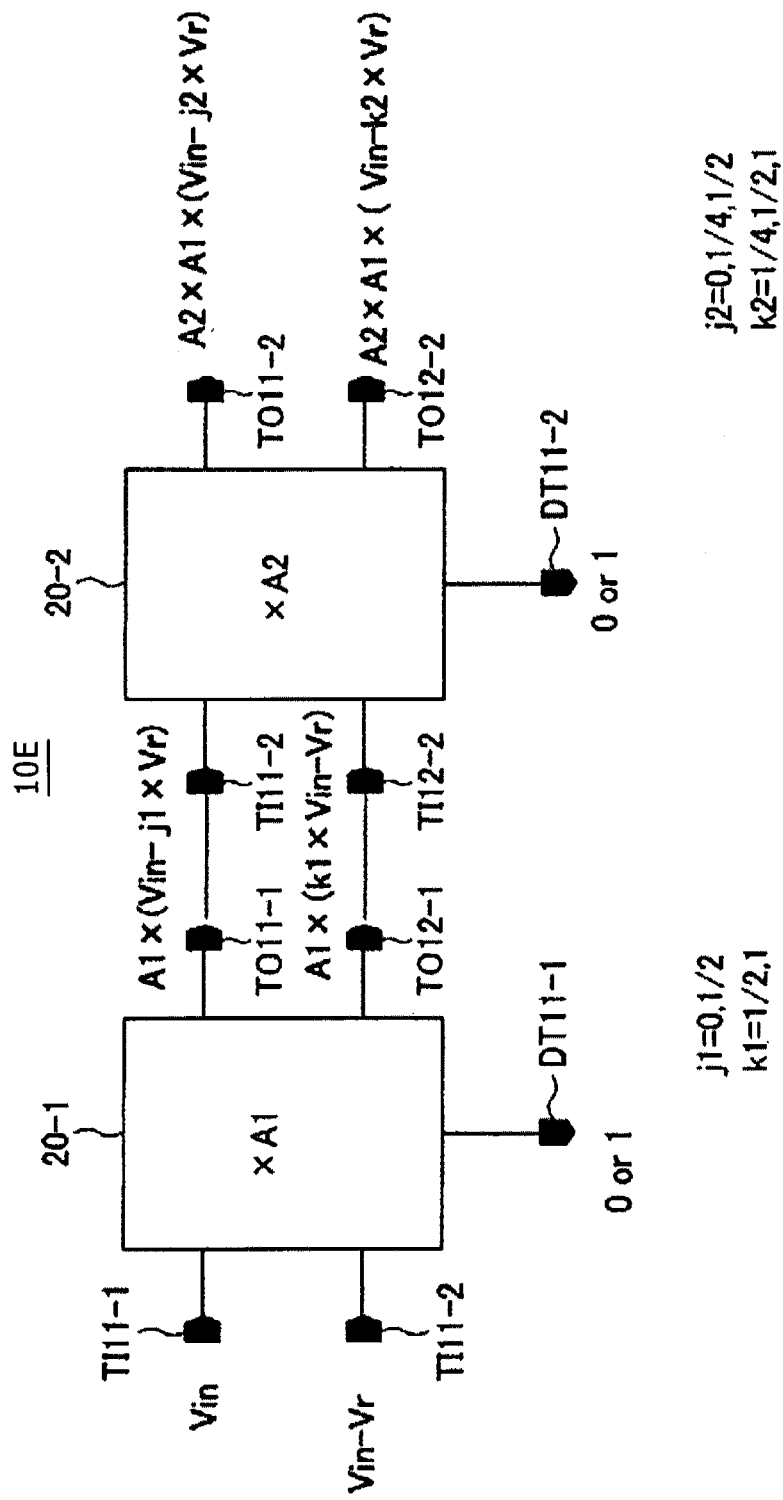
FIG. 15 is a block diagram showing an example of a configuration of a 2-bit AD converter according to a sixth embodiment of the present disclosure.
Figure 16:
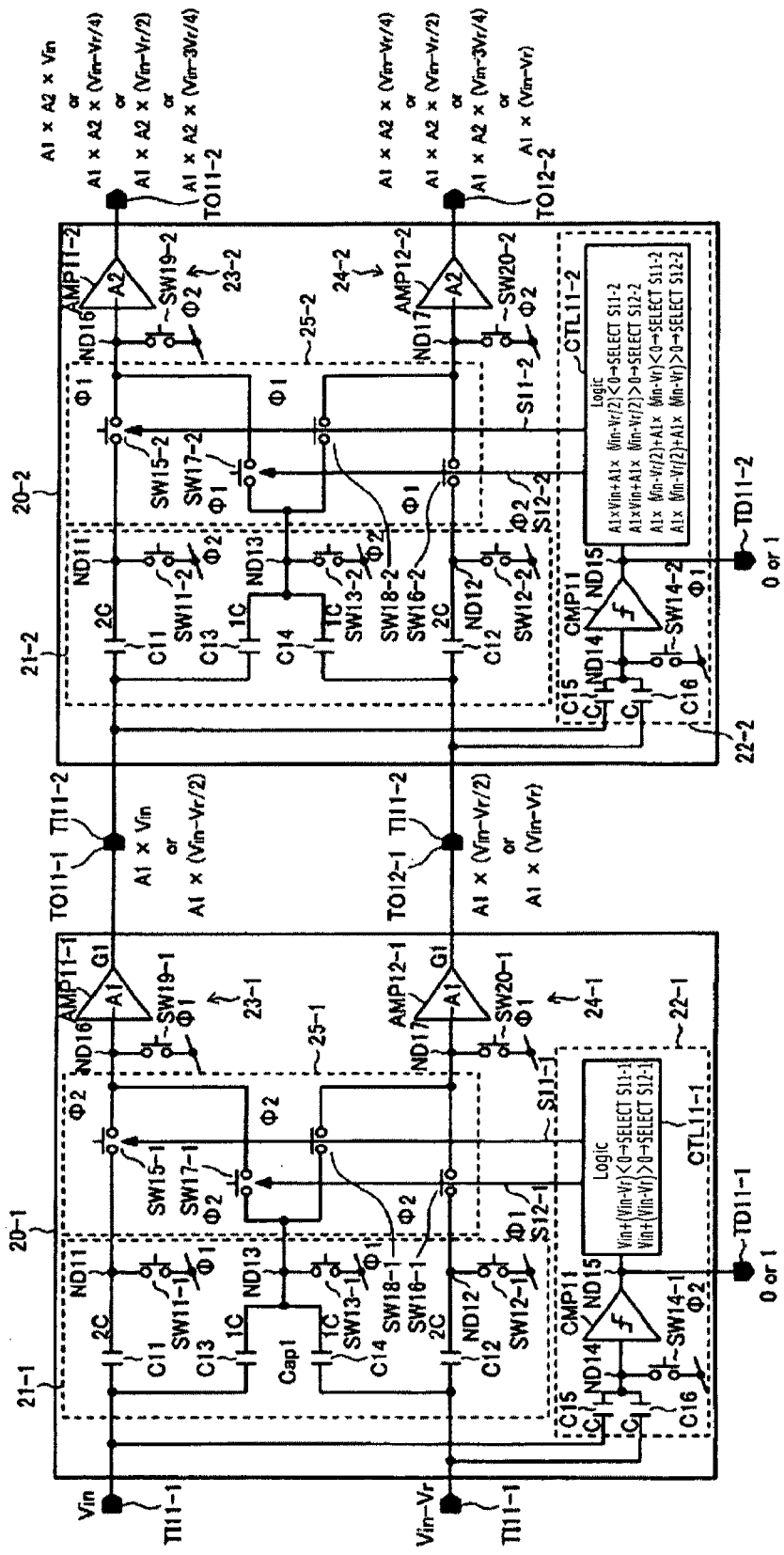
FIG. 16 is a circuit diagram showing an example of a configuration of the 2-bit AD converter of FIG. 15.

FIGS. 15 and 16 show an example of a configuration of a 2-bit AD converter 10E according to a sixth embodiment of the present disclosure.

Referring to FIGS. 15 and 16, the 2-bit AD converter 10E according to the sixth embodiment is configured such that such two 1-bit AD converters as described hereinabove in connection with the first embodiment are connected in cascade connection to form a 2-bit AD converter.

In the present sixth embodiment, the 2-bit AD converter 10E is formed as that of the open loop pipeline type using an open loop amplifier and open loop capacitor arithmetic operation.

In the 2-bit AD converter 10E, an AD conversion stage 20-1 of the first stage has a configuration similar to that of the 1-bit AD converter 10 of the first embodiment and exhibits similar working effects to those of the 1-bit AD converter 10.

An AD conversion stage 20-2 of the second stage has a configuration similar to that of the AD conversion stage 20-1 of the first stage.

However, the amplification factor of amplifiers AMP11-1 and AMP12-1 of first and second outputting sections 23-1 and 24-1 of the AD conversion stage 20-1 of the first stage is set to A1. Meanwhile, the amplification factor of amplifiers AMP11-2 and AMP12-2 of first and second outputting sections 23-2 and 24-2 of the AD conversion stage 20-2 of the second stage is set to A2.

In the 2-bit AD converter 10E, a first analog signal output terminal TO11-1 of the AD conversion stage 20-1 of the first stage is connected to a first analog signal input terminal TI11-2 of the AD conversion stage 20-2 of the second stage.

Similarly, in the 2-bit AD converter 10E, a second analog signal output terminal TO12-1 of the AD conversion stage 20-1 of the first stage is connected to a second analog signal input terminal TI12-2 of the AD conversion stage 20-2 of the second stage.

Accordingly, A1×Vin or A1×(Vin−Vr/2) is inputted as a first analog signal from the first analog signal input terminal TI11-2 to the AD conversion stage 20-2 of the second stage.

Similarly, A1×(Vin−Vr/2) or A1×(Vin−Vr) is inputted as a second analog signal from the second analog signal input terminal TI12-2 to the AD conversion stage 20-2 of the second stage.

Operation of the AD conversion stage 20-1 of the first stage is described hereinabove in detail in the description of the first embodiment, and therefore, overlapping description of the same is omitted herein to avoid redundancy. However, the AD conversion stage 20-1 of the first stage is basically different from the AD conversion stage 20 in the first embodiment in that it exhibits the amplification factor A1 changed from A.

As described above, operation of the AD conversion stage 20-2 of the second stage is basically similar to that of the AD conversion stage 20-1 of the first stage and that of the AD conversion stage 20 in the first embodiment. However, the AD conversion stage 20-2 of the second stage is different in input analog signals and analog signal outputs.

Accordingly, operation of the AD conversion stage 20-2 of the second stage is described below principally in regard to a comparison section 22-2 and two analog signal outputs.

In the comparison section 22-2 of the AD conversion stage 20-2 of the second stage, the fifth capacitor C15 samples the first analog signal A1×Vin or A1×(Vin−Vr/2) which is an input signal when the fourth switch SW14 is in a conducting state. Then, the sampled voltage A1×Vin or A1×(Vin−Vr/2) appears on the input node ND14 side of the comparator CMP11 at a predetermined timing.

The sixth capacitor C16 samples the second analog signal A1×(Vin−Vr/2) or A1×(Vin−Vr) which is an input signal when the fourth switch SW14 is in a conducting state. Then, the sampled voltage A1×(Vin−Vr/2) or A1×(Vin−Vr) appears on the input node ND14 side of the comparator CMP11 at the predetermined timing.

In this manner, the fifth capacitor C15 and the sixth capacitor C16 sample input signals thereto when the fourth switch SW14 is in a conducting state, and then generate the sampled signals on the input node ND14 side of the comparator CMP11 at the predetermined timing. Then, the voltages are synthesized and supplied to the comparator CMP11.

In this instance, the synthesized signal voltage is one of A1×Vin+A1×(Vin−Vr/2) and A1×(Vin−Vr/2)+A1×(Vin−Vr).

In the comparison section 22-2, the comparator CMP11 compares the synthesized signal voltage A1×Vin+A1×(Vin−Vr/2) inputted thereto with 0 V.

If a first result of A1×Vin+A1×(Vin−Vr/2)<0 is obtained, then the comparator CMP11 outputs digital data 0 to a digital data output terminal TD11-2 and a control section CTL11-2 through the output node ND15.

On the other hand, if a second result of A1×Vin+A1×(Vin−Vr/2)>0 is obtained, then the comparator CMP11 outputs digital data 1 to the digital data output terminal TD11-2 and the control section CTL11-2 through the output node ND15.

In the present sixth embodiment, the comparator CMP11 of the AD conversion stage 20-2 of the second stage carries out a comparison operation at a timing at which the second phase signal Φ2 changes over from the high level to the low level.

It is to be noted that, in the present sixth embodiment, the comparator CMP11 of the AD conversion stage 20-1 of the first stage carries out a comparison operation at a timing at which the first phase signal Φ1 changes over from the high level to the low level.

In the present sixth embodiment, since a pipeline process is adopted as hereinafter described, the first phase and the second phase are controlled such that the AD conversion stage 20-1 of the first stage and the AD conversion stage 20-2 of the second stage operate in the opposite phases to each other.

If the control section CTL11-2 receives the digital data 0 from the comparator CMP11, then it determines that the first result A1×Vin+A1×(Vin−Vr/2)<0 is obtained as a result of the comparison. Then, the control section CTL11-2 controls a changeover section 25-2 in the following manner with a first control signal S11-2 and a second control signal S12-2.

The control section CTL11-2 controls the changeover section 25-2 such that the first analog signal A1×Vin outputted from a signal production section 21-2 is inputted to a first outputting section 23-2 and a third analog signal A1×(Vin−Vr/4) outputted from the signal production section 21-2 is inputted to a second outputting section 24-2.

On the other hand, if the control section CTL11-2 receives the digital data 1 from the comparator CMP11, then it determines that the second result A1×Vin+A1×(Vin−Vr/2)>0 is obtained as a result of the comparison. Then, the control section CTL11-2 controls the changeover section 25-2 in the following manner with the first control signal S11-2 and the second control signal S12-2.

The control section CTL11-2 controls the changeover section 25-2 such that the third analog signal A1×(Vin−Vr/4) from the signal production section 21-2 is inputted to the first outputting section 23-2 and the other third analog signal A1×(Vin−Vr/2) is inputted to the second outputting section 24-2.

The control section CTL11-2 determines which one of the first control signal S11-2 and the second control signal S12-2 should be outputted with the active high level when the first phase signal Φ1 changes from the low level to the high level.

On the other hand, the control section CTL11-1 determines which one of a first control signal S11-1 and a second control signal S12-2 should be outputted with the active high level when the second phase signal Φ2 changes from the low level to the high level.

The first outputting section 23-2 amplifies a first residual signal A1×Vin or A1×(Vin−Vr/4) supplied thereto through the changeover section 25-2 with a predetermined amplification factor A2 and outputs a resulting signal from a first analog signal output terminal TO11-2.

In particular, the first outputting section 23-2 outputs the first residual signal A1×A2×Vin or A1×A2×(Vin−Vr/4) from the first analog signal output terminal TO11-2.

The second outputting section 24-2 amplifies a second residual signal A1×(Vin−Vr/4) or A1×(Vin−Vr/2) supplied thereto through the changeover section 25-2 with the predetermined amplification factor A2 and outputs a resulting signal from a second analog signal output terminal TO12-2.

In particular, the second outputting section 24-2 outputs the second residual signal A1×A2×(Vin−Vr/4) or A1×A2×(Vin−Vr/2) from the second analog signal output terminal TO12-2.

Alternatively, in the comparison section 22-2, the comparator CMP11 compares the synthesized signal voltage A1×(Vin−Vr/2)+A1×(Vin−Vr) inputted thereto with 0V.

If a first result of A1×(Vin−Vr/2)+A1×(Vin−Vr)<0 is obtained, then the comparator CMP11 outputs digital data 0 to the digital data output terminal TD11-2 and the control section CTL11-2 through the output node ND15.

On the other hand, if a second result of $A1\times(Vin-Vr/2)+A1\times(Vin-Vr)>0$ is obtained, then the comparator CMP11 outputs digital data 1 to the digital data output terminal TD11-2 and the control section CTL11-2 through the output node ND15.

If the control section CTL11-2 receives the digital data 0 from the comparator CMP11, then it determines that the first result $A1\times(Vin-Vr/2)+A1\times(Vin-Vr)<0$ is obtained as a result of the comparison. Then, the control section CTL11-2 controls the changeover section 25-2 in the following manner with the first control signal S11-2 and the second control signal S12-2.

The control section CTL11-2 controls the changeover section 25-2 such that the first analog signal $A1\times(Vin-Vr/2)$ outputted from the signal production section 21-2 is inputted to the first outputting section 23-2 and the third analog signal $A1\times(Vin-3Vr/4)$ outputted from the signal production section 21-2 is inputted to the second outputting section 24-2.

On the other hand, if the control section CTL11-2 receives the digital data 1 from the comparator CMP11, then it decides that the second result $A1\times(Vin-Vr/2)+A1\times(Vin-Vr)>0$ is obtained as a result of the comparison. Then, the control section CTL11-2 controls the changeover section 25-2 in the following manner with the first control signal S11-2 and the second control signal S12-2.

The control section CTL11-2 controls the changeover section 25-2 such that the third analog signal $A1\times(Vin-3Vr/4)$ from the signal production section 21-2 is inputted to the first outputting section 23-2 and the second analog signal $A1\times(Vin-Vr)$ outputted from the signal production section 21-2 is inputted to the second outputting section 24-2.

The first outputting section 23-2 amplifies a first residual signal $A1\times(Vin-Vr/2)$ or $A1\times(Vin-3Vr/4)$ supplied thereto through the changeover section 25-2 with the predetermined amplification factor A2 and outputs a resulting signal from the first analog signal output terminal TO11-2.

In particular, the first outputting section 23-2 outputs the first residual signal $A1\times A2\times(Vin-Vr/2)$ or $A1\times A2\times(Vin-3Vr/4)$ from the first analog signal output terminal TO11-2.

The second outputting section 24-2 amplifies a second residual signal $A1\times(Vin-3Vr/4)$ or $A1\times(Vin-Vr)$ supplied thereto through the changeover section 25-2 with the predetermined amplification factor A2 and outputs a resulting signal from the second analog signal output terminal TO12-2.

In particular, the second outputting section 24-2 outputs the second residual signal $A1\times A2\times(Vin-3Vr/4)$ or $A1\times A2\times(Vin-Vr)$ from the second analog signal output terminal TO12-2.

This 2-bit AD converter 10E outputs digital data of 2 bits and two analog signals basically depending upon such a condition in magnitude between the first analog signal Vin and a full range voltage Vr which corresponds to the first reference voltage Vrt as described below.

In particular, in the case of Vin<Vr/4, the digital data Φ0 is outputted from the two digital data output terminals TD11-1 and TD11-2.

In the case of Vr/4<Vin<Vr/2, the digital data Φ1 is outputted from the two digital data output terminals TD11-1 and TD11-2.

In the case of Vr/2<Vin<3Vr/4, the digital data 10 is outputted from the two digital data output terminals TD11-1 and TD11-2.

In the case of 3Vr/4<Vin<Vr, the digital data 11 is outputted from the two digital data output terminals TD11-1 and TD11-2.

Further, the 2-bit AD converter 10E outputs residual signals in response to comparison results from the analog signal output terminals TO11-2 and TO12-2.

Residual signals $A1\times Vin$ and $A1\times(Vin-Vr/4)$ are amplified by A2 times and then outputted.

Alternatively, residual signals $A1\times(Vin-Vr/4)$ and $A1\times(Vin-Vr/2)$ are amplified by A2 times and then outputted.

Or else, residual signals $A1\times(Vin-Vr/2)$ and $A1\times(Vin-3Vr/4)$ are amplified by A2 times and then outputted.

Or otherwise, residual signals $A1\times(Vin-3Vr/4)$ and $A1\times(Vin-Vr)$ are amplified by A2 times and then outputted.

For example, when the analog signal input Vin of the AD conversion stage 20-1 of the first stage satisfies 0<Vin<Vr/2, the digital data 0 is outputted from the digital data output terminal TD11-1. Then, the AD conversion stage 20-1 outputs the residual signals $A1\times Vin$ and $A1\times(Vin-Vr/2)$ from the two analog signal output terminals TO11-1 and TO12-1, respectively.

Here, in the case of $A1\times Vin > A1\times(Vin-Vr/2)$, in other words, in the case of Vr/4<Vin<Vr/2, the AD conversion stage 20-2 of the second stage outputs the digital data 1 from the digital data output terminal TD11-2. Then, the AD conversion stage 20-2 outputs residual signals $A2\times A1\times(Vin-Vr/4)$ and $A2\times A1\times(Vin-Vr/2)$ from the two analog signal output terminals TO11-1 and TO12-1, respectively.

In short, the 2-bit AD converter 10E of the two-stage configuration outputs the digital data 01 of 2 bits from the two digital data output terminals TD11-1 and TD11-2.

Further, as described hereinabove, in the present sixth embodiment, since a pipeline process is adopted, the first phase and the second phase of the AD conversion stage 20-1 of the first stage and the AD conversion stage 20-2 of the second stage are controlled such that the AD conversion stages 20-1 and 20-2 operate in the opposite phases to each other.

In the following, this pipeline operation is described.

In the AD converter 10E of FIG. 16, the switches in the signal production section 21-1, first outputting section 23-1 and second outputting section 24-1 in the AD conversion stage 20-1 of the first state are rendered conducting in the first phase so that the signal production section 21-1, first outputting section 23-1 and second outputting section 24-1 carry out sampling and resetting. In the AD conversion stage 20-1 of the first stage, the signal production section 21-1, first outputting section 23-1 and second outputting section 24-1 carry out outputting and inputting of a sampling voltage in the second phase.

Then, in the AD conversion stage 20-1 of the first stage, the comparison section 22-1 and the changeover section 25-1 carry out, in the second phase, comparison determination and supplying control of residual signals to the first outputting section 23-1 and the second outputting section 24-1.

In contrast, in the AD conversion stage 20-2 of the second stage, the switches in the signal production section 21-2, first outputting section 23-2 and second outputting section 24-2 are rendered conducting, in the second phase, so that the signal production section 21-2, first outputting section 23-2 and second outputting section 24-2 carry out sampling and resetting. In the AD conversion stage 20-2 of the second stage, the signal production section 21-2, first outputting section 23-2 and second outputting section 24-2 carry out, in the first phase, outputting and inputting of a sampling voltage.

Then, in the AD conversion stage 20-2 of the second state, the comparison section 22-2 and the changeover section 25-2 carry out, in the first phase, comparison determination and supplying control of residual signals to the first outputting section 23-2 and the second outputting section 24-2.

Figure 17:
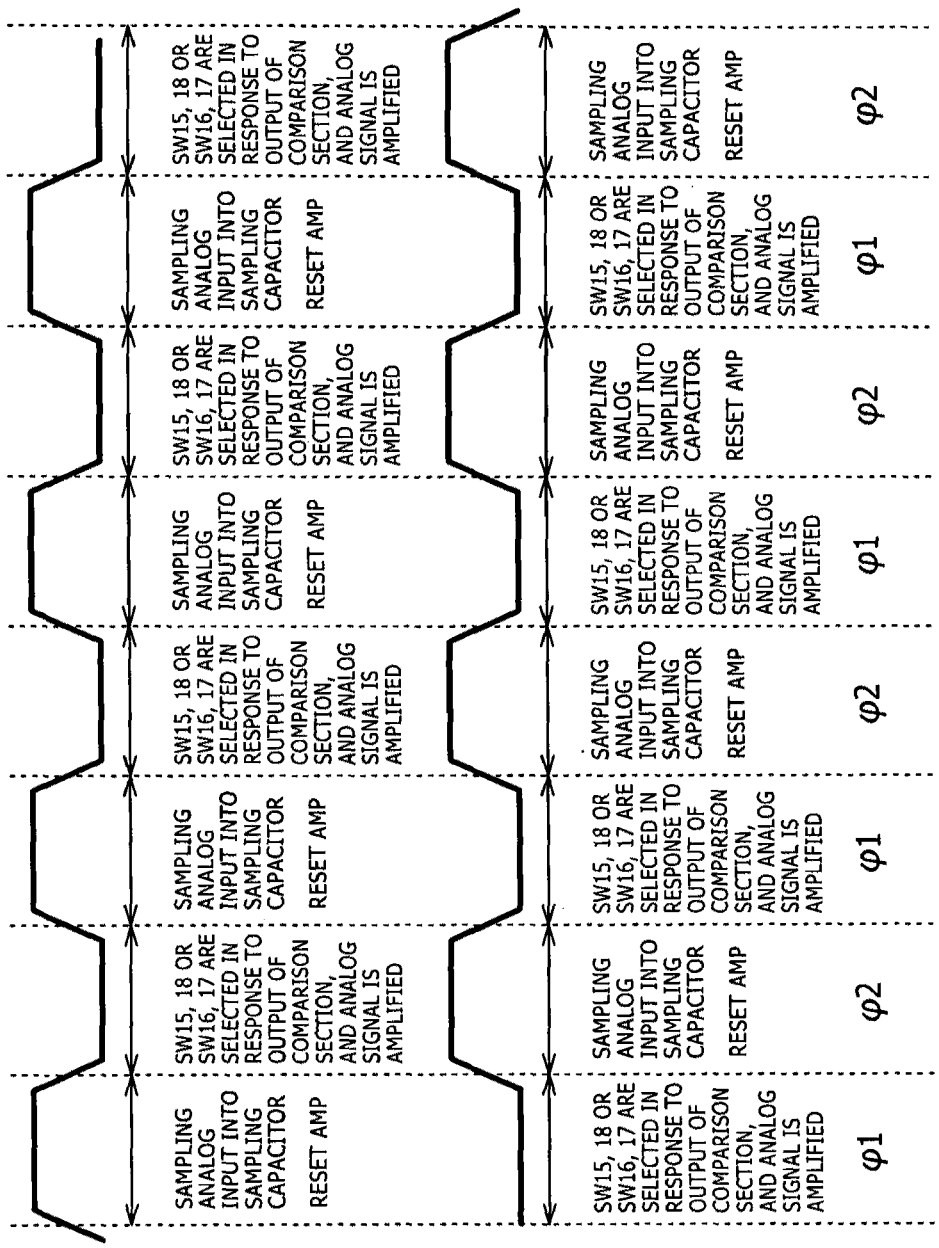
FIGS. 17A and 17B are waveform diagrams illustrating pipeline operation of the 2-bit AD converter of FIG. 15 and particularly illustrating general operation in different phases.

FIGS. 17A and 17B illustrate a pipeline operation of the 2-bit AD converter according to the sixth embodiment and particularly illustrate general operation in the different phases.

More particularly, FIG. 17A illustrates general operation of the AD conversion stage 20-1 of the first stage in the first phase and the second phase.

FIG. 17B illustrates general operation of the AD conversion stage 20-2 of the second stage in the first phase and the second phase.

The pipeline operation of the 2-bit AD converter 10E of FIG. 16 is described with reference to FIGS. 17A and 17B.

When the first phase signal Φ1 exhibits the high level, the first switch SW11-1, second switch SW12-1 and third switch SW13-1 of the signal production section 21-1 in the AD conversion stage 20-1 of the first stage exhibit an ON state. Therefore, the first analog signal Vin and the second analog signal Vin−Vr are sampled by the first to fourth sampling capacitors C11 to C14 which are sampling capacitors.

Further, at this time, since a ninth switch SW19-1 of the first outputting section 23-1 and a tenth switch SW20-1 of the second outputting section 24-1 are switched on, the first amplifier AMP11-1 and the second amplifier AMP12-1 are reset.

The comparator CMP11 of the comparison section 22-1 carries out a comparison operation at a timing at which the first phase signal Φ1 changes over from the high level to the low level. Then, when the second phase signal Φ2 changes to the high level, the control section CTL11-1 decides which one of the control signals S11-1 and S12-1 to control the changeover section 25-1 should be set to the active high level.

When the first phase signal Φ1 exhibits the low level, the analog signals are reset, and therefore, signals sampled into the sampling capacitors are transmitted to the first amplifier AMP11-1 and the second amplifier AMP12-1 through the changeover section 25-1.

At this time, the fifth and eighth switches SW15-1 and SW18-1 or the sixth and seventh switches SW16-1 and SW17-1 selected by the control section CTL11-1 of the comparison section 22-1 are placed into a conducting or ON state.

Consequently, the residual signals A1×Vin and A1×(Vin−Vr/2) or A1×(Vin−Vr/2) and A1×(Vin−Vr) are inputted as first and second analog signals to the 1-bit AD conversion stage 20-2 of the second stage, respectively.

Further, the digital data 0 or 1 is outputted from the AD conversion stage 20-1 of the first stage.

Since the 1-bit AD conversion stage 20-2 of the second stage carries out a switching operation at a timing displaced by 180° in phase from the switching operation of the 1-bit AD conversion stage 20-1 of the first stage, the operation phases of the 1-bit AD conversion stage 20-1 and the 1-bit AD conversion stage 20-2 are opposite to each other.

In particular, when the second phase signal Φ2 exhibits the high level, the first switch SW11-2, second switch SW12-2 and third switch SW13-2 of the signal production section 21-2 in the 1-bit AD conversion stage 20-2 of the second stage are placed into an ON state.

Therefore, the first analog signal A1×Vin or A1×(Vin−Vr/2) and the second analog signal A1×(Vin−Vr/2) or A1×(Vin−Vr) are sampled into the first to fourth sampling capacitors C11 to C14 which are sampling capacitors.

Further, at this time, since the ninth switch SW19-2 of the first outputting section 23-2 and the tenth switch SW20-2 of the second outputting section 24-2 are placed into an ON state, the first amplifier AMP11-2 and the second amplifier AMP12-2 are reset.

The comparator CMP11 of the comparison section 22-2 carries out a comparison operation at a timing at which the second phase signal Φ2 changes over from the high level to the low level. Then, when the first phase signal Φ1 exhibits the high level, the control section CTL11-2 decides which one of the control signals S11-2 and S12-2 for controlling the changeover section 25-2 should be set to the active high level.

When the second phase signal Φ2 exhibits the low level, the analog signals are reset, and therefore, the signals sampled in the sampling capacitors are transmitted to the first amplifier AMP11-2 and the second amplifier AMP12-2 through the changeover section 25-2.

At this time, the fifth and eighth switches SW15-2 and SW18-2 or the sixth and seventh switches SW16-2 and SW17-2 selected by the control section CTL11-2 of the comparison section 22-2 are placed into a conducting or ON state.

Consequently, the residual signals A2×A1×Vin and A2×A1×(Vin−Vr/2) or the residual signals A2×A1×(Vin−Vr/4) and A2×A1×(Vin−Vr/2) are outputted from the AD conversion stage 20-2 of the second stage.

Or, the residual signals A2×A1×(Vin−Vr/2) and A2×A1×(Vin−3Vr/4) or the residual signals A2×A1×(Vin−3Vr/4) and A2×A1×(Vin−Vr) are outputted from the AD conversion stage 20-2 of the second stage.

Or, the digital data 0 or 1 is outputted from the AD conversion stage 20-2 of the second stage.

As described above, according to the present sixth embodiment, such two 1-bit AD conversion stages as in the first embodiment are connected in cascade connection to form the 2-bit AD converter 10E.

Accordingly, effects similar to those achieved by the first embodiment described hereinabove can be achieved.

<7. Seventh Embodiment>

Figure 18:
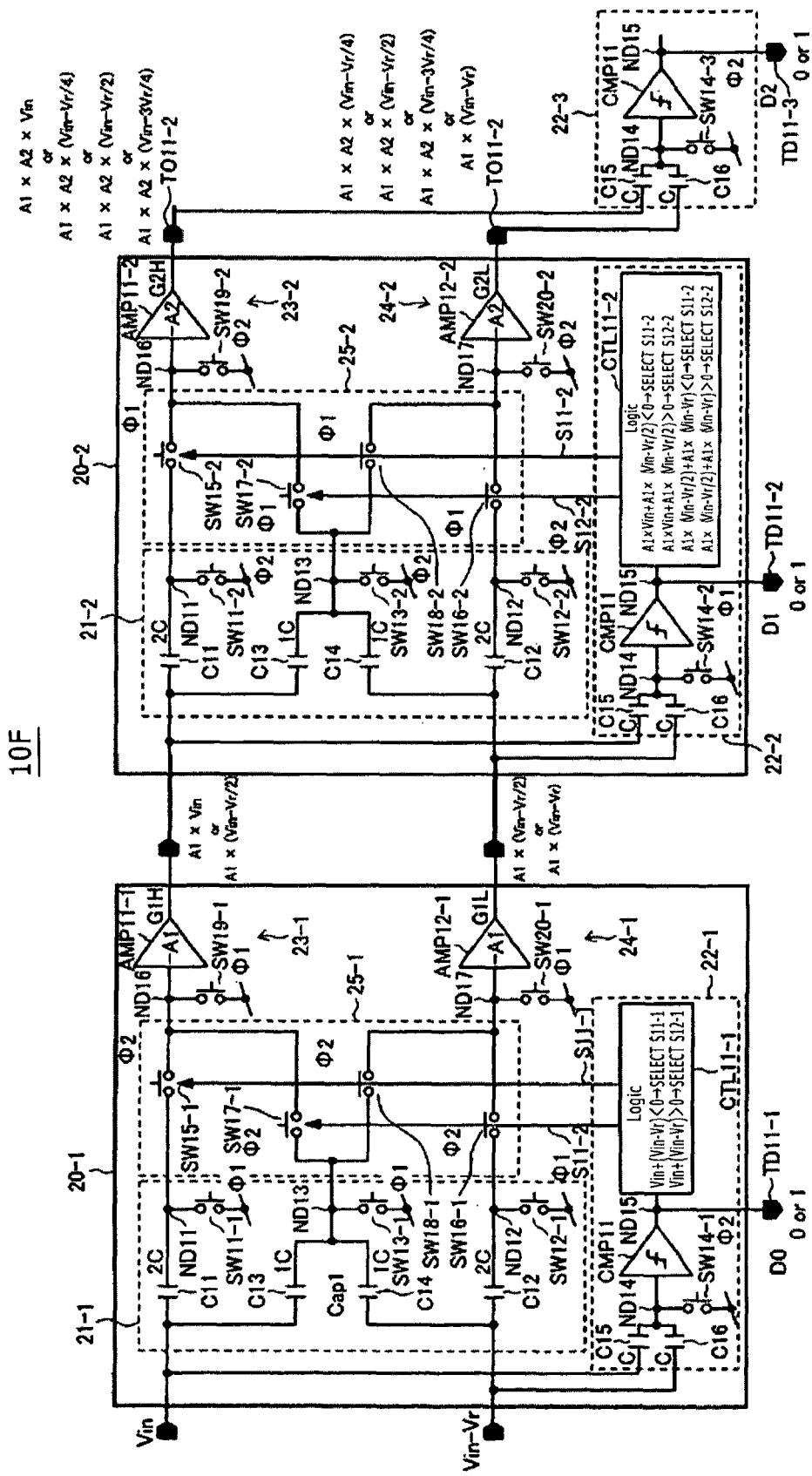
FIG. 18 is a circuit diagram showing an example of a configuration of a 3-bit AD converter according to a seventh embodiment of the present disclosure.

FIG. 18 shows an example of a configuration of a 3-bit AD converter according to a seventh embodiment of the present disclosure.

Referring to FIG. 18, the AD converter 10F according to the seventh embodiment is formed by disposing a comparison section 22-3 of an AD conversion stage on the output side of the AD conversion stage 20-2 of the second stage of the 2-bit AD converter 10E according to the sixth embodiment.

The comparison section 22-3 does not have a control section, and an output of the comparator CMP11 is connected to a digital data output terminal TD11-3.

The comparison section 22-3 operates in the same phase as that of the comparison section 22-1 of the AD conversion stage 20-1 of the first stage and consequently operates in the opposite phase displaced by 180° from that of the comparison section 22-2 of the AD conversion stage 20-2 of the second stage.

In the comparison section 22-3 on the output side of the AD conversion stage 20-2 of the second stage, the fifth capacitor C15 samples the first analog signal which is an input signal when the fourth switch SW14 is in a conducting state.

In particular, the fifth capacitor C15 samples a first analog signal A1×A2×Vin, A1×A2×(Vin−Vr/4), A1×A2×(Vin−Vr/2), or A1×A2×(Vin−3Vr/4).

Then, the sampled voltage A1×A2×Vin, A1×A2×(Vin−Vr/4), A1×A2×(Vin−Vr/2) or A1×A2×(Vin−3Vr/4) appears on the input node ND14 side of the comparator CMP11 at a predetermined timing.

The sixth capacitor C16 samples a second analog signal which is an input signal when the fourth switch SW14 is in a conducting state.

In particular, the sixth capacitor C16 samples a second analog signal A1×A2×(Vin−Vr/4), A1×A2×(Vin−Vr/2), A1×A2×(Vin−3Vr/4) or A1×A2×(Vin−Vr).

Then, the sampled voltage A1×A2×(Vin−Vr/4), A1×A2×(Vin−Vr/2), A1×A2×(Vin−3Vr/4) or A1×A2×(Vin−Vr) appears on the input node ND14 side of the comparator CMP11.

In this manner, the fifth capacitor C15 and the sixth capacitor C16 sample input signals when the fourth switch SW14 is in a conducting state, and generate the sampled voltages on the input node ND14 side of the comparator CMP11 at a predetermined timing. Then, the voltages are synthesized and supplied to the comparator CMP11.

In this instance, the synthesized signal voltage is one of the following voltages.

The first synthesized signal voltage is A1×A2×Vin+A1×A2×(Vin−Vr/4).

The second synthesized signal voltage is A1×A2×(Vin−Vr/4)+A1×A2×(Vin−Vr/2).

The third synthesized signal voltage is A1×A2×(Vin−Vr/2)+A1×A2×(Vin−3Vr/4).

The fourth synthesized signal voltage is A1×A2×(Vin−3Vr/4)+A1×A2×(Vin−Vr).

In the comparison section 22-3, the comparator CMP11 compares a first synthesized signal voltage A1×A2×Vin+A1×A2×(Vin−Vr/4) inputted thereto with 0 V.

If a first comparison result of A1×A2×Vin+A1×A2×(Vin−Vr/4)<0 is obtained, then the comparator CMP11 outputs the digital data 0 to the digital data output terminal TD11-3 through the output node ND15.

If a second comparison result of A1×A2×Vin+A1×A2×(Vin−Vr/4)>0 is obtained, then the comparator CMP11 outputs the digital data 1 to the digital data output terminal TD11-3 through the output node ND15.

Meanwhile, in the comparison section 22-3, the comparator CMP11 compares the second synthesized signal voltage A1×A2×(Vin−Vr/4)+A1×A2×(Vin−Vr/2) inputted thereto with 0 V.

If a first comparison result of A1×A2×(Vin−Vr/4)+A1×A2×(Vin−Vr/2)<0 is obtained, then the comparator CMP11 outputs the digital data 0 to the digital data output terminal TD11-3 through the output node ND15.

If a second comparison result of A1×A2×(Vin−Vr/4)+A1×A2×(Vin−Vr/2)>0 is obtained, then the comparator CMP11 outputs the digital data 1 to the digital data output terminal TD11-3 through the output node ND15.

On the other hand, in the comparison section 22-3, the comparator CMP11 compares the third synthesized signal voltage A1×A2×(Vin−Vr/2)+A1×A2×(Vin−3Vr/4) inputted thereto with 0 V.

If a first comparison result of A1×A2×(Vin−Vr/2)+A1×A2×(Vin−3Vr/4)<0 is obtained, then the comparator CMP11 outputs the digital data 0 to the digital data output terminal TD11-3 through the output node ND15.

If a second comparison result of A1×A2×(Vin−Vr/2)+A1×A2×(Vin−3Vr/4)>0 is obtained, then the comparator CMP11 outputs the digital data 1 to the digital data output terminal TD11-3 through the output node ND15.

Further, in the comparison section 22-3, the comparator CMP11 compares the fourth synthesized signal voltage A1×A2×(Vin−3Vr/4)+A1×A2×(Vin−Vr) inputted thereto with 0 V.

If a first comparison result of A1×A2×(Vin−3Vr/4)+A1×A2×(Vin−Vr)<0 is obtained, then the comparator CMP11 outputs the digital data 0 to the digital data output terminal TD11-3 through the output node ND15.

If a second comparison result of A1×A2×(Vin−3Vr/4)+A1×A2×(Vin−Vr)>0 is obtained, then the comparator CMP11 outputs the digital data 1 to the digital data output terminal TD11-3 through the output node ND15.

With the present seventh embodiment, a 3-bit AD converter can be configured by disposing the comparison section 22-3 of the third stage.

Further, with the seventh embodiment, similar effects to those achieved by the first and sixth embodiment described hereinabove can be achieved.

<8. Eighth Embodiment>

Figure 19:
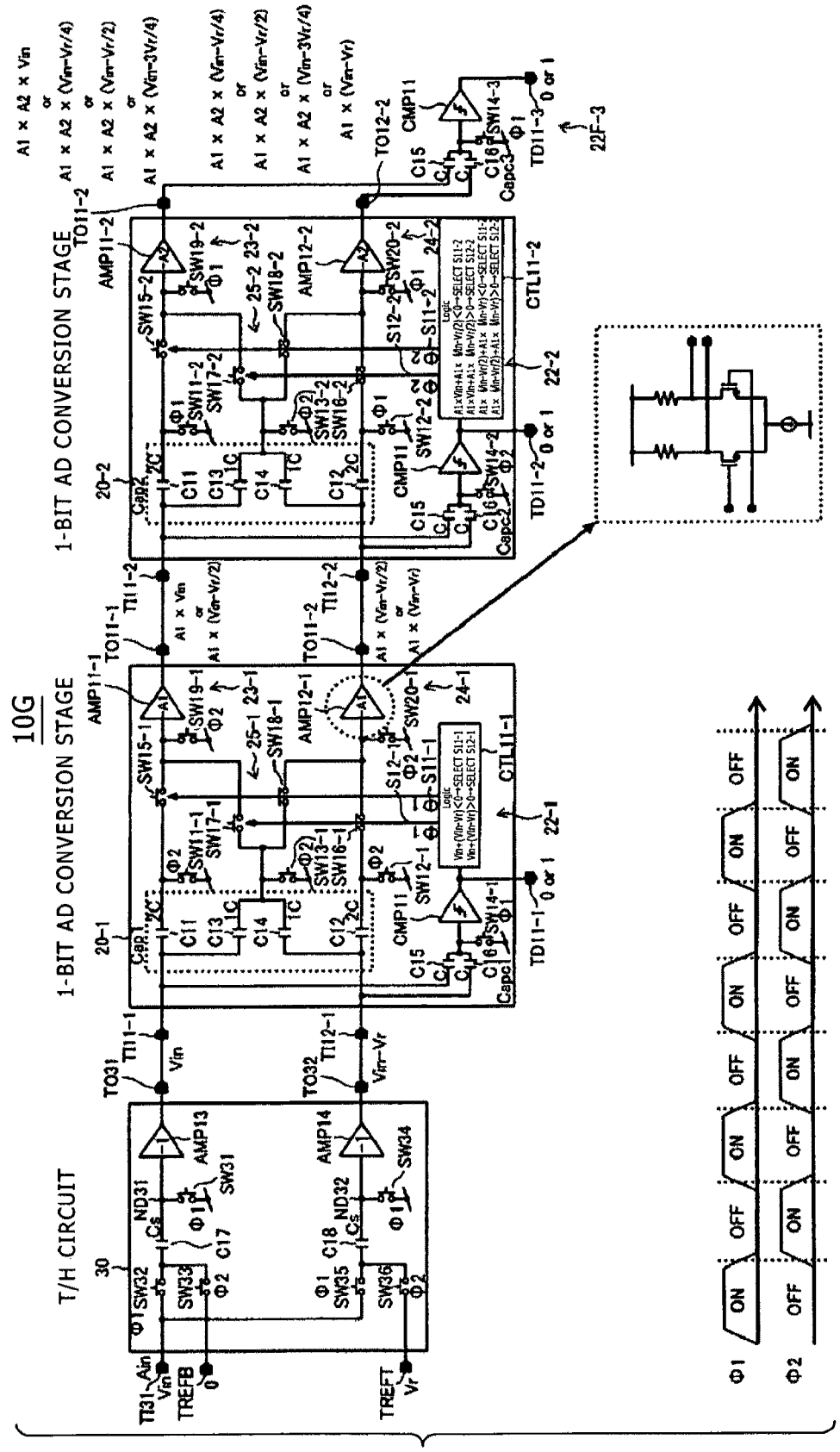
FIG. 19 is a circuit diagram showing an example of a configuration of a 3-bit AD converter according to an eighth embodiment of the present disclosure.

FIG. 19 shows an example of a configuration of a 3-bit AD converter according to an eighth embodiment of the present disclosure.

Referring to FIG. 19, the 3-bit AD converter 10G according to the eighth embodiment is similar to the AD converter 10F according to the seventh embodiment described hereinabove but is different in the following points.

In particular, in the 3-bit AD converter 10G, an analog signal production stage 30 for producing a first analog signal Vin and a second analog signal Vin−Vr is disposed at the input stage of the AD conversion stage 20-1 of the first stage.

This analog signal production stage 30 is formed as a comparison amplification circuit with a T/H (track and hold) function.

The analog signal production stage 30 includes a third amplifier AMP13, a fourth amplifier AMP14, a seventh capacitor C17, and an eighth capacitor C18.

The analog signal production stage 30 further includes an eleventh switch SW31, a twelfth switch SW32, a thirteenth switch SW33, a fourteenth switch SW34, a fifteenth switch SW35, and a sixteenth switch SW36.

The analog signal production stage 30 has a third analog signal input terminal TI31, a second reference voltage supplying terminal TREFB, a first reference voltage supplying terminal TREFT, a third analog signal output terminal TO31, and a fourth analog signal output terminal T032.

The analog signal production stage 30 further has an input node ND31 of the third amplifier AMP13, and an input node ND32 of the fourth amplifier AMP14.

An input terminal of the third amplifier AMP13 is connected to the input node ND31, and an output terminal of the third amplifier AMP13 is connected to the third analog signal output terminal TO31. The eleventh switch SW31 is connected between the input node ND31 and the fixed potential VC.

The seventh capacitor C17 is connected at one terminal thereof to the third analog signal input terminal TI31 through the twelfth switch SW32 and also to the second reference voltage supplying terminal TREFB through the thirteenth switch SW33. The seventh capacitor C17 is connected at the other terminal thereof to the input node ND31 of the third amplifier AMP13.

The fourth amplifier AMP14 is connected at an input terminal thereof to the input node ND32 and at an output terminal thereof to the fourth analog signal output terminal T032. The fourteenth switch SW34 is connected between the input node ND32 and the fixed potential VC.

The eighth capacitor C18 is connected at one terminal thereof to the third analog signal input terminal TI31 through the fifteenth switch SW35 and also to the first reference voltage supplying terminal TREFT through the sixteenth switch SW36. The eighth capacitor C18 is connected at the other terminal thereof to the input node ND32 of the fourth amplifier AMP14.

In the analog signal production stage 30, the eleventh switch SW31, twelfth switch SW32, fourteenth switch SW34, and fifteenth switch SW35 exhibit a conducting or ON state when the first phase signal Φ1 has the active high level.

At this time, the signal production section 21-1 and the first and second outputting sections 23-1 and 24-1 of the AD conversion stage 20-1 of the first stage operate in the second phase, and the comparison section 22-1 and the changeover section 25-1 operate in the first phase.

The signal production section 21-2 and the first and second outputting sections 23-2 and 24-2 of the AD conversion stage 20-2 of the second stage operate in the first phase, and the comparison section 22-2 and the changeover section 25-2 operate in the second phase.

Then, the comparison section 22-3 on the third stage operates in the first phase.

Further, in the analog signal production stage 30, the thirteenth switch SW33 and the sixteenth switch SW36 exhibit a conducting state when the second phase signal Φ2 has the active high level.

Also the AD converter 10G of the eighth embodiment is formed as an open loop pipeline type AD converter using open loop amplification and open loop capacitor arithmetic operation.

Then, as described above, the present AD converter 10G has the analog signal production stage 30 which is a T/H circuit whose input ranges from 0 to Vr in voltage and which produces Vin (value obtained by subtracting 0 from Vin) and Vin−Vr.

Further, two AD conversion stages 20-1 and 20-2 which carry out one-bit conversion for each one stage and output digital data and residual analog signals in response to a result of comparison are connected in series, that is, in cascade connection.

The AD converter 10G of the eighth embodiment is an open loop type pipeline AD converter of a 3-bit resolution configured by further connecting the one-bit comparison section 22-3 to the output of the AD conversion stage 20-2 of the second stage.

Figure 20:
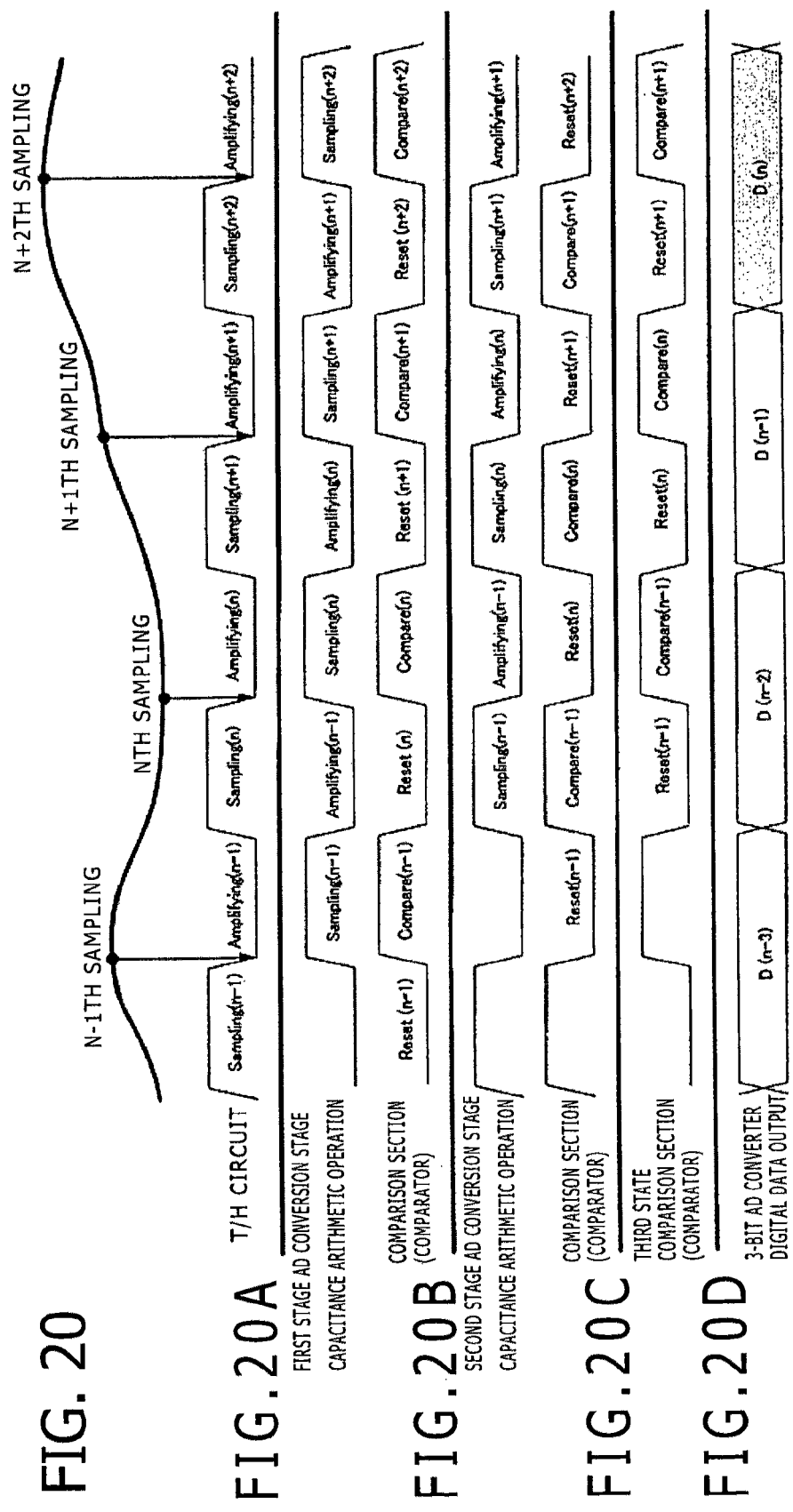
FIG. 20 is a timing chart illustrating general operation of a 3-bit AD converter.

FIG. 20 illustrates general operation of the 3-bit AD converter.

Here, operation of the 3-bit AD converter is described.

When the first phase signal or clock Φ1 has the high level, the eleventh, twelfth, fourteenth and fifteenth switches SW31, SW32, SW34 and SW35 in the signal production stage or T/H circuit 30 exhibit a conducting or ON state.

Consequently, the analog signal production stage 30 samples the nth analog input signal Vi(n) into the seventh and eighth capacitors C17 and C18 (Cs).

When the first phase signal or clock Φ1 has the low level, the eleventh, twelfth, fourteenth and fifteenth switches SW31, SW32, SW34 and SW35 exhibit a non-conducting or OFF state, and the thirteenth and sixteenth switches SW33 and SW36 exhibit a conducting or ON state.

Consequently, the analog signal production stage 30 outputs nth residual analog signals Vin(n)−0=Vin(n) and Vin−Vr (n) from the third analog signal output terminal TO31 and the fourth analog signal output terminal TO32, respectively.

At this time, the first to third switches SW11-1 to SW11-3 of the signal production section 21-1 of the 1-bit AD conversion stage of the first stage exhibit an ON state. Accordingly, the output signals Vin(n) and Vin−Vr(n) from the analog signal production stage 30 are sampled by the first to fourth capacitors C11 to C14.

Concurrently, the fourth switch SW14-1 of the comparison section 22-1 exhibits a non-conducting or OFF state.

Together with this, the comparison section 22-1 arithmetically operates the nth residual analog signals Vin(n) and Vin−Vr(n) through the fifth and sixth capacitors C15 and C16, and the comparator CMP11 compares the residual analog signals Vin(n) and Vin−Vr(n) with each other in magnitude.

Then, when the first phase signal or clock Φ1 comes to exhibit the high level again, the analog signal production stage 30 or T/H circuit samples the n+1th analog signal.

At this time, the first to third switches SW11-1 to SW11-3 of the AD conversion stage 20-1 of the first stage are switched off. Then, a determination of selection of control signals S11-1 and S11-2 is carried out in response to a result of the comparison of the comparator CMP11 of the comparison section 22-1.

In particular, in the case of |Vin(n)|<|Vin(n)−Vr|, the AD conversion stage 20-1 selects the control signal S11-1, and outputs signals A1×Vin and A1×(Vin−Vr/2) from the first amplifier AMP11-1 and the second amplifier AMP12-1, respectively.

Further, at this time, the AD conversion stage 20-1 outputs the digital data 0 from the digital data output terminal TD11-1.

On the other hand, in the AD conversion stage 20-1, in the case of |Vin|>|Vin−Vr|, the comparison section 22-1 selects the control signal S12-1. Consequently, signals A1×(Vin−Vr/2) and A1×(Vin−Vr) are outputted from the first amplifier AMP11-1 and the second amplifier AMP12-1, respectively. Further, at this time, the AD conversion stage 20-1 outputs the digital data 1 from the digital data output terminal TD11-1.

The two analog residual signals outputted from the first and second analog signal output terminals TO11-1 and TO12-1 are sampled into the first to fourth capacitors C11 to C14 of the signal production section 21-2 of the 1-bit AD conversion stage 20-2 of the second stage.

Thereafter, also the AD conversion stage 20-2 of the second stage repeats similar operation to that by the first stage and outputs resulting digital data and analog residual signals.

Finally, the two analog residual signals are compared with each other by the comparison section 22-3, and 3-bit data is outputted from the digital data output terminals TD11-1, TD11-2 and TD11-3.

The eighth embodiment has the following significant characteristics.

The AD conversion stage in each stage carries out comparison with a threshold value produced from two analog input voltages themselves. Also analog residual signals are produced from two analog input signal voltages similarly.

Consequently, in the AD conversion stage or between AD conversion stages connected in series, a portion which requires an accurate absolute value does not exists.

By this configuration, the necessity to strictly control the gain of the amplifiers AMP11 and AMP12 is eliminated, and also capacitor arithmetic operation is carried out by an open loop without using a closed loop.

Therefore, the amplifiers AMP11 and AMP12 in the individual stages can be configured from such a simple differential amplifier as illustrated in FIG. 19 or in FIG. 4.

<9. Ninth Embodiment>

Figure 21:
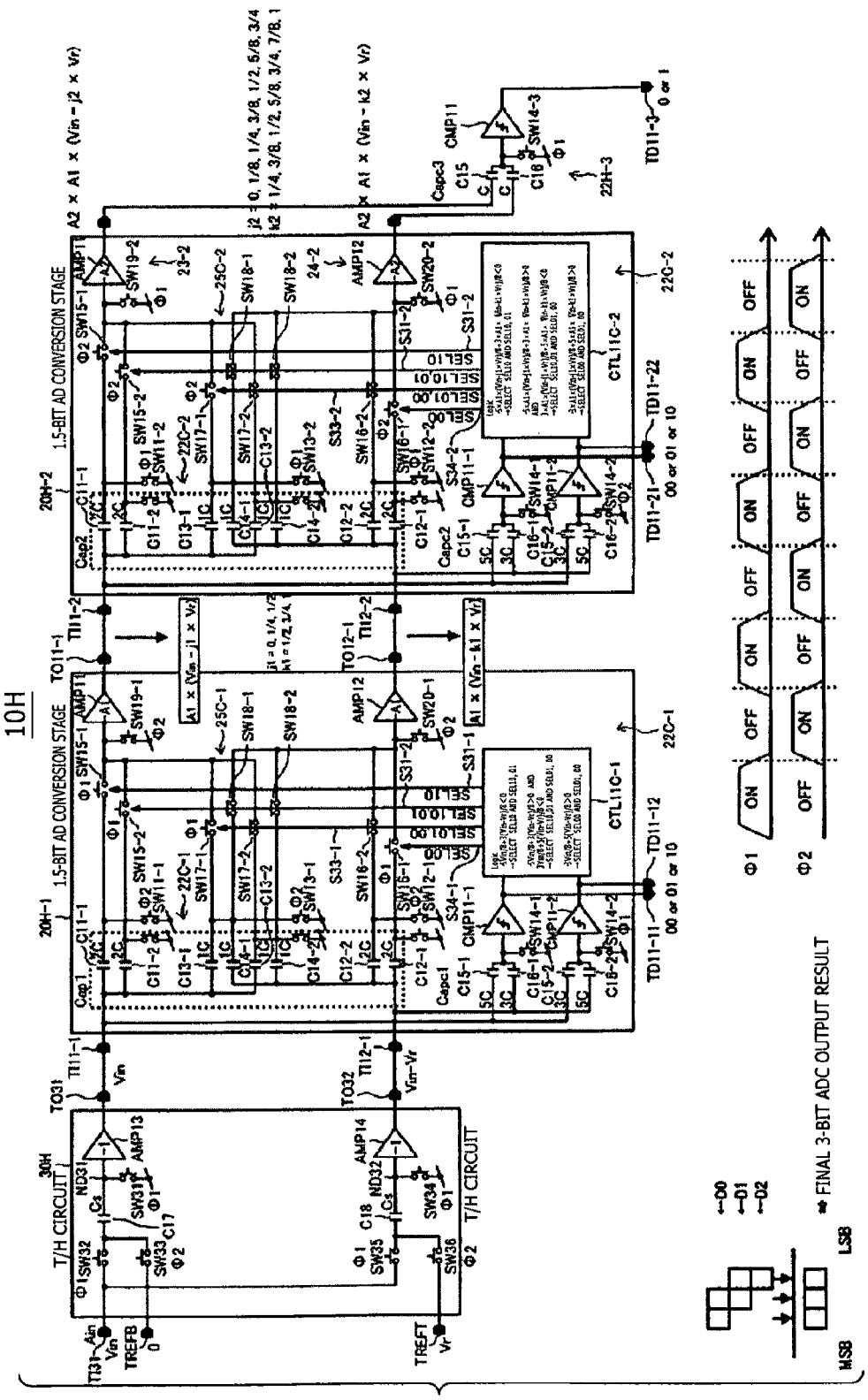
FIG. 21 is a circuit diagram showing an example of a configuration of a 3-bit AD converter according to a ninth embodiment of the present disclosure.

FIG. 21 shows an example of a configuration of a 3-bit AD converter according to a ninth embodiment of the present disclosure.

The AD converter 10H according to the ninth embodiment is similar to the AD converter 10G according to the eighth embodiment described hereinabove but is different in the following points.

In particular, in the AD converter 10H, the 1.5-bit AD converter 10C according to the fourth embodiment having redundancy as described hereinabove with reference to FIG. 12 is applied as AD conversion stages 20G-1 and 20G-2.

Since the configuration and so forth of the 1.5-bit AD converter are described in detail hereinabove in connection with the fourth embodiment, description of them is omitted herein to avoid redundancy.

With the AD converter 10H of the ninth embodiment, similar working effects to those of the AD converter 10G of the eighth embodiment can be achieved. Further, the AD converter 10H allows relaxation in accuracy.

<10. Tenth Embodiment>

Figure 22:
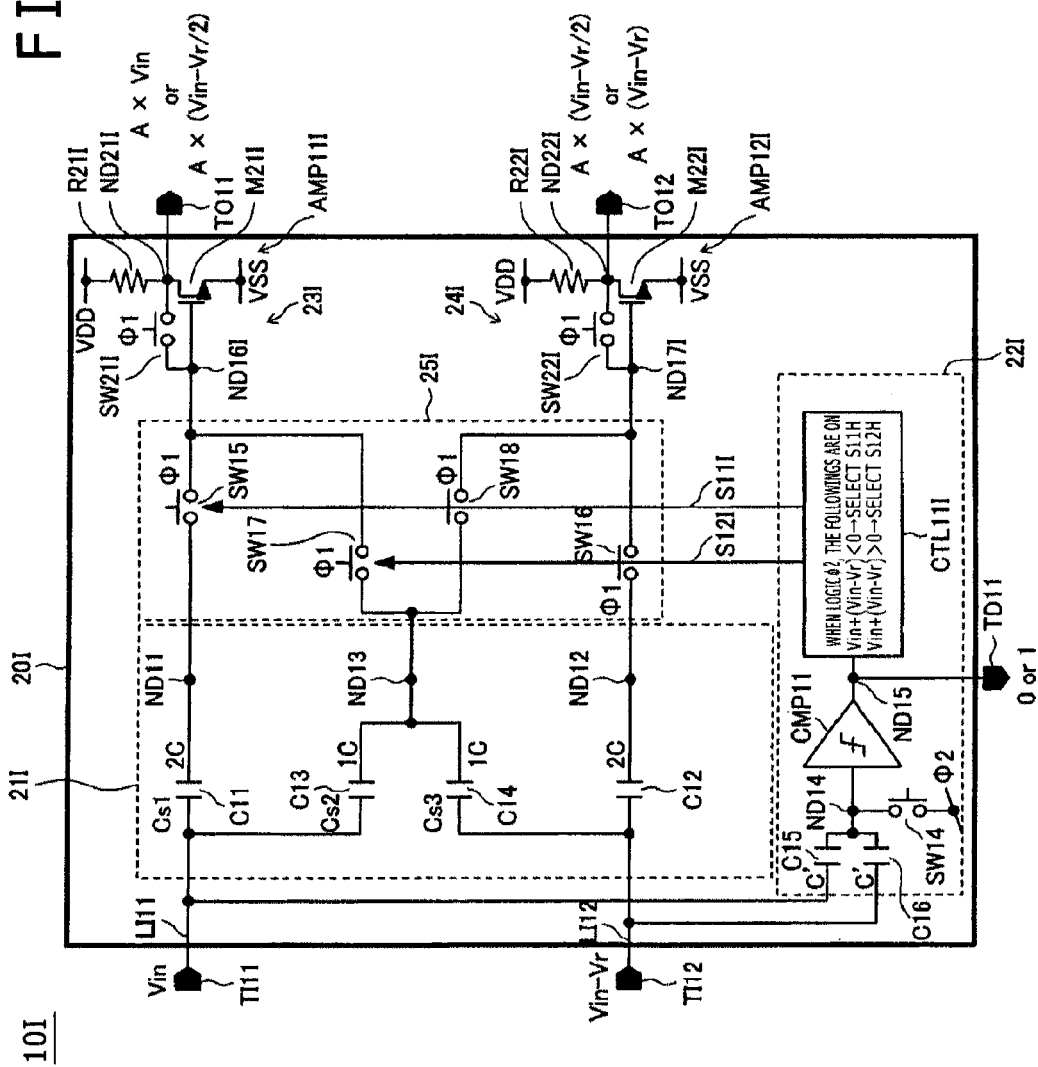
FIG. 22 is a block diagram showing an example of a configuration of a 1-bit AD converter according to a tenth embodiment of the present disclosure.

FIG. 22 shows an example of a configuration of a 1-bit AD converter according to a tenth embodiment of the present disclosure.

Referring to FIG. 22, the 1-bit AD converter 10I according to the tenth embodiment is similar to the 1-bit AD converter 10 according to the first embodiment described hereinabove with reference to FIG. 3 but is different in configuration of a signal production section 21I, a first outputting section 23I and a second outputting section 24I and controlling method of a changeover section 25I by a control section CTL11I.

In the present 1-bit AD converter 10I, the first switch SW11, second switch SW12 and third switch SW13 between the first to third output nodes ND11 to ND13 and the fixed potential VC shown in FIG. 3 are not disposed in the signal production section 21I.

In the first outputting section 23I, a first amplifier AMP11I includes an NMOS transistor M21I, a resistance element R21I, a switch SW21I, an input node ND16I, and an output node ND21I.

The NMOS transistor M21I is connected at the source thereof to a reference potential VSS and at the drain thereof to the output node ND21I. The resistance element R21I is connected at one terminal thereof to a power supply potential VDD and at the other terminal thereof to the output node ND21I, and the output node ND21I is connected to a first analog signal output terminal TO11.

The switch SW21I is connected between the input node ND16I and the output node ND21I. The switch SW21I is kept in a conducting or short-circuiting state within a period within which the first phase signal Φ1 has the high level, but is kept in a non-conducting or open state within a period within which the first phase signal Φ1 has the low level.

In the second outputting section 24I, a second amplifier AMP12I includes an NMOS transistor M22I, a resistance element R22I, a switch SW22I, an input node ND17I, and an output node ND22I.

The NMOS transistor M22I is connected at the source thereof to the reference potential VSS and at the drain thereof to the output node ND22I. The resistance element R22I is connected at one terminal thereof to the power supply potential VDD and at the other terminal thereof to the output node ND22I, and the output node ND22I is connected to a second analog signal output terminal TO12.

The switch SW22I is connected between the input node ND17I and the output node ND22I. The switch SW22I is kept in a conducting or short-circuiting state within a period within which the first phase signal Φ1 has the high level, but is kept in a non-conducting or open state within a period within which the first phase signal Φ1 has the low level.

The control section CTL11I of the comparison section 22I sets two control signals S11I and S12I to the high level in a first phase operation when the first phase signal Φ1 has the high level and the signal production section 21I carries out a sampling operation.

Consequently, in the changeover section 25I, all switches, that is, the fifth switch SW15, eighth switch SW18, sixth switch SW16 and seventh switch SW17 are kept in a conducting state.

At this time, also the switch SW21I of the first outputting section 23I and the switch SW22I of the second outputting section 24I are kept in a conducting state.

Accordingly, the NMOS transistor M21I of the first outputting section 23I and the NMOS transistor M22I of the second outputting section 24I are connected in diode connection wherein the gate and the drain thereof are connected to each other.

Consequently, within a sampling period of an input analog signal of the signal production section 21I, a common voltage is produced by the NMOS transistors M21I and M22I connected in diode connection within a sampling period of an input analog signal of the signal production section 21I.

If the first digital data 0 is received from the comparator CMP11 in a second phase operation wherein the second phase signal Φ2 has the high level, then the control section CTL11I of the comparison section 22I carries out such decision and control as described below.

At this time, the switch SW21I of the first outputting section 223I and the switch SW22I of the second outputting section 24I are kept in a non-conducting state.

Accordingly, the NMOS transistor M21I of the first outputting section 23I and the NMOS transistor M22I of the second outputting section 24I cancel the diode connection state thereof with the gate and the drain thereof disconnected from each other.

If the first digital data 0 is received, then the control section CTL11I decides that the first comparison result of Vin+Vin−Vr<0 is obtained as a result of the comparison, and controls the changeover section 25I in the following manner with a first control signal S11I and a second control signal S12I.

The control section CTL11I keeps the first control signal S11I in the active high level and sets the second control signal S12I to the inactive low level.

Consequently, in the changeover section 25I, the fifth switch SW15 and the eighth switch SW18 are kept in a conducting or ON state while the sixth switch SW16 and the seventh switch SW17 are kept in a non-conducting or OFF state.

Together with this, a first analog signal Vin outputted from the signal production section 21I is inputted to the gate of the NMOS transistor M21I of the first amplifier AMP11I of the first outputting section 23I. Further, a third analog signal Vin−Vr/2 outputted from the signal production section 21I is inputted to the gate of the NMOS transistor M22I of the second amplifier AMP12I of the second outputting section 24I.

The first amplifier AMP11I amplifies the first residual signal Vin supplied thereto through the changeover section 25I based on the transconductance (gm) of the NMOS transistor M21I with a predetermined amplification factor A and outputs a resulting signal A×Vin from the first analog signal output terminal TO11.

The second amplifier AMP12I amplifies the second residual signal Vin−Vr/2 supplied thereto through the changeover section 25I based on the transconductance (gm) of the NMOS transistor M22I with the predetermined amplification factor A and outputs a resulting signal A×(Vin−Vr/2) from the second analog signal output terminal TO12.

If the second digital data 1 is received from the comparator CMP11, then the control section CTL11I carries out such following decision and control as described below.

At this time, the switch SW21I of the first outputting section 23I and the switch SW22I of the second outputting section 24I are kept in a non-conducting state.

Accordingly, the NMOS transistor M21I of the first outputting section 23I and the NMOS transistor M22I of the second outputting section 24I cancel the diode connection state thereof with the gate and the drain thereof disconnected from each other.

The control section CTL11I decides that the second comparison result of Vin+Vin−Vr>0 is obtained as a result of the comparison, and controls the changeover section 25I in the following manner with a first control signal S11I and a second control signal S12I.

The control section CTL11I keeps the second control signal S12I in the active high level state and sets the first control signal Sill to the inactive low level.

Consequently, in the changeover section 25I, the sixth switch SW16 and the seventh switch SW17 are kept in a conducting or ON state while the fifth switch SW15 and the eighth switch SW18 are kept in a non-conducting or OFF state.

Together with this, the third analog signal Vin−Vr/2 outputted from the signal production section 21I is inputted to the gate of the NMOS transistor M21I of the first amplifier AMP11I of the first outputting section 23I.

Further, the second analog signal Vin−Vr outputted from the signal production section 21I is inputted to the gate of the NMOS transistor M22I of the second amplifier AMP12I of the second outputting section 24I.

The first amplifier AMP11I amplifies the first residual signal Vin−Vr/2 supplied thereto through the changeover section 25I with a predetermined amplification factor A by the transconductance (gm) of the NMOS transistor M21I and outputs a resulting signal A×(Vin−Vr/2) from the first analog signal output terminal TO11.

The second amplifier AMP12I amplifies the second residual signal Vin−Vr supplied thereto through the changeover section 25I with the predetermined amplification factor A by the transconductance (gm) of the NMOS transistor M22I and outputs a resulting signal A×(Vin−Vr) from the second analog signal output terminal TO12.

With the present tenth embodiment, effects similar to those active by the first embodiment described hereinabove can be achieved.

<11. Eleventh Embodiment>

Figure 23:
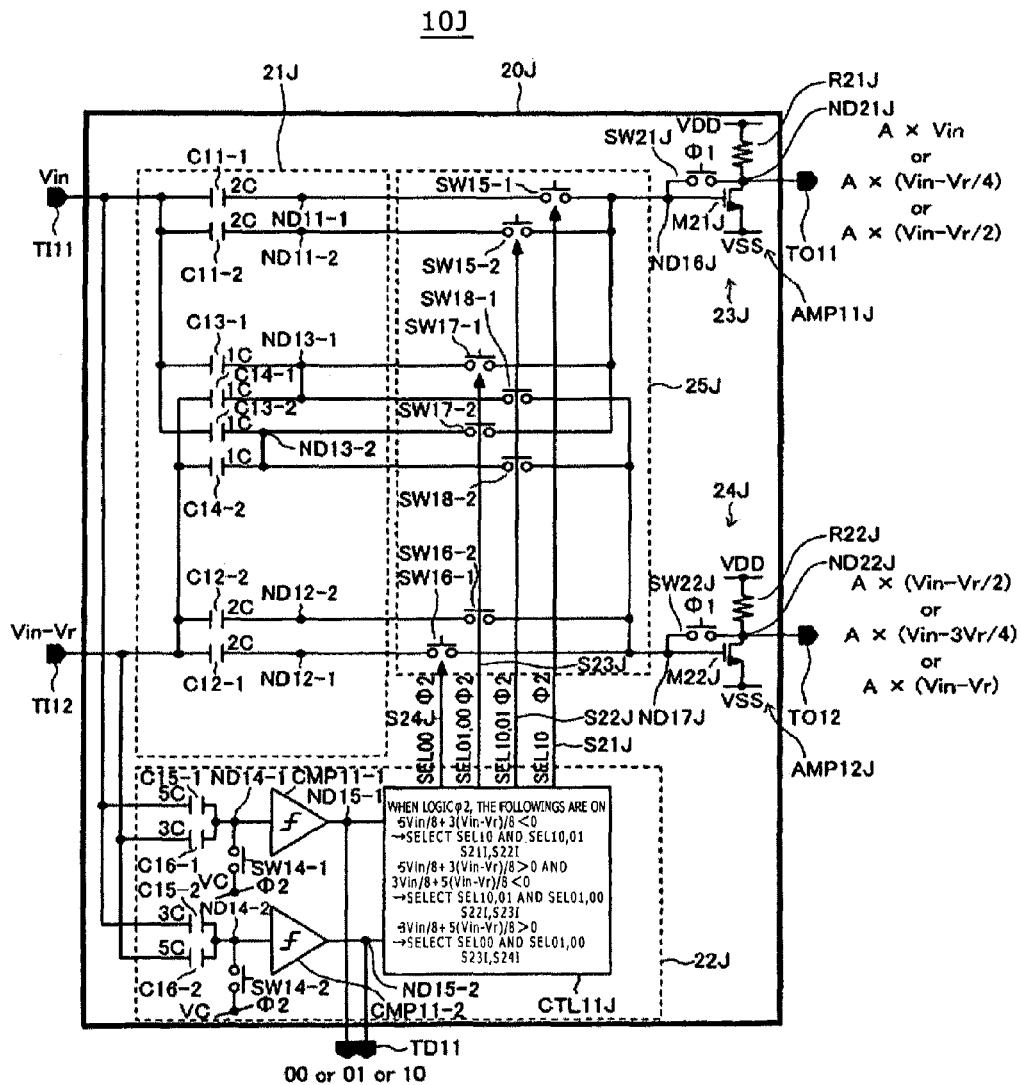
FIG. 23 is a block diagram, showing an example of a configuration of a 1.5-bit AD converter according to an eleventh embodiment of the present disclosure.

FIG. 23 shows an example of a configuration of a 1.5-bit AD converter according to the eleventh embodiment of the present disclosure.

The 1.5-bit AD converter 10J according to the eleventh embodiment is similar to the 1-bit AD converter 10C according to the fourth embodiment described hereinabove with reference to FIG. 12 but is different in the following points.

In particular, the 1.5-bit AD converter 10J is different from the 1.5-bit AD converter 10C according to the fourth embodiment shown in FIG. 12 in configuration of a signal production section 21J, a first outputting section 23J and a second outputting section 24J and controlling method of a changeover section 25J by a control section CTL11J.

In the present 1.5-bit AD converter 10J, the switches SW between the first to third output, nodes ND11 to ND13 and the fixed potential VC shown in FIG. 12 are not disposed in the signal production section 21J.

In particular, the first switch SW11-1 and SW11-2, second switch SW12-1 and SW12-2 and third switch SW13-1 and SW13-2 are not disposed in the signal production section 21J.

In the first outputting section 23J, a first amplifier AMP11J includes an NMOS transistor M21J, a resistance element R21J, a switch SW21J, an input node ND16J and an output node ND21J.

The NMOS transistor M21J is connected at the source thereof to the reference potential VSS and at the drain thereof to the output node ND21J. The resistance element R21J is connected at one terminal thereof to the power supply potential VDD and at the other terminal thereof to the output node ND21J, and the output node ND21J is connected to the first analog signal output terminal TO11.

The switch SW21J is connected between the input node ND16J and the output node ND21J. The switch SW21J is kept in a conducting or short-circuiting state within a period within which the first phase signal Φ1 exhibits the high level, but is kept in a non-conducting or open state within another period within which the first phase signal Φ1 exhibits the low level.

In the second outputting section 24J, a second amplifier AMP12J includes an NMOS transistor M22J, a resistance element R22J, a switch SW22J, an input node ND17J and an output node ND22J.

The NMOS transistor M22J is connected at the source thereof to the reference potential VSS and at the drain thereof to the output node ND22J. The resistance element R22J is connected at one terminal thereof to the power supply potential VDD and at the other terminal thereof the output node ND22J, and the output node ND22J is connected to the second analog signal output terminal TO12.

The switch SW22J is connected between the input node ND17J and the output node ND22J. The switch SW22J is kept in a conducting or short-circuiting state within a period within which the first phase signal Φ1 exhibits the high level, but is kept in a non-conducting or open state within another period within which the first phase signal Φ1 exhibits the low level.

The control section CTL11J of a comparison section 22J sets four first to fourth control signals S21J to S24J to the high level in a first phase operation in which the first phase signal Φ1 has the high level and the signal production section 21J carries out a sampling operation.

Consequently, all switches in the changeover section 25J are kept in a conducting state.

In particular, in the changeover section 25J, the fifth switches SW15-1 and SW15-2, eighth switches SW18-1 and SW18-2, sixth switches SW16-1 and SW16-2 and seventh switches SW17-1 and SW17-2 are kept in the conducting state.

At this time, also the switch SW21J of the first outputting section 23J and the switch SW22J of the second outputting section 24J are kept in a conducting state.

Accordingly, the NMOS transistor M21J of the first outputting section 23J and the NMOS transistor M22J of the second outputting section 24J are connected in diode condition wherein the gate and the drain thereof are connected to each other.

Consequently, within a sampling period of an input analog signal of the signal production section 21J, a common voltage is produced by the NMOS transistors M21J and M22J which are connected in diode connection.

If the first digital data 0 is received from the comparators CMP11-1 and CMP11-2 in a second phase operation in which the second phase signal Φ2 has the high level, then the control section CTL11J of the comparison section 22J carries out such decision and control as described below.

At this time, the switch SW21J of the first outputting section 23J and the switch SW22J of the second outputting section 24J are kept in a non-conducting state.

Accordingly, the NMOS transistor M21J of the first outputting section 23J and the NMOS transistor M22J of the second outputting section 24J cancel the diode connection state thereof with the gate and the drain thereof disconnected from each other.

If the first digital data 0 is received from the comparators CMP11-1 and CMP11-2, then the control section CTL11J decides that the first comparison result of $5Vin/8+3(Vin-Vr)/8(=Vin-3Vr/8)<0$ is obtained.

Then, the control section CTL11J controls the changeover section 25J in the following manner with the first to fourth control signals S21J to S24J.

In particular, the control section CTL11J keeps the first control signal S21J and the second control signal S22J in the high level state and sets the third control signal S23J and the fourth control signal S24 to the inactive low level.

Consequently, in the changeover section 25J, the fifth switches SW15-1 and SW15-2 and the eighth switches SW18-1 and SW18-2 are kept in a conducting or ON state. Meanwhile, in the changeover section 25J, the sixth switches SW16-1 and SW16-2 and the seventh switches SW17-1 and SW17-2 are kept in a non-conducting or OFF state.

Together with this, the first analog signal Vin outputted from the signal production section 21J is inputted to the gate of the NMOS transistor M21J of the first amplifier AMP11J of the first outputting section 23J. Further, the third analog signal Vin−Vr/2 outputted from the signal production section 21J is inputted to the gate of NMOS transistor M22J of the second amplifier AMP12J of the second outputting section 24J.

The first amplifier AMP11J amplifies the first residual signal Vin supplied thereto through the changeover section 25J with a predetermined amplification factor A by the transconductance (gm) of the NMOS transistor M21J and outputs a resulting signal A×Vin from the first analog signal output terminal TO11.

The second amplifier AMP12J amplifies the second residual signal Vin−Vr/2 supplied thereto through the changeover section 25J with the predetermined amplification factor A by the transconductance (gm) of the NMOS transistor M22J and outputs a resulting signal A×(Vin−Vr/2) from the second analog signal output terminal TO12.

If the control section CTL11J receives the second digital data from the comparator CMP11-1 and receives the first digital data 0 from the comparator CMP11-2, then it carries out the following decision and control.

At this time, the switch SW21J of the first outputting section 23J and the switch SW22J or the second outputting section 24J are kept in a non-conducting state.

Accordingly, the NMOS transistor M21J of the first outputting section 23J and the NMOS transistor M22J of the second outputting section 24J cancel the diode connection state thereof with the gate and the drain thereof disconnected from each other.

The control section CTL11J decides that the second comparison result is obtained by the comparator CMP11-1 and the first comparison result is obtained by the comparator CMP11-2.

More particularly, the control section CTL11J decides that $5Vin/8+3(Vin-Vr)/8(=Vin-3Vr/8)>0$ is obtained by the comparator CMP11-1 and $3Vin/8+5(Vin-Vr)/8(=Vin-5Vr/8)<0$ is obtained by the comparator CMP11-2.

Then, the control section CTL11J controls the changeover section 25J in the following manner with the first to fourth control signals S21J to S24J.

The control section CTL11J keeps the second control signal S22J and the third control signal S23J in the high level state and sets the first control signal S21J and the fourth control signal S24J to the inactive low level.

Consequently, in the changeover section 25J, the fifth switch SW15-2, eighth switches SW18-1 and SW18-2, seventh switches SW17-1 and SW17-2 and sixth switch SW16-2 are kept in a conducting or ON state. Meanwhile, in the changeover section 25J, the fifth switch SW15-1 and the sixth switch SW16-1 are kept in anon-conducting or OFF state.

Together with this, the third analog signal Vin−Vr/4 outputted from the signal production section 21J is inputted to the gate of the NMOS transistor M21J of the first amplifier AMP11J of the first outputting section 23J. Further, the third analog signal Vin−3Vr/4 outputted from the signal production section 21J is inputted to the gate of the NMOS transistor M22J of the second amplifier AMP12J of the second outputting section 24J.

The first amplifier AMP11J amplifies the first residual signal Vin−Vr/4 supplied thereto through the changeover section 25J with the predetermined amplification factor A by the transconductance (gm) of the NMOS transistor M21J. Then, the first amplifier AMP11J outputs a resulting signal A×(Vin−Vr/4) from the first analog signal output terminal TO11.

The second amplifier AMP12J amplifies the second residual signal Vin−3Vr/4 supplied thereto through the changeover section 25J with the predetermined amplification factor A by the transconductance (gm) of the NMOS transistor M22J. Then, the second amplifier AMP12J outputs a resulting signal A×(Vin−3Vr/4) from the second analog signal output terminal TO12.

If the control section CTL11J receives the second digital data 1 from the comparators CMP11-1 and CMP11-2, then it carries out such decision and control as described below.

At this time, the switch SW21J of the first outputting section 23J and the switch SW22J of the second outputting section 24J are kept in a non-conducting state.

Accordingly, the NMOS transistor M21J of the first outputting section 23J and the NMOS transistor M22J of the second outputting section 24J are placed out of a diode connection state so that the gate and the drain thereof are disconnected from each other.

the control section CTL11J decides that the second comparison result $3Vin/8+5(Vin-Vr)/8(=Vin-5Vr/8)>0$ is obtained by the comparator CMP11-2.

Then, the control section CTL11J controls the changeover section 25J in the following manner with the first to fourth control signals S21J to S24J.

In particular, the control section CTL11J keeps the third control signal S23J and the fourth control signal S24J in the high level state and sets the first control signal S21J and the second control signal S22J to the inactive low level state.

Consequently, in the changeover section 25J, the seventh switches SW17-1 and SW17-2 and the sixth switches SW16-1 and SW16-2 are kept in a conducting or ON state. On the other hand, the fifth switches SW15-1 and SW15-2 and the eighth switches SW18-1 and SW18-2 are kept in a non-conducting or OFF state.

Together with this, the third analog signal Vin−Vr/2 outputted from the signal production section 21J is inputted to the gate of the NMOS transistor M21J of the first amplifier AMP11J of the first outputting section 23J. Meanwhile, the second analog signal Vin−Vr outputted from the signal production section 21J is inputted to the gate of the NMOS transistor M22J of the second amplifier AMP12J of the second outputting section 24J.

The first amplifier AMP11J amplifies the first residual signal Vin−Vr/2 supplied thereto through the changeover section 25J with the predetermined amplification factor A by the transconductance (gm) of the NMOS transistor M21J. Then, the first amplifier AMP11J outputs a resulting signal A×(Vin−Vr/2) from the first analog signal output terminal TO11.

The second amplifier AMP12J amplifies the second residual signal Vin−Vr supplied thereto through the changeover section 25J with the predetermined amplification factor A by the transconductance (gm) of the NMOS transistor M22J. Then, the second amplifier AMP12J outputs a resulting signal A×(Vin−Vr) from the second analog signal output terminal TO12.

With the present eleventh embodiment, similar effects to those of the fourth embodiment described hereinabove can be achieved.

<12. Twelfth Embodiment>

Figure 24:
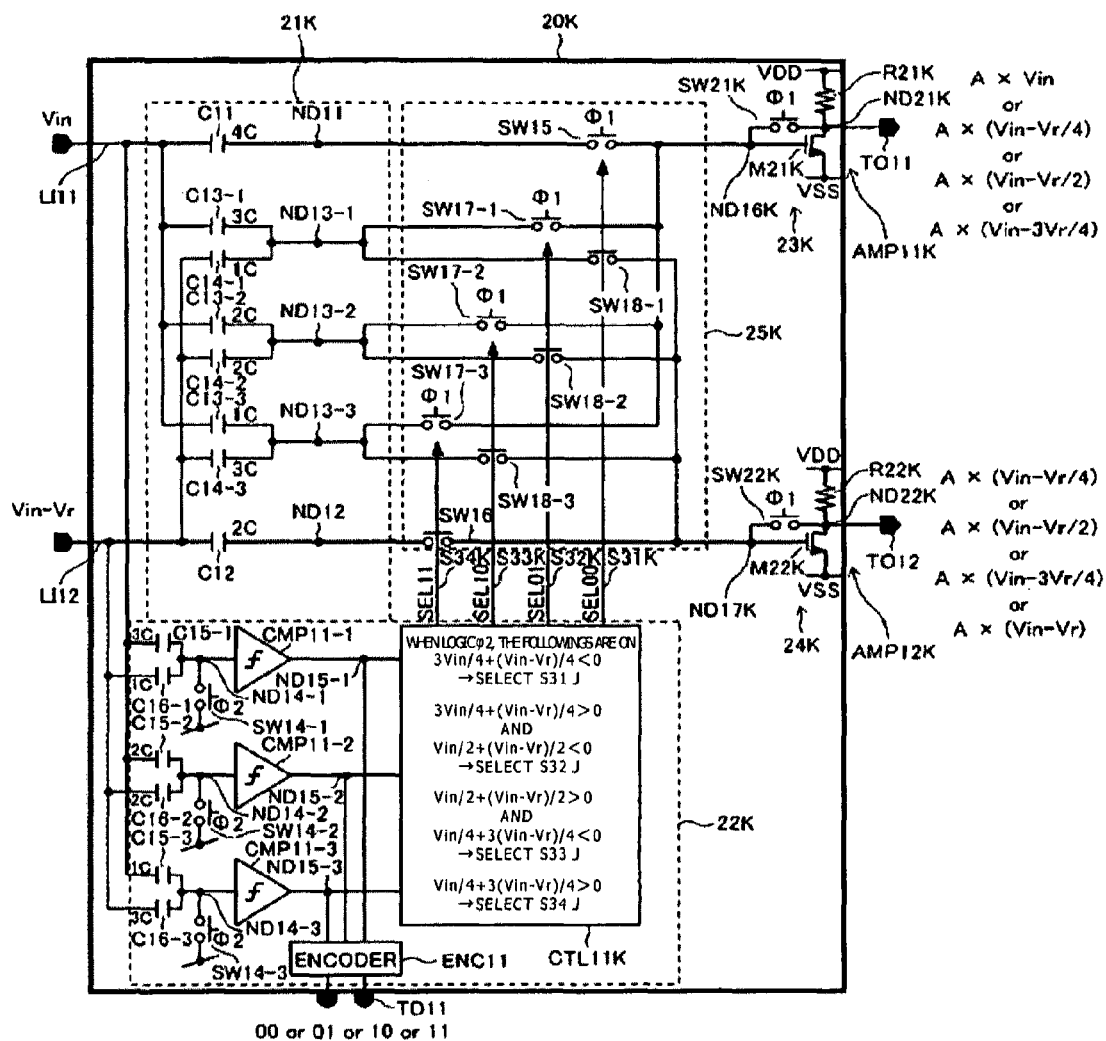
FIG. 24 is a block diagram showing an example of a configuration of a 2-bit AD converter according to a twelfth embodiment of the present disclosure.

FIG. 24 shows an example of a configuration of a 2-bit AD converter according to a twelfth embodiment of the present disclosure.

Referring to FIG. 24, the 2-bit AD converter 10K according to the twelfth embodiment is similar to the 2-bit AD converter 10D according to the fifth embodiment described hereinabove with reference to FIG. 14 but is different in the following points.

In particular, the 2-bit AD converter 10K is different from the 2-bit AD converter 10D according to the fifth embodiment shown in FIG. 14 in configuration of a signal production section 21K, a first outputting section 23K and a second outputting section 24K and control method of a changeover section 25K by a control section CTL11K.

In the present 2-bit AD converter 10K, the switches SW between the first to third output nodes ND11 to ND13 and the fixed potential VC shown in FIG. 14 are not disposed in the signal production section 21K.

In particular, the signal production section 21K does not include any of the first switch SW11, second switch SW12 and third switches SW13-1, SW13-2 and SW13-3 disposed therein.

In the first outputting section 23K, a first amplifier AMP11K includes an NMOS transistor M21K, a resistance element R21K, a switch SW21K, an input node ND16K, and an output node ND21K.

The NMOS transistor M21K is connected at the source thereof to the reference potential VSS and at the drain thereof to the output node ND21K. The resistance element R21K is connected at one terminal thereof to the power supply potential VDD and at the other terminal thereof to the output node ND21K. The output node ND21K is connected to the first analog signal output terminal TO11.

The switch SW21K is connected between the input node ND16K and the output node ND21K. The switch SW21K is kept in a conducting or short-circuiting state within a period within which the first phase signal Φ1 has the high level, but is kept in a non-conducting or open state within a period within which the first phase signal Φ1 has the low level.

In the second outputting section 24K, a second amplifier AMP12K includes an NMOS transistor M22K, a resistance element R22K, a switch SW22K, an input node ND17K, and an output node ND22K.

The NMOS transistor M22K is connected at the source thereof to the reference potential VSS and at the drain thereof to the output node ND22K. The resistance element R22K is connected at one terminal thereof to the power supply potential VDD and at the other terminal thereof to the output node ND22K. The output node ND22K is connected to the second analog signal output terminal TO12.

The switch SW22K is connected between the input node ND17K and the output node ND22K. The switch SW22K is kept in a conducting or short-circuiting state within a period within which the first phase signal Φ1 has the high level, but is kept in a non-conducting or open state within a period within which the first phase signal Φ1 has the low level.

The control section CTL11K of a comparison section 22K sets four first to fourth control signals S31K to S34K to the high level in a first phase operation in which the first phase signal Φ1 has the high level and the signal production section 21K carries out a sampling operation.

Consequently, all switches in the changeover section 25K are kept in a conducting state.

In particular, in the changeover section 25K, the fifth switch SW15, sixth switch SW16, seventh switches SW17-1, SW17-2 and SW17-3 and eighth switches SW18-1, SW18-2 and SW18-3 are kept in a conducting state.

At this time, also the switch SW21K of the first outputting section 23K and the switch SW22K of the second outputting section 24K are kept in a conducting state.

Accordingly, the NMOS transistor M21K of the first outputting section 23K and the NMOS transistor M22K of the second outputting section 24K are connected in diode connection in which the gate and the drain thereof are connected to each other.

Consequently, within a sampling period of an input analog signal of the signal production section 21K, a common voltage is produced by the NMOS transistors M21K and M22K which are connected in diode connection.

If the control section CTL11K of the comparison section 22K receives, in a second phase operation in which the second phase signal Φ2 has the high level, the first digital data 0 from the comparators CMP11-1, CMP11-2 and CMP11-3, then it carries out the following decision and control.

At this time, the switch SW21K of the first outputting section 23K and the switch SW22K of the second outputting section 24K are kept in a non-conducting state.

Accordingly, the NMOS transistor M21K of the first outputting section 23K and the NMOS transistor M22K of the second outputting section 24K cancel the diode connection state thereof with the gate and the drain thereof disconnected from each other.

If the control section CTL11K receives the first digital data 0 from the comparators CMP11-1, CMP11-2 and CMP11-3, then it decides that a first comparison result of 3Vin/4+(Vin−Vr)/4(=Vin−Vr/4)<0 is obtained as a result of the comparison.

Then, the control section CTL11K controls the changeover section 25K in the following manner with first to fourth control signals S31K to S34K.

The control section CTL11K keeps the first control signal S31K in the high level state and sets the second control signal S32K, third control signal S33K and fourth control signal S34K to the inactive low level.

Consequently, in the changeover section 25K, the fifth switch SW15 and the eighth switch SW18-1 are kept in a conducting or ON state. Meanwhile, in the changeover section 25K, the sixth switch SW16, seventh switches SW17-1, SW17-2 and SW17-3 and eighth switches SW18-2 and SW18-3 are kept in a non-conducting or OFF state.

Together with this, the first analog signal Vin outputted from the signal production section 21K is inputted to the gate of the NMOS transistor M21K of the first amplifier AMP11K of the first outputting section 23K. Meanwhile, the third analog signal Vin−Vr/4 outputted from the signal production section 21K is inputted to the gate of the NMOS transistor M22K of the second amplifier AMP12K of the second outputting section 24K.

The first amplifier AMP11K amplifies the first residual signal Vin supplied thereto through the changeover section 25K with a predetermined amplification factor A by the transconductance (gm) of the NMOS transistor M21K and outputs a resulting signal A×Vin from the first analog signal output terminal TO11.

The second amplifier AMP12K amplifies the second residual signal Vin−Vr/4 supplied thereto through the changeover section 25K with the predetermined amplification factor A by the transconductance (gm) of the NMOS transistor M22K and outputs a resulting signal A×(Vin−Vr/4) from the second analog signal output terminal TO12.

If the control section CTL11K receives the second digital data 1 from the comparator CMP11-1 and receives the first digital data 0 from the comparators CMP11-2 and CMP11-3, then it carries out such decision and control as described below.

At this time, the switch SW21K of the first outputting section 23K and the switch SW22K of the second outputting section 24K are kept in a non-conducting state.

Accordingly, the NMOS transistor M21K of the first outputting section 23K and the NMOS transistor M22K of the second outputting section 24K cancel the diode connection state thereof with the gate and the drain thereof disconnected from each other.

The control section CTL11K decides that the second comparison result is obtained by the comparator CMP11-1 and the first comparison result is obtained by the comparator CMP11-2.

The control section CTL11K decides that 3Vin/4+(Vin−Vr)/4(=Vin−Vr/4)>0 is obtained by the comparator CMP11-1 and Vin/2+(Vin−Vr/2) (=Vin−Vr/2)<0 is obtained by the comparator CMP11-2.

Then, the control section CTL11K controls the changeover section 25K with first to fourth control signals S31K to S34K.

The control section CTL11K keeps the second control signal S32K in the high level state and sets the first control signal S31K, third control signal S33K and fourth control signal S34K to the inactive low level.

Consequently, in the changeover section 25K, the seventh switch SW17-1 and the eighth switch SW18-2 are kept in a conducting or ON state. Meanwhile, in the changeover section 25K, the fifth switch SW15, sixth switch SW16, seventh switches SW17-2 and SW17-3 and eight switches SW18-1 and SW18-3 are kept in a non-conducting or OFF state.

Together with this, the third analog signal Vin−Vr/4 outputted from the signal production section 21K is inputted to the gate of the NMOS transistor M21K of the first amplifier AMP11K of the first outputting section 23K. Meanwhile, the third analog signal Vin−Vr/2 outputted from the signal production section 21K is inputted to the gate of the NMOS transistor M22K of the second amplifier AMP12K of the second outputting section 24K.

The first amplifier AMP11K amplifies the first residual signal Vin−Vr/4 supplied thereto through the changeover section 25K with a predetermined amplification factor A by the transconductance (gm) of the NMOS transistor M21K. Then, the first amplifier AMP11K outputs a resulting signal A×(Vin−Vr/4) from the first analog signal output terminal TO11.

The second amplifier AMP12K amplifies the second residual signal Vin−Vr/2 supplied thereto through the changeover section 25K with the predetermined amplification factor A by the transconductance (gm) of the NMOS transistor M22K. Then, the second amplifier AMP12K outputs a resulting signal A×(Vin−Vr/2) from the second analog signal output terminal TO12.

If the control section CTL11K receives the second digital data 1 from the comparators CMP11-1 and CMP11-2 and receives the first digital data 0 from the comparator CMP11-3, then it carries out such decision and control as described below.

At this time, the switch SW21K of the first outputting section 23K and the switch SW22K of the second outputting section 24K are kept in a non-conducting state.

Accordingly, the NMOS transistor M21K of the first outputting section 23K and the NMOS transistor M22K of the second outputting section 24K cancel the diode connection state thereof with the gate and the drain thereof disconnected from each other.

The control section CTL11K decides that the second comparison object is obtained by the comparator CMP11-2 and the first comparison result is obtained by the comparator CMP11-3.

The control section CTL11K decides that Vin/2+(Vin−Vr)/2(=Vin−Vr/2)>0 is obtained by the comparator CMP11-2 and Vin/4+3(Vin−Vr)/4(=Vin−3Vr/4)<0 is obtained by the comparator CMP11-3.

Then, the control section CTL11K controls the changeover section 25K in the following manner with first to fourth control signals S31K to S34K.

The control section CTL11k keeps the third control signal S33K in the high level and sets the first control signal S31K, second control signal S32K and fourth control signal S34K to the inactive low level.

Consequently, in the changeover section 25K, the seventh switch SW17-2 and eighth switch SW18-3 are kept in a conducting or ON state. Meanwhile, in the changeover section 25K, the fifth switch SW15, sixth switch SW16, seventh switches SW17-1 and SW17-3, and eighth switches SW18-1 and SW18-2 are kept in a non-conducting or OFF state.

Together with this, the third analog signal Vin−Vr/2 outputted from the signal production section 21K is inputted to the gate of the NMOS transistor M21K of the first amplifier AMP11K of the first outputting section 23K. Meanwhile, the third analog signal Vin−3Vr/4 outputted from the signal production section 21K is inputted to the gate of the NMOS transistor M22K of the second amplifier AMP12K of the second outputting section 24K.

The first amplifier AMP11K amplifies the first residual signal Vin−Vr/2 supplied thereto through the changeover section 25K with a predetermined amplification factor A by the transconductance (gm) of the NMOS transistor M21K. Then, the first amplifier AMP11K outputs a resulting signal A×(Vin−Vr/2) from the first analog signal output terminal TO11.

The second amplifier AMP12K amplifies the second residual signal Vin−3Vr/4 supplied thereto through the changeover section 25K with the predetermined amplification factor A by the transconductance (gm) of the NMOS transistor M22K. Then, the second amplifier AMP12K outputs a resulting signal A×(Vin−3Vr/4) from the second analog signal output terminal TO12.

If the control section CTL11K receives the second digital data 1 from the comparators CMP11-1, CMP11-2 and CMP11-3, then it carries out such decision and control as described below.

At this time, the switch SW21K of the first outputting section 23K and the switch SW22K of the second outputting section 24K are kept in a non-conducting state.

Accordingly, the NMOS transistor M21K of the first outputting section 23K and the NMOS transistor M22K of the second outputting section 24K cancel the diode connection state thereof with the gate and the drain thereof disconnected from each other.

The control section CTL11K decides that the second comparison result Vin/4+3(Vin−Vr)/4(=Vin−3Vr/4)>0 is obtained as a result of the comparison.

Then, the control section CTL11K controls the changeover section 25K in the following manner with the first to fourth control signals S31K to S34K.

The control section CTL11K keeps the fourth control signal S34K in the high level state and sets the first control signal S31K, second control signal S32K and third control signal S33K to the inactive low level.

Consequently, in the changeover section 25K, the seventh switch SW17-3 and the sixth switch SW16 are kept in a conducting or ON state. Meanwhile, in the changeover section 25K, the fifth switch SW15, seventh switches SW17-1 and SW17-2 and eighth switches SW18-1, SW18-2 and SW18-3 are kept in a non-conducting or OFF state.

Together with this, the third analog signal Vin−3Vr/4 outputted from the signal production section 21K is inputted to the gate of the NMOS transistor M21K of the first amplifier AMP11K of the first outputting section 23K. Meanwhile, the second analog signal Vin−Vr outputted from the signal production section 21K is inputted to the gate of the NMOS transistor M22K of the second amplifier AMP12K of the second outputting section 24K.

The first amplifier AMP11K amplifies the first residual signal Vin−3Vr/4 supplied thereto through the changeover section 25K with a predetermined amplification factor A by the transconductance (gm) of the NMOS transistor M21K. Then, the first amplifier AMP11K outputs a resulting signal A×(Vin−3Vr/4) from the first analog signal output terminal TO11.

The second amplifier AMP12K amplifies the second residual signal Vin−Vr supplied thereto from the changeover section 25K with the predetermined amplification factor A by the transconductance (gm) of the NMOS transistor M22K. Then, the second amplifier AMP12K outputs a resulting signal A×(Vin−Vr) from the second analog signal output terminal TO12.

With the present twelfth embodiment, similar effects to those achieved by the fifth embodiment described hereinabove can be achieved.

<13. Thirteenth Embodiment>

Figure 25:
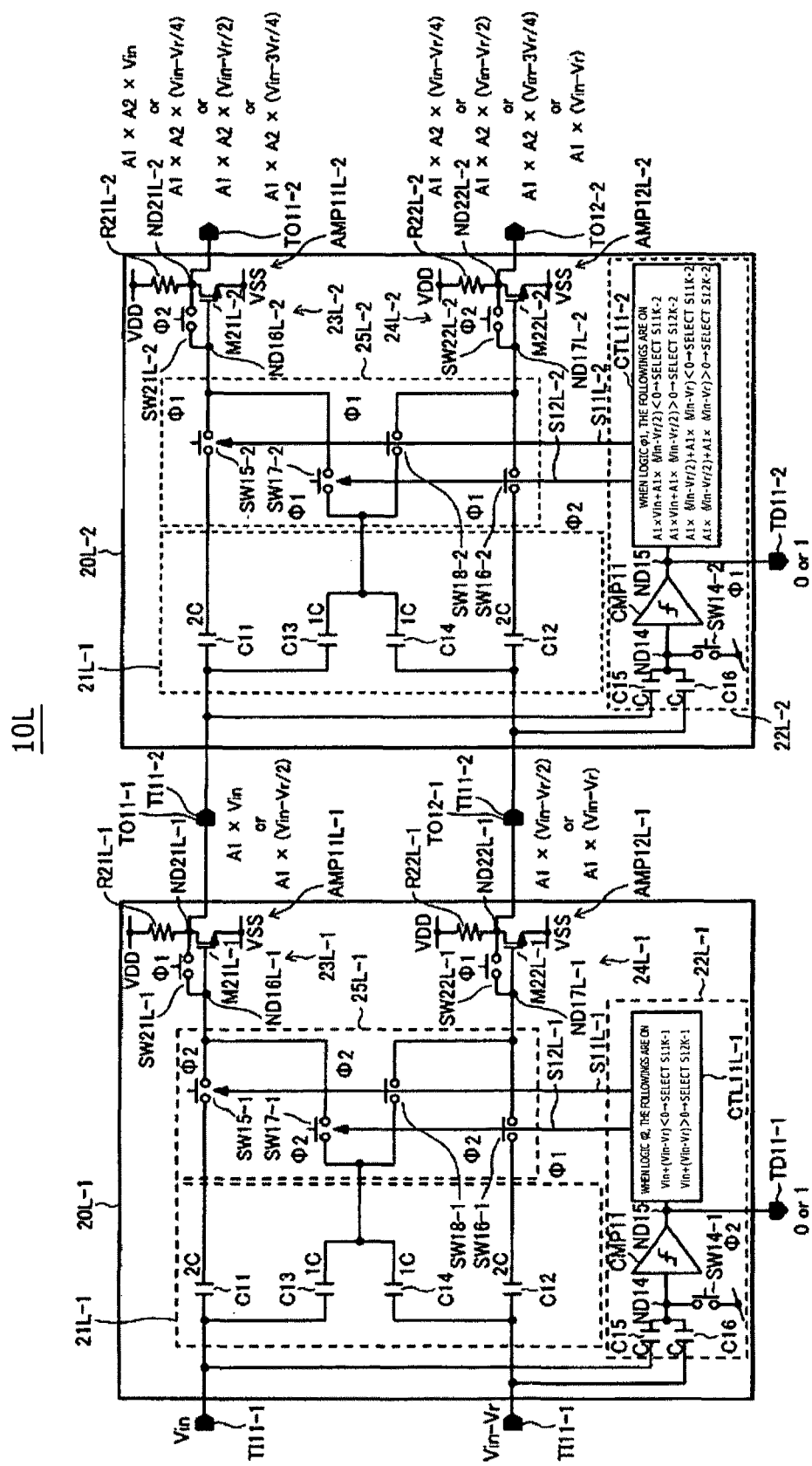
FIG. 25 is a block diagram showing an example of a configuration of a 2-bit AD converter according to a thirteenth embodiment of the present disclosure.

FIG. 25 shows an example of a configuration of a 2-bit AD converter according to a thirteenth embodiment of the present disclosure.

Referring to FIG. 25, the 2-bit AD converter 10L according to the thirteenth embodiment is similar to the 2-bit AD converter 10E according to the sixth embodiment described hereinabove with reference to FIG. 16 but is different in the following points.

In the present 2-bit AD converter 10L, the AD conversion stages 20-1 and 20-2 of the 2-bit AD converter 10E of FIG. 16 are configured from the AD conversion stage 201 in the tenth embodiment described hereinabove with reference to FIG. 22.

Although the AD conversion stages 20-1 and 20-2 are different a little in configuration and function, general operation of the entire 2-bit AD converter 10L is similar to those in the sixth and tenth embodiments described hereinabove.

Therefore, overlapping description of the operation is omitted herein to avoid redundancy.

<14. Fourteenth Embodiment>

Figure 26:
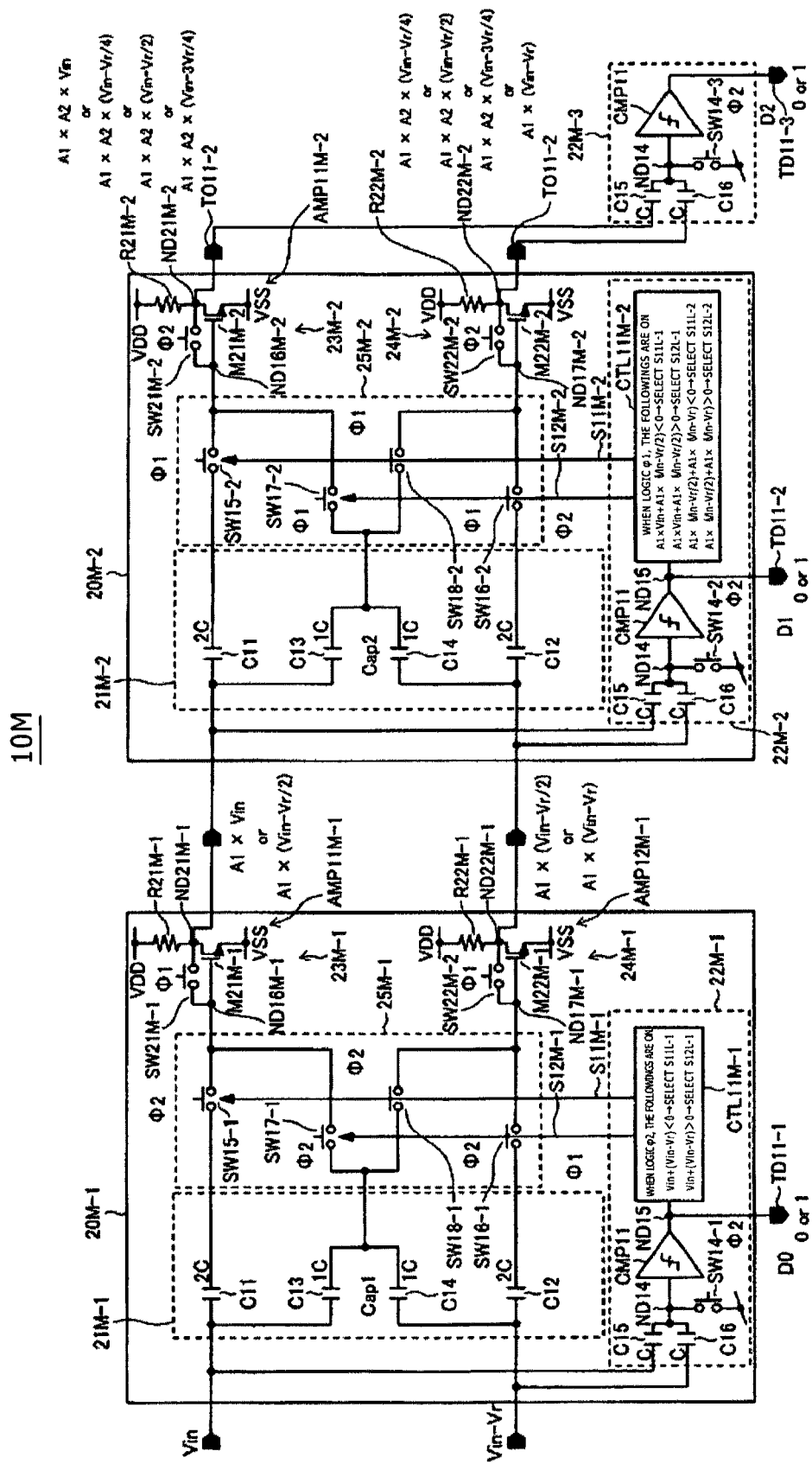
FIG. 26 is a block diagram showing an example of a configuration of a 3-bit AD converter according to a fourteenth embodiment of the present disclosure.

FIG. 26 shows an example of a configuration of a 3-bit AD converter according to a fourteenth embodiment of the present disclosure.

Referring to FIG. 26, the 3-bit AD converter 10M according to the fourteenth embodiment is similar to the 3-bit AD converter 10F according to the seventh embodiment described hereinabove with reference to FIG. 18 but is different in the following points.

In the present 3-bit AD converter 10M, the AD conversion stages 20-1 and 20-2 of the 3-bit AD converter 10F of FIG. 18 are configured from the AD conversion stage 201 according to the tenth embodiment described hereinabove with reference to FIG. 22.

Although the AD conversion stages 20-1 and 20-2 are different a little in configuration and function, general operation of the entire 3-bit AD converter 10M is similar to those in the seventh and tenth embodiments described hereinabove.

Therefore, overlapping description of the operation is omitted herein to avoid redundancy.

<15. Fifteenth Embodiment>

Figure 27:
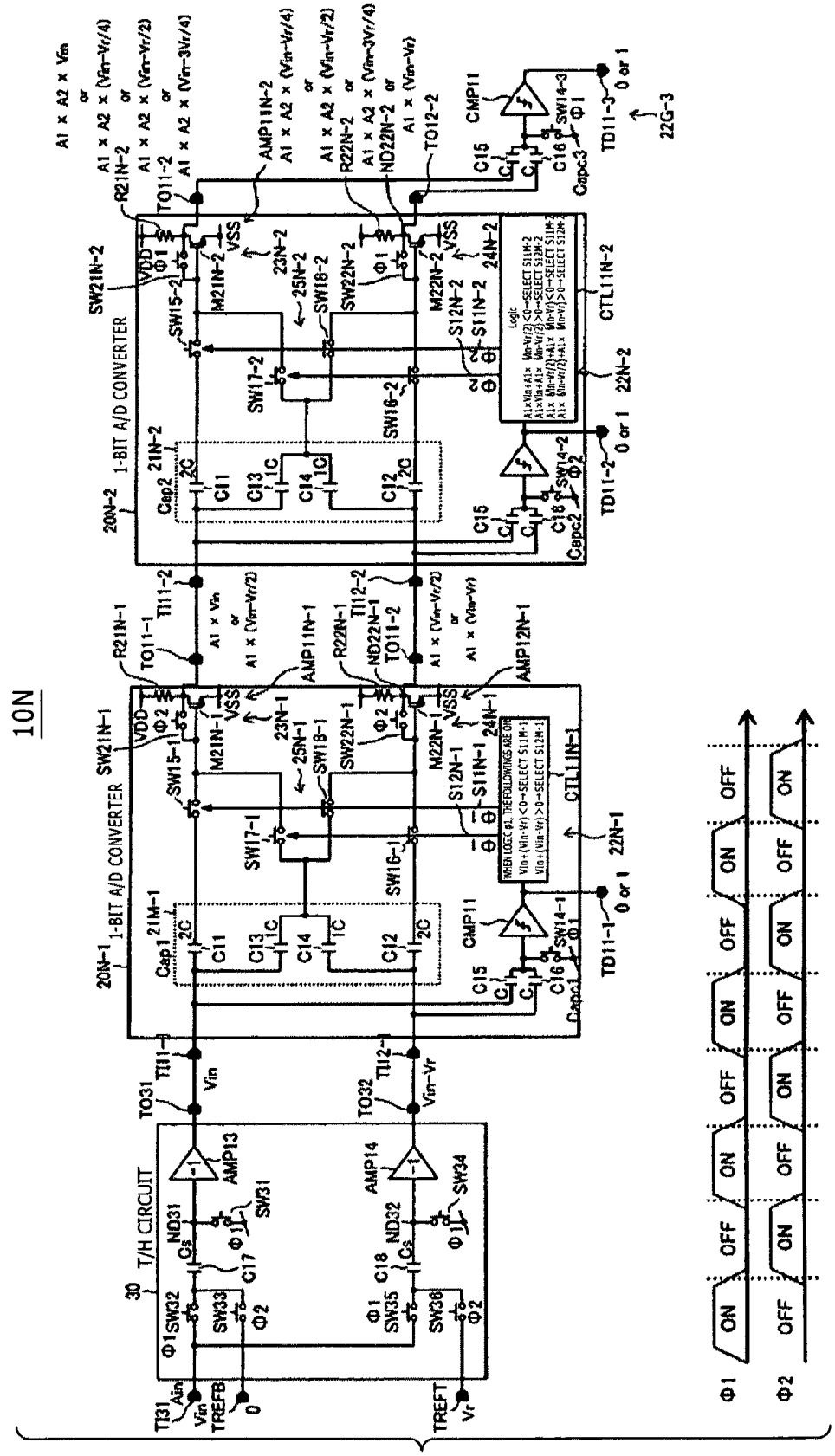
FIG. 27 is a block diagram showing an example of a configuration of a 3-bit AD converter according to a fifteenth embodiment of the present disclosure.

FIG. 27 shows an example of a configuration of a 3-bit AD converter according to a fifteenth embodiment of the present disclosure.

Referring to FIG. 27, the 3-bit AD converter 10N according to the fifteenth embodiment is similar to the 3-bit AD converter 10G according to the eighth embodiment described hereinabove with reference to FIG. 19 but is different in the following points.

In the present 3-bit AD converter 10N, the AD conversion stages 20-1 and 20-2 of the 3-bit AD converter 10G of FIG. 19 are configured from the AD conversion stage 20-1 in the tenth embodiment described hereinabove with reference to FIG. 22.

Although the AD conversion stages 20-1 and 20-2 are different a little in configuration and function, general operation of the entire 3-bit AD converter 10N is similar to those in the eighth and tenth embodiments described hereinabove.

Therefore, overlapping description of the operation is omitted herein to avoid redundancy.

16. Sixteenth Embodiment>

Figure 28:
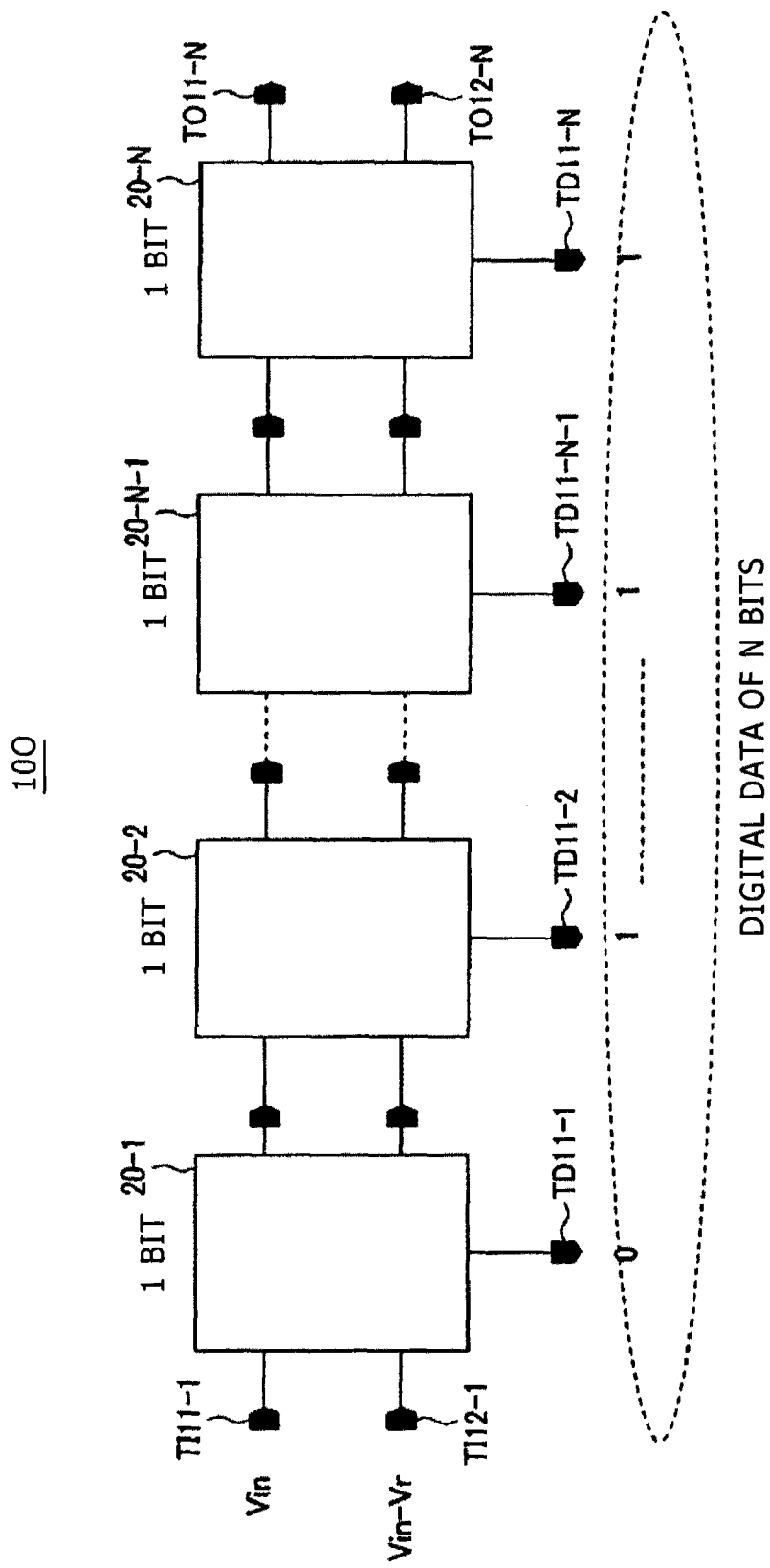
FIG. 28 is a block diagram showing an example of a configuration of an N-bit AD converter according to a sixteenth embodiment of the present disclosure.

FIG. 28 shows an example of a configuration of a 3-bit AD converter according to a sixteenth embodiment of the present disclosure.

Referring to FIG. 28, the 2-bit AD converter 10O according to the present sixteenth embodiment is formed as an N-bit AD converter by connecting N1-bit AD converters according to the first embodiment in a cascade connection.

Also in the present sixteenth embodiment, the AD converter 10O of the open, loop pipeline type which uses open loop amplification and open loop capacitor arithmetic operation is formed.

By connecting AD conversion stages by N stages in series such that similar processing is repeated in the different stages, digital data and analog signals, that is, residual signals, are outputted from an AD conversion stage of each stage in response to a result of comparison of the analog input signals.

It is to be noted that also it is possible to adopt an AD conversion stage in each of the embodiments described hereinabove, for example, a stage which adopts redundancy.

With the present sixteenth embodiment, similar effects to those achieved by the embodiments described above can be achieved.

<17. Seventeenth Embodiment>

Figure 29:
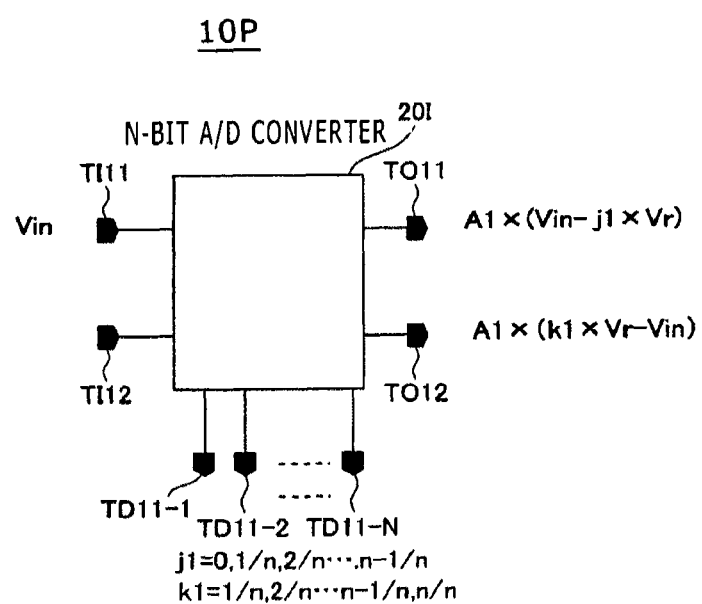
FIG. 29 is a block diagram showing an example of a configuration of an N-bit AD converter according to a seventeenth embodiment of the present disclosure.

FIG. 29 shows an example of a configuration of an N-bit AD converter according to a seventeenth embodiment of the present disclosure.

Referring to FIG. 29, the 2-bit AD converter 10P according to the seventeenth embodiment is basically configured such that one 1-bit AD converter, for example, according to the first embodiment, is applied to form an N-bit AD converter.

Also in the present seventeenth embodiment, the AD converter 10P of the open loop pipeline type which uses open loop amplification and open loop capacitor arithmetic operation is formed.

In the present AD converter 10P, one AD conversion stage 20P multiplies two first and second analog input signals Vin and Vin−Vr by coefficients 1/N, 2/N, . . . , N/N=1 and then weights the products to two or more analog signals.

Then, processing similar to that carried out in the first embodiment is carried out, and the comparison section compares |1/N×Vin| and |(N−1)/N×(Vin−Vr)|, |2/N×Vin| and |(N−2)/N×(Vin−Vr)|, . . . , |(N−1)/N×Vin| and |(N−(N−1))/N×(Vin−Vr)| with each other.

Then, a point at which Vin satisfies nVr/N<Vin<(n+1)Vr/N is detected, and digital data of N bits corresponding to the point is outputted from the N digital data output terminals TD11-1 to TD11-N.

Concurrently, the analog residual signals n/N×Vin+(N−n)/N×(Vin−Vr) and (n+1)/N×Vin+(N−n)/N×(Vin−Vr) are outputted from the first and second analog signal output terminals TO11 and TO12, respectively.

For example, a 2-bit AD converter includes two analog input signal terminals, two digital data output terminals and two analog output terminals, and is configured similarly to the 2-bit AD converter 10D according to the fifth embodiment described hereinabove with reference to FIG. 14.

From the first and second analog signals Vin and Vin−Vr, weighted signals ¼×Vin, 2/4×Vin, ¾×Vin and Vin, and Vin+Vr, ¾×(Vin−Vr), 2/4×(Vin−Vr) and ¼×(Vin−Vr) are produced.

Then, the comparison section compares |¼×Vin| and |¾×(Vin−Vr)|, |2/4×Vin| and |2/4×(Vin−Vr)|, and |¾×Vin| and |¼×(Vin−Vr)| with each other.

Here, if ¾×Vin>¼×(Vin−Vr) and 2/4×Vin<2/4×(Vin−Vr), that is, if Vr/4<Vin<Vr/2, then the digital data 01 is outputted from the two digital data output terminals TD11-1 and TD11-2.

Then, ¾×Vin+¼×(Vin−Vr)=Vin−Vr/4 and 2/4×(Vin−Vr)+2/4×Vin=Vin−Vr/2 are amplitude to A1 times and then outputted from the two analog signal output terminals TO11 and TO12.

With the present seventeenth embodiment, similar effects to those of the embodiments described hereinabove can be achieved.

<18. Eighteenth Embodiment>

Figure 30:
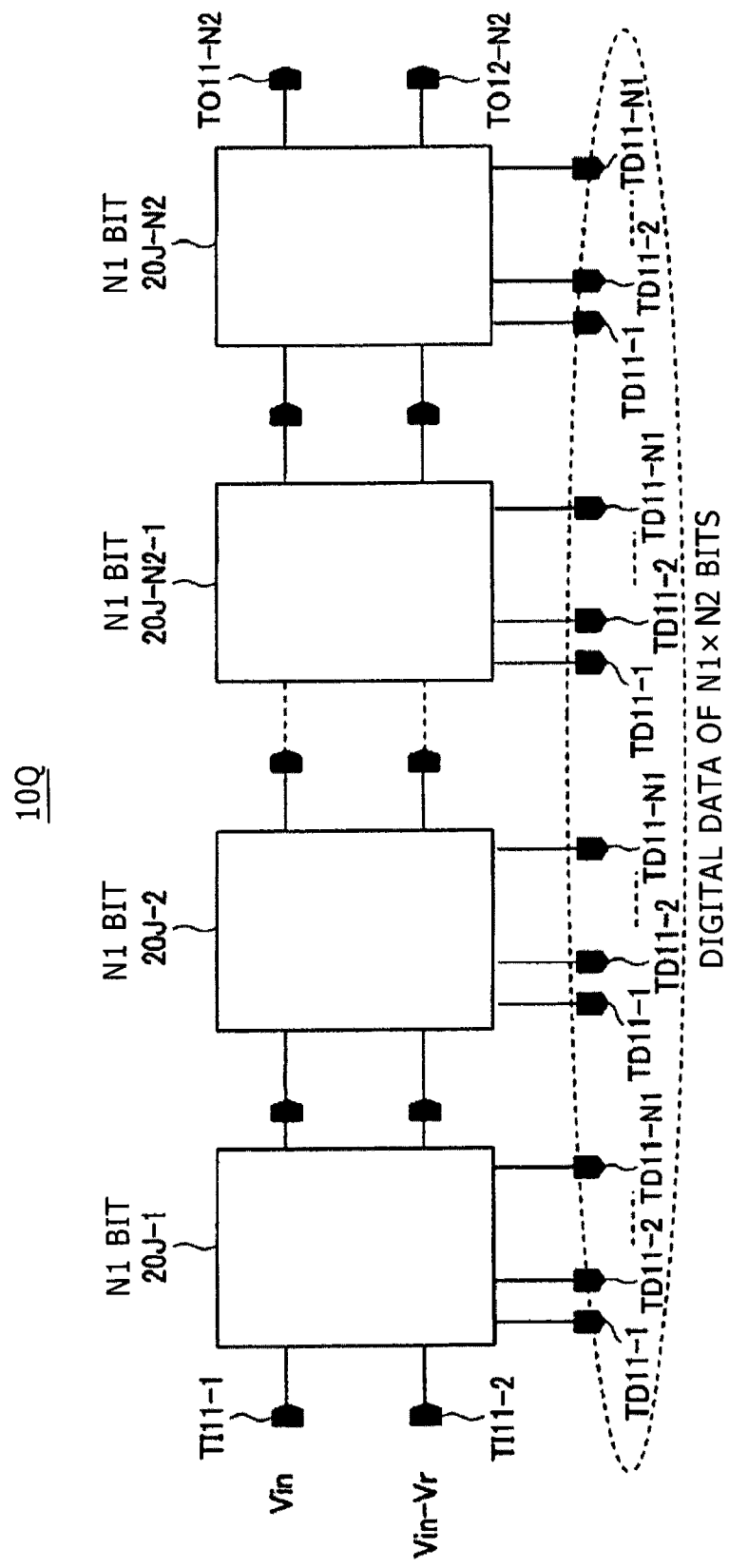
FIG. 30 is a block diagram showing an example of a configuration of an N1×N2-bit AD converter according to an eighteenth embodiment of the present disclosure.

FIG. 30 shows an example of a configuration of an N1×N2-bit AD converter according to an eighteenth embodiment of the present disclosure.

Referring to FIG. 30, the AD converter 10Q according to the eighteenth embodiment is configured as an AD converter of N1×N2 bits by connecting N2 AD converters of N1 bits according to the seventeenth embodiment are connected in series as in the case of the AD converter according to the sixteenth embodiment.

With the present eighteenth embodiment, similar effects to those of the embodiments described hereinabove can be achieved.

<19. Nineteenth Embodiment>

Figure 31:
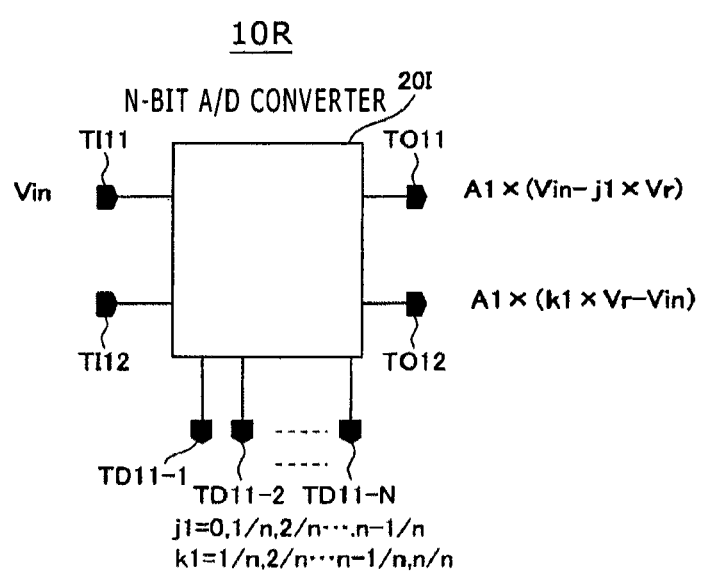
FIG. 31 is a block diagram showing an example of a configuration of an N1-bit AD converter according to a nineteenth embodiment of the present disclosure.

FIG. 31 shows an example of a configuration of an N1-bit AD converter according to a nineteenth embodiment of the present disclosure.

Referring to FIG. 31, the N1-bit AD converter 10R according to the nineteenth embodiment is basically configured such that a clock input terminal TCLK for receiving a clock signal CLK as an input thereto is provided in the AD converter 10P according to the seventeenth embodiment described hereinabove.

With the present nineteenth embodiment, timings for sampling of two analog input signals, comparison, and analog signal outputting and digital data outputting can be controlled with the clock signal CLK.

For example, if the first phase signal Φ1 and the second phase signal Φ2 are supplied as a clock signal from the clock input terminal TCLK, then the timings for sampling, comparison and analog signal outputting and digital data outputting can be controlled.

<20. Twentieth Embodiment>

Figure 32:
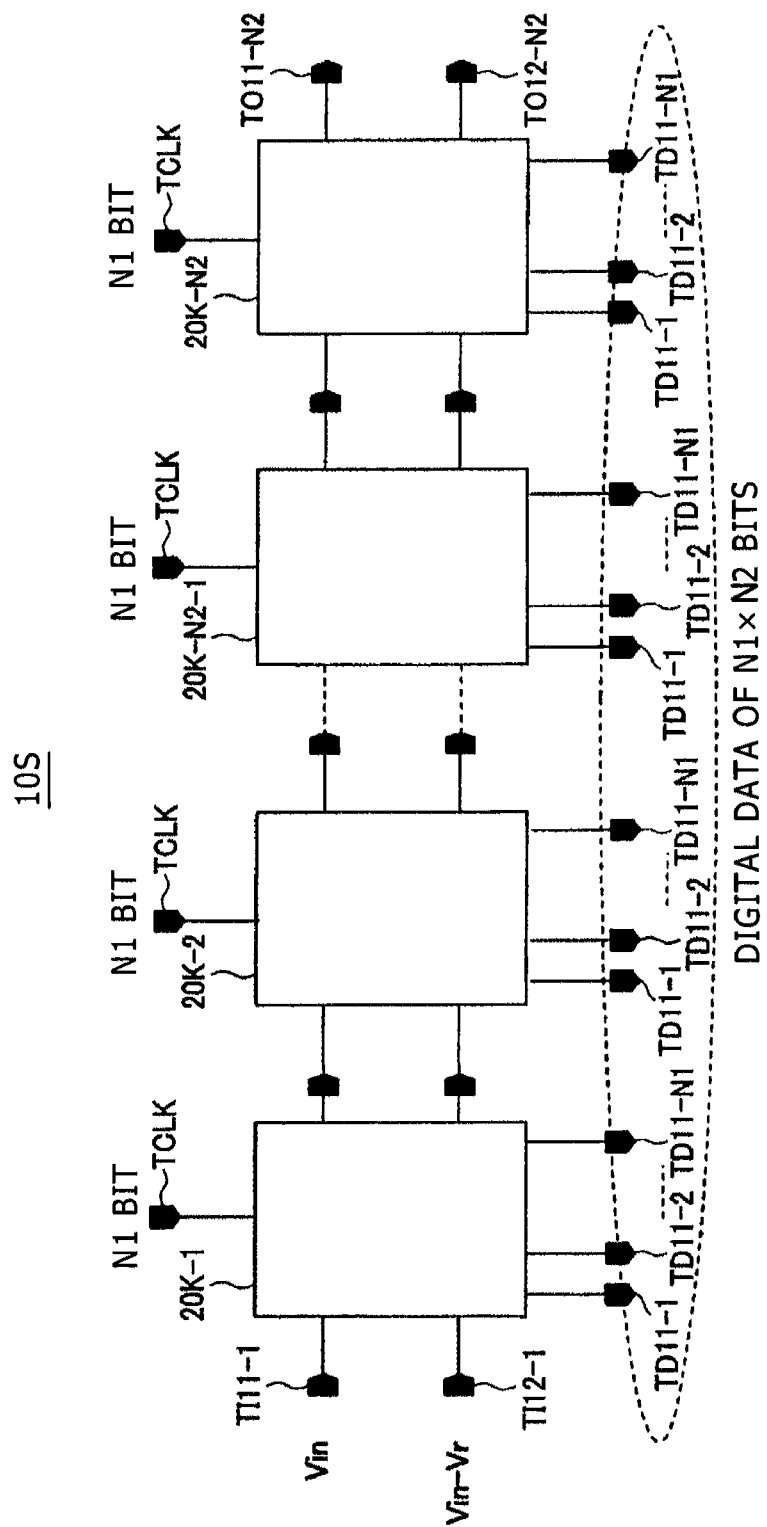
FIG. 32 is a block diagram showing an example of a configuration of an N1×N2-bit AD converter according to a twentieth embodiment of the present disclosure.

FIG. 32 shows an example of a configuration of an N1×N2-bit AD converter according to a twentieth embodiment of the present disclosure.

Referring to FIG. 32, the AD converter 10S according to the twentieth embodiment is formed as an AD converter of N1×N2 bits by connecting N2 AD converts of N1 bits according to the nineteenth embodiment in series in such a manner as in the AD converter according to the eighteenth embodiment.

With the present twentieth embodiment, similar effects to those of the embodiments described hereinabove can be achieved.

As described above, the AD converter 10 of the embodiment described hereinabove carries out comparison based on a comparison object value or threshold value produced from two analog input voltages Vin and Vin−Vr themselves. Also analog residual signals are produced from two analog input voltages similarly.

Figure 33A:
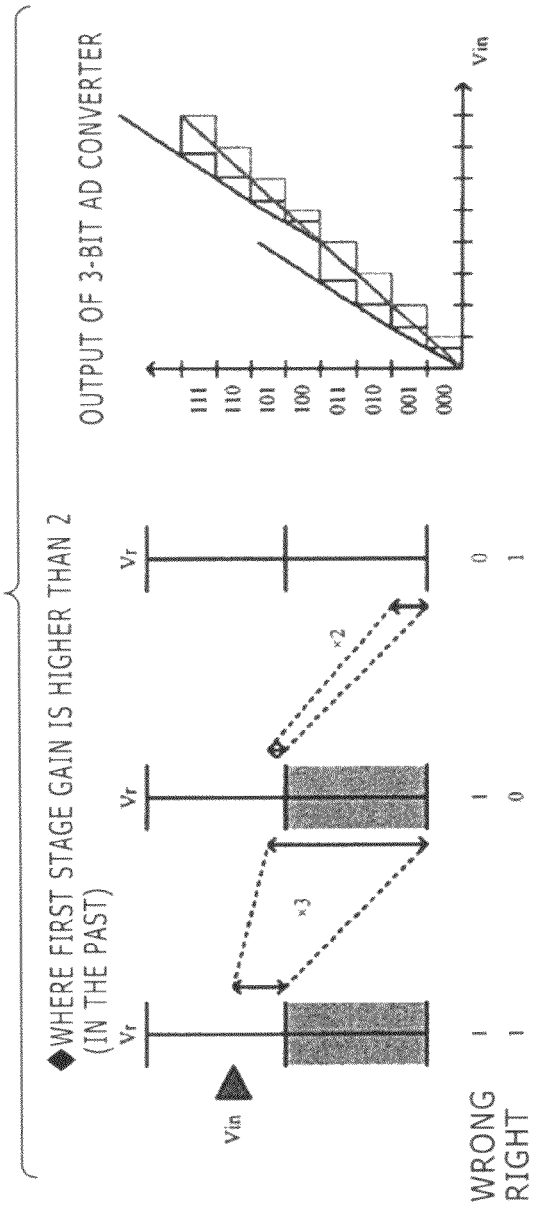
FIGS. 33A and 33B are diagrams illustrating effects of the present disclosure in comparison with a comparative example.
Figure 33B:
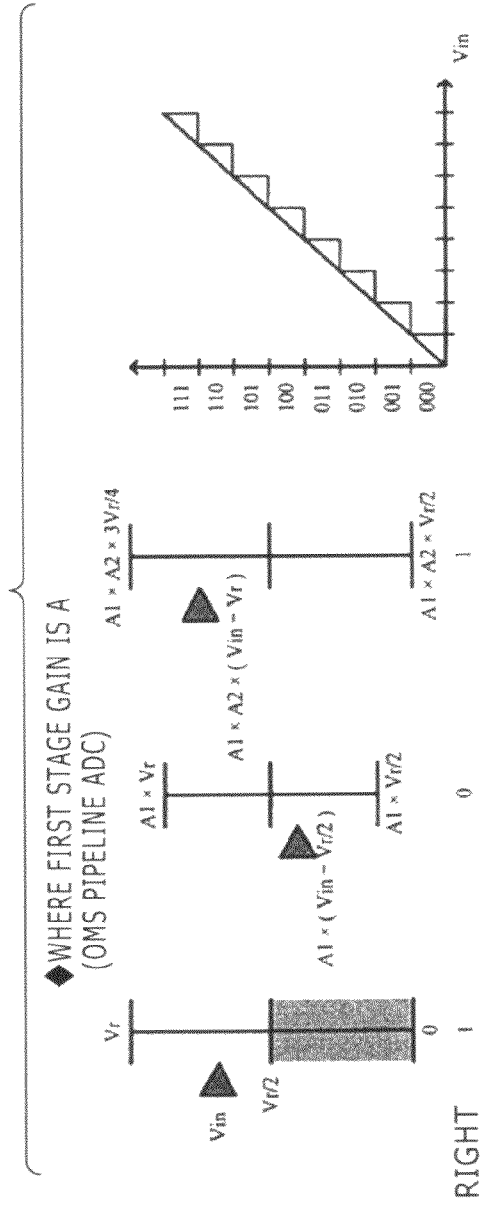

Consequently, the AD converter 10 does not include an element which requires an accurate absolute value as seen in FIG. 33B in comparison with an alternative AD converter in the past which uses a closed loop operational amplifier as seen in FIG. 33A.

Due to the configuration just described, there is no necessity to strictly control the amplification factor or gain of the amplifiers AMP11 and AMP12. Further, since also capacitor arithmetic operation is carried out in an open loop without using a closed loop, the amplifiers can be configured from a simple differential amplifier.

As described above, the AD converter can be implemented without using a closed loop operational amplifier of high accuracy, that is, of a high gain.

In other words, an AD converter of the pipeline type, that is, an AD converter of the open loop pipeline type, can be implemented on the basis of open loop amplification of a low gain and capacitor arithmetic operation by an open loop.

Accordingly, the AD converter can implement low voltage operation, low power operation and high speed operation with a small area.

<21. Twenty-First Embodiment>

Figure 34:
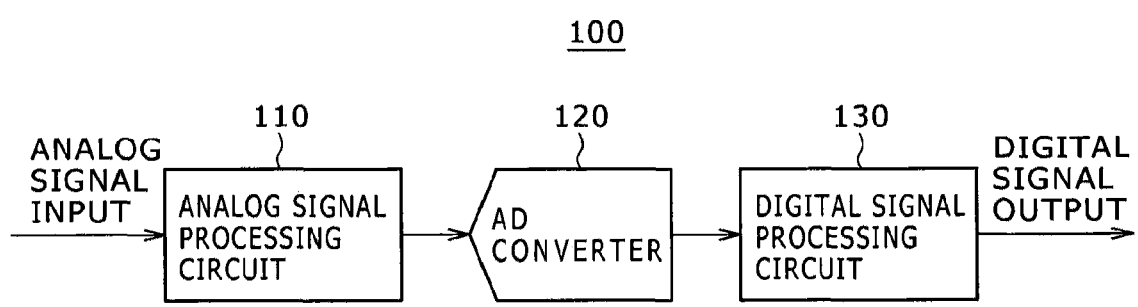
FIG. 34 is a block diagram showing an example of a configuration of a signal processing system according to a twenty-first embodiment of the present disclosure.

FIG. 34 shows an example of a configuration of a signal processing system according to a twenty-first embodiment.

Referring to FIG. 34, the signal processing system 100 is formed as a system to which the AD converters 10 to 10S according to the first to twentieth embodiments described hereinabove can be applied. The signal processing system 100 may be, for example, a camera signal processing system.

The signal processing system 100 includes an analog signal processing circuit 110, an AD converter 120, and a digital signal processing circuit 130.

In the signal processing system 100, any of the AD converters 10 to 10S according to the first to twentieth embodiments can be applied as the digital signal processing circuit 130.

In the signal processing system 100 of FIG. 34, if signal processing is carried out as far as possible by the digital signal processing circuit 130 to reduce the scale of the analog signal processing circuit 110, then reduction in size and increase in efficiency can be anticipated.

Here, in order to implement such a system as described above, that is, in order to allow the digital signal processing circuit 130 to carry out signal processing which is carried out by the analog signal processing circuit 110, it is advisable to carry out AD conversion without damaging information of an original signal as far as possible. To this end, an AD converter having a high SN ratio is used.

In order to implement a higher SN ratio, two conditions of <1> increasing the resolution, that is, the bit number and <2> reducing the noise of the circuitry as far as possible are satisfied. Also a high conversion speed is desired for the AD converter. This is because the amount information to be handled increases in accordance with advancement of the system.

As an example of the digital signal processing circuit 130 which satisfies such conductions as described above, the AD converters 10 to 10S according to the first to twentieth embodiments which function also as pipeline type AD converters can be applied.

It is to be noted that, while the embodiments described hereinabove use single operation, the present discloser can be applied to AD converters of both of the single operation type and the differential operation type.

The present disclosure contains subject matter related to that disclosed in Japanese Priority Patent Application JP 2010-232877 filed in the Japan Patent Office on Oct. 15, 2010, the entire content of which is hereby incorporated by reference.

While preferred embodiments of the present disclosure have been described using specific terms, such description is for illustrative purpose only, and it is to be understood that changes and variations may be made without departing from the spirit or scope of the following claims.

What is claimed is:

1. An analog to digital converter, comprising:
an analog to digital conversion stage of at least one stage adapted to produce digital data of a value corresponding to a relationship to two analog signals inputted thereto and output two analog residual signals,
said analog to digital conversion stage including
a signal production section adapted to receive, as input signals thereto, a first analog signal of a voltage value corresponding to a difference between a voltage value between a first reference voltage and a second reference voltage and the second reference voltage, and a second analog signal of a voltage value corresponding to a difference between a voltage value of the first analog signal and a difference voltage between the first reference voltage and the second reference voltage, produce at least one third analog signal of an intermediate voltage value produced from the voltage value of the first analog signal and a voltage value of the second analog signal, and output the first analog signal, second analog signal and third analog signal,
a comparison section adapted to receive, as input signals thereto, the first analog signal and the second analog signal, compare the voltage value of the first analog signal and the voltage value of the second analog signal with each other, and output digital data of a value corresponding to a result of the comparison,
a first outputting section adapted to amplify a first residual signal with a predetermined amplification factor and output the amplified first residual signal,
a second outputting section adapted to amplify a second residual signal with the predetermined amplification factor and output the amplified second residual signal, and
a changeover section adapted to change over inputting of the first analog signal, second analog signal and third analog signal outputted from said signal production section to said first outputting section and said second outputting section in response to the result of the comparison by said comparison section;
said comparison section outputting first digital data when a first comparison result that the voltage value of the first analog signal is lower than the voltage value of the second analog signal is obtained whereas said comparison section outputs second digital data when a second comparison result that the voltage value of the first analog signal is higher than the voltage value of the second analog signal is obtained;
said changeover section carrying out the changeover such that,
when the first comparison result is obtained by said comparison section, the first analog signal outputted from said signal production section is inputted as the first residual signal to said first outputting section and the third analog signal outputted from said signal production section is inputted as the second residual signal to said second outputting section, but
when the second comparison result is obtained by said comparison section, the third analog signal outputted from said signal production section is inputted as the first residual signal to said first outputting section and the second analog signal outputted from said signal production section is inputted as the second residual signal to said second outputting section.

2. The analog to digital converter according to claim 1, wherein a plurality of such analog to digital conversion stages are connected in cascade connection and each includes:
a first analog signal input terminal for receiving the first analog signal as an input thereto;
a second analog signal input terminal for receiving the second analog signal as an input thereto;
a first analog signal output terminal;
a second analog signal output terminal; and
a digital data output terminal;
the first analog signal input terminal of one of said analog to digital conversion stages which serves as a succeeding stage side being connected to the first analog signal output terminal of that one of said analog to digital conversion stages which serves as a preceding stage side such that the first residual signal outputted from the preceding stage is inputted as the first analog signal to the first analog signal input terminal of the analog to digital conversion stage of the succeeding side;
the second analog signal input terminal of one of said analog to digital conversion stages which serves as a succeeding stage side being connected to the second analog signal output terminal of that one of said analog to digital conversion stages which serves as a preceding stage side such that the second residual signal outputted from the preceding stage is inputted as the second analog signal to the second analog signal input terminal of the analog to digital conversion stage of the succeeding side;
the first analog signal input terminal of that one of said analog to digital conversion stages which serves as a first stage receiving, as an input thereto, the first analog signal having a voltage value between the reference voltages and a full range voltage whereas the second analog signal input terminal of the analog to digital conversion stage of the first stage receives, as an input thereto, the second analog signal of a voltage value corresponding to a difference between a voltage value of the first analog signal inputted to said first analog signal input terminal and the full range voltage.

3. The analog to digital converter according to claim 2, wherein at least said analog to digital conversion stage of the first stage receives, as an input thereto, the first analog signal of a voltage Vin and the second analog signal of a voltage Vin−Vr, which is a difference of a full range voltage Vr from the voltage Vin of the first analog signal, where 0<Vin<Vr, and then,
   when said comparison section compares the two analog input voltages |Vin| and |Vin−Vr| with each other and the first analog signal voltage |Vin| and the second analog signal voltage |Vin−Vr| satisfy |Vin|<Vin−Vr| and Vin<Vr/2, outputs digital data 0 from said digital data output terminal and outputs voltages A×Vi and A×(Vin−Vr/2) amplified with an amplification factor A from said first and second analog signal output terminals, respectively, but
   when said comparison section compares the two analog input voltages |Vin| and |Vin−Vr| with each other and the first analog signal voltage |Vin| and the second analog signal voltage |Vin−Vr| satisfy |Vin|>|Vin−Vr| and Vin>Vr/2, outputs digital data 1 from said digital data output terminal and outputs voltages A×(Vi—Vr/2) and A×(Vin−Vr) amplified with the amplification factor A from said first and second analog signal output terminals, respectively.

4. The analog to digital converter according to claim 2, wherein
   such two analog to digital conversion stages are connected in cascade connection, and
   the analog to digital conversion stage of the first stage receives, as inputs thereto, the first analog signal of a voltage Vin and the second analog signal of a voltage Vin−Vr, which is a difference of a full range voltage Vr from the voltage Vin of the first analog signal, where 0<Vin<Vr,
   each of said analog to digital conversion stages being adapted to
      output, in the case of Vin<Vr/4, digital data 00 from two of said digital data output terminals,
      output, in the case of Vr/4<Vin<Vr/2, digital data 01 from said two digital data output terminals,
      output, in the case of Vr/2<Vin<3Vr/4, digital data 10 from said two digital data output terminals, and
      output, in the case of 3Vr/4<Vin<Vr, digital data 11 from said two digital data output terminals,
   the analog to digital conversion stage of the second stage operating in response to a result of the comparison by said comparison section to
      amplify the residual signals A×Vin and A×(Vin−Vr/4) to A times and output the amplified residual signals,
      amplify the residual signals A×(Vin−Vr/4) and A×(Vin−Vr/2) to A times and output the amplified residual signals,
      amplify the residual signals A×(Vin−Vr/2) and A×(Vin−3Vr/4) to A times and output the amplified residual signals, or
      amplify the residual signals A×(Vin−3Vr/4) and A×(Vin−Vr) to A times and output the amplified residual signals,
   from said first and second analog signal output terminals, respectively.

5. The analog to digital converter according to claim 2, wherein said analog to digital conversion stage includes N digital data output terminals, and
   multiplies the first analog signal and the second analog signal inputted thereto by different coefficients for weighting to produce more than two analog signals, carries out a comparison process for the produced analog signals by means of said comparison section, outputs digital data of N bits corresponding to a result of the comparison from said N digital data output terminals, and outputs two analog residual signals corresponding to the result of the comparison from said first analog signal output terminal and said second analog signal output terminal.

6. The analog to digital converter according to claim 5, wherein said analog to digital conversion stage
   multiplies the first analog signal Vin and the second analog signal Vin−Vr inputted thereto by coefficients 1/N 2/N, ..., N/N=1 for weighting to produce more than two analog signals,
   compares, by means of said comparison section, the produced analog signal voltages |1/N×Vin| and |(N−1)/N×(Vin−Vr)|, |2/N×Vin| and |(N−2)/N×(Vin−Vr)|, ..., |(N−1)/N×Vin| and |(N−(N−1))/N×(Vin−Vr)| with each other to detect a point at which the first analog signal Vin satisfies nVr/N<Vin<(n+1)Vr/N and outputs digital data of N bits corresponding to the point from the N digital data output terminals, and
   concurrently outputs the two analog residual signals n/N×Vin+(N−n)/N×(Vin−Vr) and (n+1)/N×Vin+(N−n)/N×(Vin−Vr) from said first analog signal output terminal and said second analog signal output terminal, respectively.

7. The analog to digital converter according to claim 2, further comprising
   a comparison section adapted to receive, as inputs thereto, the residual signals outputted from said first analog signal output terminal and said second analog signal output terminal of the analog to digital converter of the last stage as a first analog signal and a second analog signal, respectively,
   said comparison section comparing, when the first analog signal and the second analog signal are inputted thereto, a voltage value of the first analog signal and a voltage value of the second analog signal with each other and outputting digital data of a value corresponding to a result of the comparison.

8. The analog to digital converter according to claim 1, wherein said analog to digital conversion stage controls timings of sampling and comparison of two analog input signals, analog signal outputting and digital data outputting in synchronism with a clock signal.

9. The analog to digital converter according to claim 8, wherein a plurality of such analog to digital conversion stages are connected in cascade connection, and
   the clock signal is supplied in the opposite phases to each adjacent ones of said analog to digital conversion stages such that the sampling and comparison of the two analog input signals, analog signal outputting and digital data outputting are processed in synchronism with the clock signal by a pipeline system.

10. The analog to digital converter according to claim 1, wherein said analog to digital conversion stage has a function of providing redundancy to two analog output signals to be outputted.

11. The analog to digital converter according to claim 1, wherein said signal production section includes:
   a first capacitor connected at one terminal thereof to an input line of the first analog signal and at the other terminal thereof to a first output node for outputting the first analog signal;

a second capacitor connected at one terminal thereof to an input line of the second analog signal and at the other terminal thereof to a second output node for outputting the second analog signal;

a third capacitor connected at one terminal thereof to the input line of the first analog signal and at the other terminal thereof to a third output node for outputting the third analog signal;

a fourth capacitor connected at one terminal thereof to the input line of the second analog signal and at the other terminal thereof to the third output node for outputting the third analog signal;

a first switch connected between said first output node and a fixed potential;

a second switch connected between said second output node and the fixed potential; and a third switch connected between said third output node and the fixed potential;

said first capacitor sampling an input signal thereto when said first switch is in a conducting state but outputting the sampled voltage from said first output node when said first switch is in a non-conducting state;

said second capacitor sampling an input signal thereto when said second switch is in a conducting state but outputting the sampled voltage from said second output node when said second switch is in a non-conducting state;

each of said first and fourth capacitors sampling an input signal thereto when said third switch is in a conducting state but outputting the sampled voltage from said third output node when said third switch is in a non-conducting state, whereupon the voltages from said third and fourth capacitors are synthesized and then outputted.

12. The analog to digital converter according to claim 1, wherein said comparison section includes:
a comparator adapted to compare an input voltage thereto and the reference voltages with each other;
a fifth capacitor connected at one terminal thereof to an input line of the first analog signal and at the other terminal thereof to input node of said comparator;
a sixth capacitor connected at one terminal thereof to an input line of the second analog signal and at the other terminal thereof to the input node of said comparator; and
a fourth switch connected between the input node of said comparator and a fixed voltage;
each of said fifth capacitor and said sixth capacitor sampling an input signal thereto when said fourth switch is in a conducting state but outputting, when said fourth switch is in a non-conducting state, the sampled voltage such that the voltages are synthesized and inputted to said comparator.

13. The analog to digital converter according to claim 1, wherein said changeover section includes:
a fifth switch connected between a first output node of said signal processing section and a first input node for inputting the first residual signal to said first outputting section;
a sixth switch connected between a second output node of said signal processing section and a second input node for inputting the second residual signal to said second outputting section;
a seventh switch connected between a third output node of said signal processing section and the first input node for inputting the first residual signal to said first outputting section; and an eighth switch connected between the third output node of said signal processing section and the second input node for inputting the second residual signal to said second outputting section; and
if the first comparison result is obtained by said comparison result, then said fifth switch and said eighth switch are kept in a conducting state while said sixth switch and said seventh switch are kept in a non-conducting state, but
if the second comparison result is obtained by said comparison result, then said eighth switch is kept in a non-conducting state while said sixth switch and said seventh switch are kept in a conducting state.

14. The analog to digital converter according to claim 13, wherein said first outputting section includes:
a ninth switch connected between the first input node and a fixed potential; and
a first amplifier for amplifying a first residual signal to be inputted to the first input node with a predetermined amplification factor; and
said second outputting section includes:
a tenth switch connected between the second input node and the fixed potential; and
a second amplifier for amplifying a second residual signal to be inputted to the second input node with the predetermined amplification factor.

15. A signal processing system, comprising:
an analog to digital converter adapted to convert an analog signal from an analog signal processing system,
said analog to digital converter including
an analog to digital conversion stage of at least one stage adapted to produce digital data of a value corresponding to a relationship to two analog signals inputted thereto and output two analog residual signals,
said analog to digital conversion stage including
a signal production section adapted to receive, as input signals thereto, a first analog signal of a voltage value corresponding to a difference between a voltage value between a first reference voltage, and a second reference voltage and the second reference voltage and a second analog signal of a voltage value corresponding to a difference between a voltage value of the first analog signal and a difference voltage between the first reference voltage and the second reference voltage, produce at least one third analog signal of an intermediate voltage value produced from the voltage value of the first analog signal and a voltage value of the second analog signal, and output the first analog signal, second analog signal and third analog signal,
a comparison section adapted to receive, as input signals thereto, the first analog signal and the second analog signal, compare the voltage value of the first analog signal and the voltage value of the second analog signal with each other, and output digital data of a value corresponding to a result of the comparison,
a first outputting section adapted to amplify a first residual signal with a predetermined amplification factor and output the amplified first residual signal,
a second outputting section adapted to amplify a second residual signal with the predetermined amplification factor and output the amplified second residual signal, and
a changeover section adapted to change over inputting of the first analog signal, second analog signal and third analog signal outputted from said signal production section to said first outputting section and said second outputting section in response to the result of the comparison by said comparison section, said comparison section outputting first digital data when a first comparison result that the voltage value of the first analog signal is lower than the voltage value of the second analog signal is obtained whereas said comparison section outputs second digital data when a second comparison result that the voltage value of the first analog signal is higher than the voltage value of the second analog signal is obtained, said changeover section carrying out the changeover such that, when the first comparison result is obtained by said comparison section, the first analog signal outputted from said signal production section is inputted as the first residual signal to said first outputting section and the third analog signal outputted from said signal production section is inputted as the second residual signal to said second outputting section, but when the second comparison result is obtained by said comparison section, the third analog signal outputted from said signal production section is inputted as the first residual signal to said first outputting section and the second analog signal outputted from said signal production section is inputted as the second residual signal to said second outputting section.

* * * * *